(12) United States Patent
Ramanasankaran et al.

(10) Patent No.: US 12,412,003 B2
(45) Date of Patent: Sep. 9, 2025

(54) BUILDING DATA PLATFORM WITH DIGITAL TWIN BASED PREDICTIVE RECOMMENDATION VISUALIZATION

(71) Applicant: Tyco Fire & Security GmbH, Neuhausen am Rheinfall (CH)

(72) Inventors: Rajiv Ramanasankaran, San Jose, CA (US); Chenlu Zhang, Milwaukee, WI (US); Ambuj Shatdal, Madison, WI (US); Young Lee, Milwaukee, WI (US); Jonathan D. Douglas, Mequon, WI (US)

(73) Assignee: TYCO FIRE & SECURITY GMBH, Neuhausen am Rheinfall (CH)

( * ) Notice: Subject to any disclaimer, the term of this patent is extended or adjusted under 35 U.S.C. 154(b) by 444 days.

(21) Appl. No.: 17/855,561

(22) Filed: Jun. 30, 2022

(65) Prior Publication Data

US 2023/0169223 A1    Jun. 1, 2023

Related U.S. Application Data

(63) Continuation-in-part of application No. 17/537,046, filed on Nov. 29, 2021, now Pat. No. 11,714,930.

(51) Int. Cl.
| | |
|---|---|
| *G06F 30/13* | (2020.01) |
| *G05B 15/02* | (2006.01) |
| *G06N 5/04* | (2023.01) |

(52) U.S. Cl.
CPC ............. *G06F 30/13* (2020.01); *G05B 15/02* (2013.01); *G06N 5/04* (2013.01)

(58) Field of Classification Search
CPC ......... G06F 30/13; G06F 30/27; G05B 15/02; G05B 17/02; G05B 2219/2642;
(Continued)

(56) References Cited

U.S. PATENT DOCUMENTS

| | | |
|---|---|---|
| 5,301,109 A | 4/1994 | Landauer et al. |
| 5,446,677 A | 8/1995 | Jensen et al. |

(Continued)

FOREIGN PATENT DOCUMENTS

| | | |
|---|---|---|
| AU | 2019226217 A1 | 11/2020 |
| AU | 2019226264 A1 | 11/2020 |

(Continued)

OTHER PUBLICATIONS

U.S. Appl. No. 17/566,029, Passivelogic, Inc.
(Continued)

*Primary Examiner* — Santosh R Poudel
(74) *Attorney, Agent, or Firm* — Foley & Lardner LLP

(57) ABSTRACT

A building system of a building operates to store a digital twin of the building in the one or more storage devices, wherein the digital twin further includes an artificial intelligence configured to generate a plurality of inference values of a data point for a plurality of future times, the data point related to the building by the interrelationship of the digital twin. The building system operates to generate a recommendation based on the plurality of inference values for the data point for the plurality of future times, the recommendation recommending making one or more updates to the building, and cause a graphic representation of the building to display an indication of the recommendation.

24 Claims, 43 Drawing Sheets

(58) Field of Classification Search
CPC ........ G06N 5/04; G06N 3/044; G06N 3/0464; G06N 3/08; G06N 5/022
See application file for complete search history.

(56) References Cited

U.S. PATENT DOCUMENTS

| | | | |
|---|---|---|---|
| 5,581,478 A | 12/1996 | Cruse et al. | |
| 5,812,962 A | 9/1998 | Kovac | |
| 5,960,381 A | 9/1999 | Singers et al. | |
| 5,973,662 A | 10/1999 | Singers et al. | |
| 6,014,612 A | 1/2000 | Larson et al. | |
| 6,031,547 A | 2/2000 | Kennedy | |
| 6,134,511 A | 10/2000 | Subbarao | |
| 6,157,943 A | 12/2000 | Meyer | |
| 6,285,966 B1 | 9/2001 | Brown et al. | |
| 6,363,422 B1 | 3/2002 | Hunter et al. | |
| 6,385,510 B1 | 5/2002 | Hoog et al. | |
| 6,389,331 B1 | 5/2002 | Jensen et al. | |
| 6,401,027 B1 | 6/2002 | Xu et al. | |
| 6,437,691 B1 | 8/2002 | Sandelman et al. | |
| 6,477,518 B1 | 11/2002 | Li et al. | |
| 6,487,457 B1 | 11/2002 | Hull et al. | |
| 6,493,755 B1 | 12/2002 | Hansen et al. | |
| 6,577,323 B1 | 6/2003 | Jamieson et al. | |
| 6,626,366 B2 | 9/2003 | Kayahara et al. | |
| 6,646,660 B1 | 11/2003 | Patty | |
| 6,704,016 B1 | 3/2004 | Oliver et al. | |
| 6,732,540 B2 | 5/2004 | Sugihara et al. | |
| 6,764,019 B1 | 7/2004 | Kayahara et al. | |
| 6,782,385 B2 | 8/2004 | Natsumeda et al. | |
| 6,813,532 B2 | 11/2004 | Eryurek et al. | |
| 6,816,811 B2 | 11/2004 | Seem | |
| 6,823,680 B2 | 11/2004 | Jayanth | |
| 6,826,454 B2 | 11/2004 | Sulfstede | |
| 6,865,511 B2 | 3/2005 | Frerichs et al. | |
| 6,925,338 B2 | 8/2005 | Eryurek et al. | |
| 6,986,138 B1 | 1/2006 | Sakaguchi et al. | |
| 7,031,880 B1 | 4/2006 | Seem et al. | |
| 7,401,057 B2 | 7/2008 | Eder | |
| 7,552,467 B2 | 6/2009 | Lindsay | |
| 7,627,544 B2 | 12/2009 | Chkodrov et al. | |
| 7,818,249 B2 | 10/2010 | Lovejoy et al. | |
| 7,889,051 B1 | 2/2011 | Billig et al. | |
| 7,996,488 B1 | 8/2011 | Casabella et al. | |
| 8,078,330 B2 | 12/2011 | Brickfield et al. | |
| 8,104,044 B1 | 1/2012 | Scofield et al. | |
| 8,229,470 B1 | 7/2012 | Ranjan et al. | |
| 8,401,991 B2 | 3/2013 | Wu et al. | |
| 8,495,745 B1 | 7/2013 | Schrecker et al. | |
| 8,516,016 B2 | 8/2013 | Park et al. | |
| 8,532,808 B2 | 9/2013 | Drees et al. | |
| 8,532,839 B2 | 9/2013 | Drees et al. | |
| 8,600,556 B2 | 12/2013 | Nesler et al. | |
| 8,635,182 B2 | 1/2014 | Mackay | |
| 8,682,921 B2 | 3/2014 | Park et al. | |
| 8,731,724 B2 | 5/2014 | Drees et al. | |
| 8,737,334 B2 | 5/2014 | Ahn et al. | |
| 8,738,334 B2 | 5/2014 | Jiang et al. | |
| 8,751,487 B2 | 6/2014 | Byrne et al. | |
| 8,788,097 B2 | 7/2014 | Drees et al. | |
| 8,805,995 B1 | 8/2014 | Oliver | |
| 8,843,238 B2 | 9/2014 | Wenzel et al. | |
| 8,874,071 B2 | 10/2014 | Sherman et al. | |
| 8,941,465 B2 | 1/2015 | Pineau et al. | |
| 8,990,127 B2 | 3/2015 | Taylor | |
| 9,070,113 B2 | 6/2015 | Shafiee et al. | |
| 9,116,978 B2 | 8/2015 | Park et al. | |
| 9,185,095 B1 | 11/2015 | Moritz et al. | |
| 9,189,527 B2 | 11/2015 | Park et al. | |
| 9,196,009 B2 | 11/2015 | Drees et al. | |
| 9,229,966 B2 | 1/2016 | Aymeloglu et al. | |
| 9,286,582 B2 | 3/2016 | Drees et al. | |
| 9,311,807 B2 | 4/2016 | Schultz et al. | |
| 9,344,751 B1 | 5/2016 | Ream et al. | |
| 9,354,968 B2 | 5/2016 | Wenzel et al. | |
| 9,507,686 B2 | 11/2016 | Horn et al. | |
| 9,524,594 B2 | 12/2016 | Ouyang et al. | |
| 9,558,196 B2 | 1/2017 | Johnston et al. | |
| 9,652,813 B2 | 5/2017 | Gifford et al. | |
| 9,753,455 B2 | 9/2017 | Drees | |
| 9,811,249 B2 | 11/2017 | Chen et al. | |
| 9,838,844 B2 | 12/2017 | Emeis et al. | |
| 9,886,478 B2 | 2/2018 | Mukherjee | |
| 9,948,359 B2 | 4/2018 | Horton | |
| 10,055,114 B2 | 8/2018 | Shah et al. | |
| 10,055,206 B2 | 8/2018 | Park et al. | |
| 10,116,461 B2 | 10/2018 | Fairweather et al. | |
| 10,169,454 B2 | 1/2019 | Ait-Mokhtar et al. | |
| 10,171,297 B2 | 1/2019 | Stewart et al. | |
| 10,171,586 B2 | 1/2019 | Shaashua et al. | |
| 10,187,258 B2 | 1/2019 | Nagesh et al. | |
| 10,514,963 B2 | 12/2019 | Shrivastava et al. | |
| 10,515,098 B2 | 12/2019 | Park et al. | |
| 10,534,326 B2 | 1/2020 | Sridharan et al. | |
| 10,536,295 B2 | 1/2020 | Fairweather et al. | |
| 10,564,993 B2 | 2/2020 | Deutsch et al. | |
| 10,705,492 B2 | 7/2020 | Harvey | |
| 10,708,078 B2 | 7/2020 | Harvey | |
| 10,760,815 B2 | 9/2020 | Janakiraman et al. | |
| 10,762,475 B2 | 9/2020 | Song et al. | |
| 10,824,120 B2 | 11/2020 | Ahmed | |
| 10,845,771 B2 | 11/2020 | Harvey | |
| 10,854,194 B2 | 12/2020 | Park et al. | |
| 10,862,928 B1 | 12/2020 | Badawy et al. | |
| 10,921,760 B2 | 2/2021 | Harvey | |
| 10,921,972 B2 | 2/2021 | Park et al. | |
| 10,969,133 B2 | 4/2021 | Harvey | |
| 10,986,121 B2 | 4/2021 | Stockdale et al. | |
| 11,016,998 B2 | 5/2021 | Park et al. | |
| 11,024,292 B2 | 6/2021 | Park et al. | |
| 11,038,709 B2 | 6/2021 | Park et al. | |
| 11,041,650 B2 | 6/2021 | Li et al. | |
| 11,054,796 B2 | 7/2021 | Holaso | |
| 11,070,390 B2 | 7/2021 | Park et al. | |
| 11,073,976 B2 | 7/2021 | Park et al. | |
| 11,108,587 B2 | 8/2021 | Park et al. | |
| 11,113,295 B2 | 9/2021 | Park et al. | |
| 11,216,663 B1 | 1/2022 | Ettinger et al. | |
| 11,229,138 B1 | 1/2022 | Harvey et al. | |
| 11,264,140 B1 | 3/2022 | Tal et al. | |
| 11,314,726 B2 | 4/2022 | Park et al. | |
| 11,314,788 B2 | 4/2022 | Park et al. | |
| 11,504,011 B1 * | 11/2022 | Jain | G06N 5/04 |
| 11,556,105 B2 | 1/2023 | Cooley et al. | |
| 11,561,522 B2 | 1/2023 | Cooley et al. | |
| 11,561,523 B2 | 1/2023 | Cooley et al. | |
| 11,573,551 B2 | 2/2023 | Cooley et al. | |
| 11,586,167 B2 | 2/2023 | Cooley et al. | |
| 11,704,011 B2 | 7/2023 | Jones et al. | |
| 11,853,938 B1 | 12/2023 | Muthusamy et al. | |
| 2002/0010562 A1 | 1/2002 | Schleiss et al. | |
| 2002/0016639 A1 | 2/2002 | Smith et al. | |
| 2002/0059229 A1 | 5/2002 | Natsumeda et al. | |
| 2002/0123864 A1 | 9/2002 | Eryurek et al. | |
| 2002/0147506 A1 | 10/2002 | Eryurek et al. | |
| 2002/0177909 A1 | 11/2002 | Fu et al. | |
| 2003/0005486 A1 | 1/2003 | Ridolfo et al. | |
| 2003/0014130 A1 | 1/2003 | Grumelart | |
| 2003/0073432 A1 | 4/2003 | Meade, II | |
| 2003/0158704 A1 | 8/2003 | Triginai et al. | |
| 2003/0171851 A1 | 9/2003 | Brickfield et al. | |
| 2003/0200059 A1 | 10/2003 | Ignatowski et al. | |
| 2004/0068390 A1 | 4/2004 | Saunders | |
| 2004/0128314 A1 | 7/2004 | Katibah et al. | |
| 2004/0133314 A1 | 7/2004 | Ehlers et al. | |
| 2004/0199360 A1 | 10/2004 | Friman et al. | |
| 2005/0055308 A1 | 3/2005 | Meyer et al. | |
| 2005/0108262 A1 | 5/2005 | Fawcett et al. | |
| 2005/0154494 A1 | 7/2005 | Ahmed | |
| 2005/0278703 A1 | 12/2005 | Lo et al. | |
| 2005/0283337 A1 | 12/2005 | Sayal | |
| 2006/0095521 A1 | 5/2006 | Patinkin | |
| 2006/0140207 A1 | 6/2006 | Eschbach et al. | |
| 2006/0184479 A1 | 8/2006 | Levine | |

(56) References Cited

U.S. PATENT DOCUMENTS

| | | |
|---|---|---|
| 2006/0200476 A1 | 9/2006 | Gottumukkala et al. |
| 2006/0265751 A1 | 11/2006 | Cosquer et al. |
| 2006/0271589 A1 | 11/2006 | Horowitz et al. |
| 2007/0028179 A1 | 2/2007 | Levin et al. |
| 2007/0203693 A1 | 8/2007 | Estes |
| 2007/0208549 A1 | 9/2007 | Blevins et al. |
| 2007/0219645 A1 | 9/2007 | Thomas et al. |
| 2007/0261062 A1 | 11/2007 | Bansal et al. |
| 2007/0273497 A1 | 11/2007 | Kuroda et al. |
| 2007/0273610 A1 | 11/2007 | Baillot |
| 2008/0034425 A1 | 2/2008 | Overcash et al. |
| 2008/0094230 A1 | 4/2008 | Mock et al. |
| 2008/0097816 A1 | 4/2008 | Freire et al. |
| 2008/0186160 A1 | 8/2008 | Kim et al. |
| 2008/0249756 A1 | 10/2008 | Chaisuparasmikul |
| 2008/0252723 A1 | 10/2008 | Park |
| 2008/0281472 A1 | 11/2008 | Podgorny et al. |
| 2009/0195349 A1 | 8/2009 | Frader-Thompson et al. |
| 2009/0315889 A1* | 12/2009 | Tognola ............ G06T 11/206 345/440 |
| 2010/0045439 A1 | 2/2010 | Tak et al. |
| 2010/0058248 A1 | 3/2010 | Park |
| 2010/0131533 A1 | 5/2010 | Ortiz |
| 2010/0274366 A1 | 10/2010 | Fata et al. |
| 2010/0281387 A1 | 11/2010 | Holland et al. |
| 2010/0286937 A1 | 11/2010 | Hedley et al. |
| 2010/0324962 A1 | 12/2010 | Nesler et al. |
| 2011/0015802 A1 | 1/2011 | Imes |
| 2011/0029341 A1 | 2/2011 | Muse et al. |
| 2011/0047418 A1 | 2/2011 | Drees et al. |
| 2011/0061015 A1 | 3/2011 | Drees et al. |
| 2011/0071685 A1 | 3/2011 | Huneycutt et al. |
| 2011/0077950 A1 | 3/2011 | Hughston |
| 2011/0087650 A1 | 4/2011 | Mackay et al. |
| 2011/0087988 A1 | 4/2011 | Ray et al. |
| 2011/0088000 A1 | 4/2011 | Mackay |
| 2011/0125737 A1 | 5/2011 | Pothering et al. |
| 2011/0137853 A1 | 6/2011 | Mackay |
| 2011/0153603 A1 | 6/2011 | Adiba et al. |
| 2011/0154363 A1 | 6/2011 | Karmarkar |
| 2011/0157357 A1 | 6/2011 | Weisensale et al. |
| 2011/0178977 A1 | 7/2011 | Drees |
| 2011/0191343 A1 | 8/2011 | Heaton et al. |
| 2011/0205022 A1 | 8/2011 | Cavallaro et al. |
| 2011/0218777 A1 | 9/2011 | Chen et al. |
| 2012/0011126 A1 | 1/2012 | Park et al. |
| 2012/0011141 A1 | 1/2012 | Park et al. |
| 2012/0022698 A1 | 1/2012 | Mackay |
| 2012/0062577 A1 | 3/2012 | Nixon |
| 2012/0064923 A1 | 3/2012 | Imes et al. |
| 2012/0083930 A1 | 4/2012 | Ilic et al. |
| 2012/0100825 A1 | 4/2012 | Sherman et al. |
| 2012/0101637 A1 | 4/2012 | Imes et al. |
| 2012/0135759 A1 | 5/2012 | Imes et al. |
| 2012/0136485 A1 | 5/2012 | Weber et al. |
| 2012/0158633 A1 | 6/2012 | Eder |
| 2012/0259583 A1 | 10/2012 | Noboa et al. |
| 2012/0272228 A1 | 10/2012 | Marndi et al. |
| 2012/0278051 A1 | 11/2012 | Jiang et al. |
| 2013/0007063 A1 | 1/2013 | Kalra et al. |
| 2013/0038430 A1 | 2/2013 | Blower et al. |
| 2013/0038707 A1 | 2/2013 | Cunningham et al. |
| 2013/0060820 A1 | 3/2013 | Bulusu et al. |
| 2013/0086497 A1 | 4/2013 | Ambuhl et al. |
| 2013/0096723 A1 | 4/2013 | Ludwig |
| 2013/0097706 A1 | 4/2013 | Titonis et al. |
| 2013/0103221 A1 | 4/2013 | Raman et al. |
| 2013/0167035 A1 | 6/2013 | Imes et al. |
| 2013/0170710 A1 | 7/2013 | Kuoch et al. |
| 2013/0204836 A1 | 8/2013 | Choi et al. |
| 2013/0246916 A1 | 9/2013 | Reimann et al. |
| 2013/0247205 A1 | 9/2013 | Schrecker et al. |
| 2013/0262035 A1 | 10/2013 | Mills |
| 2013/0275174 A1 | 10/2013 | Bennett et al. |
| 2013/0275908 A1 | 10/2013 | Reichard |
| 2013/0297050 A1 | 11/2013 | Reichard et al. |
| 2013/0298244 A1 | 11/2013 | Kumar et al. |
| 2013/0331995 A1 | 12/2013 | Rosen |
| 2013/0338970 A1 | 12/2013 | Reghetti |
| 2014/0032506 A1 | 1/2014 | Hoey et al. |
| 2014/0059483 A1 | 2/2014 | Mairs et al. |
| 2014/0081652 A1 | 3/2014 | Klindworth |
| 2014/0135952 A1 | 5/2014 | Maehara |
| 2014/0152651 A1 | 6/2014 | Chen et al. |
| 2014/0172184 A1 | 6/2014 | Schmidt et al. |
| 2014/0189861 A1 | 7/2014 | Gupta et al. |
| 2014/0207282 A1 | 7/2014 | Angle et al. |
| 2014/0258052 A1 | 9/2014 | Khuti et al. |
| 2014/0269614 A1 | 9/2014 | Maguire et al. |
| 2014/0277765 A1 | 9/2014 | Karimi et al. |
| 2014/0278461 A1 | 9/2014 | Artz |
| 2014/0327555 A1 | 11/2014 | Sager et al. |
| 2015/0019174 A1 | 1/2015 | Kiff et al. |
| 2015/0042240 A1 | 2/2015 | Aggarwal et al. |
| 2015/0105917 A1 | 4/2015 | Sasaki et al. |
| 2015/0145468 A1 | 5/2015 | Ma et al. |
| 2015/0156031 A1 | 6/2015 | Fadell et al. |
| 2015/0168931 A1 | 6/2015 | Jin |
| 2015/0172300 A1 | 6/2015 | Cochenour |
| 2015/0178421 A1 | 6/2015 | Borrelli et al. |
| 2015/0185261 A1 | 7/2015 | Frader-Thompson et al. |
| 2015/0186777 A1 | 7/2015 | Lecue et al. |
| 2015/0202962 A1 | 7/2015 | Habashima et al. |
| 2015/0204563 A1 | 7/2015 | Imes et al. |
| 2015/0235267 A1 | 8/2015 | Steube et al. |
| 2015/0241895 A1 | 8/2015 | Lu et al. |
| 2015/0244730 A1 | 8/2015 | Vu et al. |
| 2015/0244732 A1 | 8/2015 | Golshan et al. |
| 2015/0261863 A1 | 9/2015 | Dey et al. |
| 2015/0263900 A1 | 9/2015 | Polyakov et al. |
| 2015/0286969 A1 | 10/2015 | Warner et al. |
| 2015/0295796 A1 | 10/2015 | Hsiao et al. |
| 2015/0304193 A1 | 10/2015 | Ishii et al. |
| 2015/0316918 A1 | 11/2015 | Schleiss et al. |
| 2015/0324422 A1 | 11/2015 | Elder |
| 2015/0341212 A1 | 11/2015 | Hsiao et al. |
| 2015/0348417 A1 | 12/2015 | Ignaczak et al. |
| 2015/0379080 A1 | 12/2015 | Jochimski |
| 2016/0011753 A1 | 1/2016 | Mcfarland et al. |
| 2016/0033946 A1 | 2/2016 | Zhu et al. |
| 2016/0035246 A1 | 2/2016 | Curtis |
| 2016/0065601 A1 | 3/2016 | Gong et al. |
| 2016/0070736 A1 | 3/2016 | Swan et al. |
| 2016/0078229 A1 | 3/2016 | Gong et al. |
| 2016/0090839 A1 | 3/2016 | Stolarczyk |
| 2016/0119434 A1 | 4/2016 | Dong et al. |
| 2016/0127712 A1 | 5/2016 | Alfredsson et al. |
| 2016/0132595 A1 | 5/2016 | Bliss et al. |
| 2016/0139752 A1 | 5/2016 | Shim et al. |
| 2016/0163186 A1 | 6/2016 | Davidson et al. |
| 2016/0170390 A1 | 6/2016 | Xie et al. |
| 2016/0171862 A1 | 6/2016 | Das et al. |
| 2016/0173816 A1 | 6/2016 | Huenerfauth et al. |
| 2016/0179315 A1 | 6/2016 | Sarao et al. |
| 2016/0179342 A1 | 6/2016 | Sarao et al. |
| 2016/0179990 A1 | 6/2016 | Sarao et al. |
| 2016/0181967 A1 | 6/2016 | Nojima |
| 2016/0195856 A1 | 7/2016 | Spero |
| 2016/0212165 A1 | 7/2016 | Singla et al. |
| 2016/0239660 A1 | 8/2016 | Azvine et al. |
| 2016/0239756 A1 | 8/2016 | Aggour et al. |
| 2016/0247129 A1 | 8/2016 | Song et al. |
| 2016/0253679 A1 | 9/2016 | Venkatraman et al. |
| 2016/0260063 A1 | 9/2016 | Harris et al. |
| 2016/0292625 A1* | 10/2016 | Curtland ............ G06F 3/04847 |
| 2016/0313751 A1 | 10/2016 | Risbeck et al. |
| 2016/0313752 A1 | 10/2016 | Przybylski |
| 2016/0313902 A1 | 10/2016 | Hill et al. |
| 2016/0350364 A1 | 12/2016 | Anicic et al. |
| 2016/0357521 A1 | 12/2016 | Zhang et al. |
| 2016/0357828 A1 | 12/2016 | Tobin et al. |
| 2016/0358432 A1 | 12/2016 | Branscomb et al. |
| 2016/0363336 A1 | 12/2016 | Roth et al. |
| 2016/0370258 A1 | 12/2016 | Perez |

(56) References Cited

U.S. PATENT DOCUMENTS

| | | |
|---|---|---|
| 2016/0377309 A1 | 12/2016 | Abiprojo et al. |
| 2016/0378306 A1 | 12/2016 | Kresl et al. |
| 2016/0379326 A1 | 12/2016 | Chan-Gove et al. |
| 2017/0006135 A1 | 1/2017 | Siebel |
| 2017/0011318 A1 | 1/2017 | Vigano et al. |
| 2017/0017221 A1 | 1/2017 | Lamparter et al. |
| 2017/0039255 A1 | 2/2017 | Raj et al. |
| 2017/0052536 A1 | 2/2017 | Warner et al. |
| 2017/0053441 A1 | 2/2017 | Nadumane et al. |
| 2017/0063894 A1 | 3/2017 | Muddu et al. |
| 2017/0068409 A1 | 3/2017 | Nair |
| 2017/0070775 A1 | 3/2017 | Taxier et al. |
| 2017/0075984 A1 | 3/2017 | Deshpande et al. |
| 2017/0084168 A1 | 3/2017 | Janchookiat |
| 2017/0090437 A1 | 3/2017 | Veeramani et al. |
| 2017/0093700 A1 | 3/2017 | Gilley et al. |
| 2017/0098086 A1 | 4/2017 | Hoernecke et al. |
| 2017/0103327 A1 | 4/2017 | Penilla et al. |
| 2017/0103403 A1 | 4/2017 | Chu et al. |
| 2017/0123389 A1 | 5/2017 | Baez et al. |
| 2017/0134415 A1 | 5/2017 | Muddu et al. |
| 2017/0177715 A1 | 6/2017 | Chang et al. |
| 2017/0180147 A1 | 6/2017 | Brandman et al. |
| 2017/0188216 A1 | 6/2017 | Koskas et al. |
| 2017/0212482 A1 | 7/2017 | Boettcher et al. |
| 2017/0212668 A1 | 7/2017 | Shah et al. |
| 2017/0220641 A1 | 8/2017 | Chi et al. |
| 2017/0230930 A1 | 8/2017 | Frey |
| 2017/0235817 A1 | 8/2017 | Deodhar et al. |
| 2017/0251182 A1 | 8/2017 | Siminoff et al. |
| 2017/0270124 A1 | 9/2017 | Nagano et al. |
| 2017/0277769 A1 | 9/2017 | Pasupathy et al. |
| 2017/0278003 A1 | 9/2017 | Liu |
| 2017/0294132 A1 | 10/2017 | Colmenares |
| 2017/0314803 A1 | 11/2017 | Jacobson et al. |
| 2017/0315522 A1 | 11/2017 | Kwon et al. |
| 2017/0315697 A1 | 11/2017 | Jacobson et al. |
| 2017/0322534 A1 | 11/2017 | Sinha et al. |
| 2017/0323389 A1 | 11/2017 | Vavrasek |
| 2017/0329289 A1 | 11/2017 | Kohn et al. |
| 2017/0336770 A1 | 11/2017 | Macmillan |
| 2017/0345287 A1 | 11/2017 | Fuller et al. |
| 2017/0351957 A1 | 12/2017 | Lecue et al. |
| 2017/0357225 A1 | 12/2017 | Asp et al. |
| 2017/0357490 A1 | 12/2017 | Park et al. |
| 2017/0357908 A1 | 12/2017 | Cabadi et al. |
| 2018/0012159 A1 | 1/2018 | Kozloski et al. |
| 2018/0013579 A1 | 1/2018 | Fairweather et al. |
| 2018/0017407 A1 | 1/2018 | Dousse |
| 2018/0024520 A1 | 1/2018 | Sinha et al. |
| 2018/0039238 A1 | 2/2018 | Gaertner et al. |
| 2018/0048485 A1 | 2/2018 | Pelton et al. |
| 2018/0068034 A1 | 3/2018 | Zeifman et al. |
| 2018/0069932 A1 | 3/2018 | Tiwari et al. |
| 2018/0114140 A1 | 4/2018 | Chen et al. |
| 2018/0137288 A1 | 5/2018 | Polyakov |
| 2018/0157930 A1 | 6/2018 | Rutschman et al. |
| 2018/0162400 A1 | 6/2018 | Abdar |
| 2018/0176241 A1 | 6/2018 | Manadhata et al. |
| 2018/0198627 A1 | 7/2018 | Mullins |
| 2018/0203961 A1 | 7/2018 | Aisu et al. |
| 2018/0239982 A1 | 8/2018 | Rutschman et al. |
| 2018/0275625 A1 | 9/2018 | Park et al. |
| 2018/0276962 A1 | 9/2018 | Butler et al. |
| 2018/0277246 A1 | 9/2018 | Zhong et al. |
| 2018/0292797 A1 | 10/2018 | Lamparter et al. |
| 2018/0336785 A1 | 11/2018 | Ghannam et al. |
| 2018/0340701 A1 | 11/2018 | Baughman et al. |
| 2018/0349797 A1 | 12/2018 | Garvey et al. |
| 2018/0356775 A1 | 12/2018 | Harvey |
| 2018/0359111 A1 | 12/2018 | Harvey |
| 2018/0364654 A1 | 12/2018 | Locke et al. |
| 2019/0005025 A1 | 1/2019 | Malabarba |
| 2019/0013023 A1 | 1/2019 | Pourmohammad et al. |
| 2019/0025771 A1 | 1/2019 | Park et al. |
| 2019/0037135 A1 | 1/2019 | Hedge |
| 2019/0042988 A1 | 2/2019 | Brown et al. |
| 2019/0088106 A1 | 3/2019 | Grundstrom |
| 2019/0094824 A1 | 3/2019 | Xie et al. |
| 2019/0095644 A1 | 3/2019 | Park et al. |
| 2019/0096217 A1 | 3/2019 | Pourmohammad et al. |
| 2019/0102840 A1 | 4/2019 | Perl et al. |
| 2019/0121801 A1 | 4/2019 | Jethwa et al. |
| 2019/0138512 A1 | 5/2019 | Pourmohammad et al. |
| 2019/0147883 A1 | 5/2019 | Mellenthin et al. |
| 2019/0158309 A1 | 5/2019 | Park et al. |
| 2019/0163152 A1 | 5/2019 | Worrall et al. |
| 2019/0268178 A1 | 8/2019 | Fairweather et al. |
| 2019/0278777 A1 | 9/2019 | Malik et al. |
| 2019/0310979 A1 | 10/2019 | Masuzaki et al. |
| 2019/0353376 A1 | 11/2019 | Rigg et al. |
| 2019/0377306 A1 | 12/2019 | Harvey |
| 2020/0034622 A1 | 1/2020 | Thakurta et al. |
| 2020/0051440 A1 | 2/2020 | Yousif et al. |
| 2020/0133978 A1 | 4/2020 | Ramamurti et al. |
| 2020/0142365 A1* | 5/2020 | Sharma ................ G06N 7/01 |
| 2020/0143313 A1 | 5/2020 | Ohlsson et al. |
| 2020/0210923 A1* | 7/2020 | Palmer ................ G06Q 10/04 |
| 2020/0226156 A1 | 7/2020 | Borra et al. |
| 2020/0234220 A1* | 7/2020 | Ma ...................... G08G 1/148 |
| 2020/0285203 A1 | 9/2020 | Thakur et al. |
| 2020/0336328 A1 | 10/2020 | Harvey |
| 2020/0348632 A1 | 11/2020 | Harvey |
| 2020/0387576 A1 | 12/2020 | Brett et al. |
| 2020/0396208 A1 | 12/2020 | Brett et al. |
| 2021/0042299 A1 | 2/2021 | Migliori |
| 2021/0043221 A1 | 2/2021 | Yelchuru et al. |
| 2021/0080915 A1 | 3/2021 | Yan et al. |
| 2021/0133670 A1 | 5/2021 | Cella et al. |
| 2021/0173969 A1* | 6/2021 | Abbey ................ G06F 30/13 |
| 2021/0200171 A1 | 7/2021 | Sridharan et al. |
| 2021/0200174 A1 | 7/2021 | Sridharan et al. |
| 2021/0200713 A1 | 7/2021 | Sridharan et al. |
| 2021/0248289 A1 | 8/2021 | Fasano |
| 2021/0248514 A1* | 8/2021 | Cella ................... G06V 20/20 |
| 2021/0272394 A1 | 9/2021 | Cella |
| 2021/0279957 A1 | 9/2021 | Eder et al. |
| 2021/0287521 A1 | 9/2021 | Stone et al. |
| 2021/0325070 A1 | 10/2021 | Endel et al. |
| 2021/0342961 A1 | 11/2021 | Winter et al. |
| 2021/0350877 A1* | 11/2021 | Spurbeck .............. G16H 10/40 |
| 2021/0356153 A1* | 11/2021 | Nesler ................... F24F 11/46 |
| 2021/0366062 A1 | 11/2021 | Trundle |
| 2021/0366608 A1 | 11/2021 | Podobas et al. |
| 2021/0373509 A1 | 12/2021 | Borah et al. |
| 2021/0373510 A1 | 12/2021 | Borah et al. |
| 2021/0381711 A1 | 12/2021 | Harvey et al. |
| 2021/0381712 A1 | 12/2021 | Harvey et al. |
| 2021/0382445 A1 | 12/2021 | Harvey et al. |
| 2021/0383041 A1 | 12/2021 | Harvey et al. |
| 2021/0383042 A1 | 12/2021 | Harvey et al. |
| 2021/0383200 A1 | 12/2021 | Harvey et al. |
| 2021/0383219 A1 | 12/2021 | Harvey et al. |
| 2021/0383235 A1 | 12/2021 | Harvey et al. |
| 2021/0383236 A1 | 12/2021 | Harvey et al. |
| 2021/0390498 A1 | 12/2021 | Ohlsson et al. |
| 2021/0390807 A1* | 12/2021 | Chaurasia ............... G07C 9/27 |
| 2022/0004672 A1 | 1/2022 | Santarone et al. |
| 2022/0028159 A1 | 1/2022 | Vincent et al. |
| 2022/0066402 A1 | 3/2022 | Harvey et al. |
| 2022/0066405 A1 | 3/2022 | Harvey |
| 2022/0066415 A1 | 3/2022 | Miller et al. |
| 2022/0066432 A1 | 3/2022 | Harvey et al. |
| 2022/0066434 A1 | 3/2022 | Harvey et al. |
| 2022/0066528 A1 | 3/2022 | Harvey et al. |
| 2022/0066722 A1 | 3/2022 | Harvey et al. |
| 2022/0066754 A1 | 3/2022 | Harvey et al. |
| 2022/0066761 A1 | 3/2022 | Harvey et al. |
| 2022/0067226 A1 | 3/2022 | Harvey et al. |
| 2022/0067227 A1 | 3/2022 | Harvey et al. |
| 2022/0067230 A1 | 3/2022 | Harvey et al. |
| 2022/0069863 A1 | 3/2022 | Harvey et al. |
| 2022/0070293 A1 | 3/2022 | Harvey et al. |
| 2022/0082280 A1 | 3/2022 | Douglas et al. |

(56) References Cited

U.S. PATENT DOCUMENTS

| | | | |
|---|---|---|---|
| 2022/0090927 A1* | 3/2022 | Shear | G01C 21/3492 |
| 2022/0092418 A1 | 3/2022 | Liu et al. | |
| 2022/0121965 A1 | 4/2022 | Chatterji et al. | |
| 2022/0138684 A1 | 5/2022 | Harvey | |
| 2022/0147000 A1 | 5/2022 | Cooley et al. | |
| 2022/0150124 A1 | 5/2022 | Cooley et al. | |
| 2022/0187818 A1 | 6/2022 | Kondejkar et al. | |
| 2022/0215264 A1 | 7/2022 | Harvey et al. | |
| 2022/0277851 A1 | 9/2022 | Wellig | |
| 2023/0010757 A1 | 1/2023 | Preciado | |
| 2023/0071312 A1 | 3/2023 | Preciado et al. | |
| 2023/0076011 A1 | 3/2023 | Preciado et al. | |
| 2023/0083703 A1 | 3/2023 | Meiners | |
| 2023/0099791 A1 | 3/2023 | Ghosh et al. | |
| 2023/0101023 A1 | 3/2023 | Jin et al. | |
| 2023/0113095 A1 | 4/2023 | Dixit et al. | |

FOREIGN PATENT DOCUMENTS

| | | |
|---|---|---|
| CN | 101415011 A | 4/2009 |
| CN | 102136099 A | 7/2011 |
| CN | 102136100 A | 7/2011 |
| CN | 102650876 A | 8/2012 |
| CN | 104040583 A | 9/2014 |
| CN | 104603832 A | 5/2015 |
| CN | 104919484 A | 9/2015 |
| CN | 106204392 A | 12/2016 |
| CN | 106406806 A | 2/2017 |
| CN | 106960269 A | 7/2017 |
| CN | 107147639 A1 | 9/2017 |
| CN | 107598928 A | 1/2018 |
| CN | 110046316 A | 7/2019 |
| CN | 111860900 A | 10/2020 |
| EP | 2 528 033 A1 | 11/2012 |
| EP | 3 268 821 B1 | 1/2018 |
| EP | 3 324 306 A1 | 5/2018 |
| EP | 4 226 263 A1 | 8/2023 |
| JP | H10-049552 A | 2/1998 |
| JP | 2003-162573 A | 6/2003 |
| JP | 2007-018322 A | 1/2007 |
| JP | 4073946 B1 | 4/2008 |
| JP | 2008-107930 A | 5/2008 |
| JP | 2012-108571 A | 6/2012 |
| JP | 2013-152618 A | 8/2013 |
| JP | 2014-044457 A | 3/2014 |
| KR | 2016/0102923 A | 8/2016 |
| KR | 20210063688 A | 6/2021 |
| WO | WO-2009/020158 A1 | 2/2009 |
| WO | WO-2011/100255 A2 | 8/2011 |
| WO | WO-2013/050333 A1 | 4/2013 |
| WO | WO-2015/106702 A1 | 7/2015 |
| WO | WO-2015/145648 A1 | 10/2015 |
| WO | WO-2017/035536 A1 | 3/2017 |
| WO | WO-2017/192422 A1 | 11/2017 |
| WO | WO-2017/194244 A1 | 11/2017 |
| WO | WO-2017/205330 A1 | 11/2017 |
| WO | WO-2017/213918 A1 | 12/2017 |
| WO | WO-2018/132112 A1 | 7/2018 |
| WO | WO-2020/061621 A1 | 4/2020 |
| WO | WO-2022/042925 A1 | 3/2022 |
| WO | WO-2022/103812 A1 | 5/2022 |
| WO | WO-2022/103813 A1 | 5/2022 |
| WO | WO-2022/103820 A1 | 5/2022 |
| WO | WO-2022/103822 A1 | 5/2022 |
| WO | WO-2022/103824 A1 | 5/2022 |
| WO | WO-2022/103829 A1 | 5/2022 |
| WO | WO-2022/103831 A1 | 5/2022 |

OTHER PUBLICATIONS

U.S. Appl. No. 17/567,275, Passivelogic, Inc.
U.S. Appl. No. 17/722,115, Passivelogic, Inc.
Sinha, Sudhi and Al Huraimel, Khaled, "Reimagining Businesses with AI" John Wiley & Sons, Inc., Hoboken, NJ, USA, First ed. published 2020 (156 pages).
Balaji et al, "Brick: Metadata schema for portable smart building applications," Applied Energy, 2018 (20 pages).
Balaji et al, "Brick: Metadata schema for portable smart building applications," Applied Energy, Sep. 15, 2018, 3 pages, (Abstract).
Balaji et al, "Demo Abstract: Portable Queries Using the Brick Schema for Building Applications," BuildSys '16, Palo Alto, CA, USA, Nov. 16-17, 2016 (2 pages).
Balaji, B. et al., "Brick: Towards a Unified Metadata Schema For Buildings." BuildSys '16, Palo Alto, CA, USA, Nov. 16-17, 2016 (10 pages).
Bhattacharya et al., "Short Paper: Analyzing Metadata Schemas for Buildings—The Good, The Bad and The Ugly," BuildSys '15, Seoul, South Korea, Nov. 4-5, 2015 (4 pages).
Bhattacharya, A., "Enabling Scalable Smart-Building Analytics," Electrical Engineering and Computer Sciences, University of California at Berkeley, Technical Report No. UCB/EECS-2016-201, Dec. 15, 2016 (121 pages).
Brick, "Brick Schema: Building Blocks for Smart Buildings," URL: chrome-extension://efaidnbmnnnibpcajpcglclefindmkaj/https://www.memoori.com/wp-content/uploads/2016/06/Brick_Schema_Whitepaper.pdf, Mar. 2019 (17 pages).
Brick, "Brick: Towards a Unified Metadata Schema For Buildings," URL: chrome-extension://efaidnbmnnnibpcajpcglclefindmkaj/https://brickschema.org/papers/Brick_BuildSys_Presentation.pdf, Presented at BuildSys '16, Nov. 2016 (46 pages).
Brick, "Metadata Schema for Buildings," URL: https://brickschema.org/docs/Brick-Leaflet.pdf, retrieved from internet Dec. 24, 2019 (3 pages).
Chinese Office Action on CN Appl. No. 201780003995.9 dated Apr. 8, 2021 (21 pages with English language translation).
Chinese Office action on CN Appl. No. 201780043400.2 dated Apr. 25, 2021 (15 pages with English language translation).
Curry, E. et al., "Linking building data in the cloud: Integrating cross-domain building data using linked data." Advanced Engineering Informatics, 2013, 27 (pp. 206-219).
Digital Platform Litigation Documents Part 1, includes cover letter, dismissal of case DDE-1-21-cv-01796, IPR2023-00022 (documents filed Jan. 26, 2023-Oct. 7, 2022), and IPR2023-00085 (documents filed Jan. 26, 2023-Oct. 20, 2022) (748 pages total).
Digital Platform Litigation Documents Part 10, includes DDE-1-21-cv-01796 (documents filed Nov. 1, 2022-Dec. 22, 2021 (1795 pages total).
Digital Platform Litigation Documents Part 2, includes IPR2023-00085 (documents filed Oct. 20, 2022) (172 pages total).
Digital Platform Litigation Documents Part 3, includes IPR2023-00085 (documents filed Oct. 20, 2022) and IPR2023-00170 (documents filed Nov. 28, 2022-Nov. 7, 2022) (397 pages total).
Digital Platform Litigation Documents Part 4, includes IPR2023-00170 (documents filed Nov. 7, 2022) and IPR2023-00217 (documents filed Jan. 18, 2023-Nov. 15, 2022) (434 pages total).
Digital Platform Litigation Documents Part 5, includes IPR2023-00217 (documents filed Nov. 15, 2022) and IPR2023-00257 (documents filed Jan. 25, 2023-Nov. 23, 2022) (316 pages total).
Digital Platform Litigation Documents Part 6, includes IPR2023-00257 (documents filed Nov. 23, 2022) and IPR 2023-00346 (documents filed Jan. 3, 2023-Dec. 13, 2022) (295 pages total).
Digital Platform Litigation Documents Part 7, includes IPR 2023-00346 (documents filed Dec. 13, 2022) and IPR2023-00347 (documents filed Jan. 3, 2023-Dec. 13, 2022) (217 pages total).
Digital Platform Litigation Documents Part 8, includes IPR2023-00347 (documents filed Dec. 13, 2022), EDTX-2-22-cv-00243 (documents filed Sep. 20, 2022-Jun. 29, 2022), and DDE-1-21-cv-01796 (documents filed Feb. 3, 2023-Jan. 10, 2023 (480 pages total).
Digital Platform Litigation Documents Part 9, includes DDE-1-21-cv-01796 (documents filed Jan. 10, 2023-Nov. 1, 2022 (203 pages total).
El Kaed, C. et al., "Building management insights driven by a multi-system semantic representation approach," 2016 IEEE 3rd World Forum on Internet of Things (WF-IoT), Dec. 12-14, 2016, (pp. 520-525).

(56) References Cited

OTHER PUBLICATIONS

Ellis, C. et al., "Creating a room connectivity graph of a building from per-room sensor units." BuildSys '12, Toronto, ON, Canada, Nov. 6, 2012 (7 pages).
Extended European Search Report on EP Application No. 18196948.6 dated Apr. 10, 2019 (9 pages).
Fierro et al., "Beyond a House of Sticks: Formalizing Metadata Tags with Brick," BuildSys '19, New York, NY, USA, Nov. 13-14, 2019 (10 pages).
Fierro et al., "Dataset: An Open Dataset and Collection Tool for BMS Point Labels," Data'19, New York, NY, USA, Nov. 10, 2019 (3 pages).
Fierro et al., "Design and Analysis of a Query Processor for Brick," ACM Transactions on Sensor Networks, Jan. 2018, vol. 1, No. 1, art. 1 (25 pages).
Fierro et al., "Design and Analysis of a Query Processor for Brick," BuildSys '17, Delft, Netherlands, Nov. 8-9, 2017 (10 pages).
Fierro et al., "Mortar: An Open Testbed for Portable Building Analytics," BuildSys '18, Shenzhen, China, Nov. 7-8, 2018 (10 pages).
Fierro et al., "Why Brick is a Game Changer for Smart Buildings," URL: https://brickschema.org/papers/Brick_Memoori_Webinar_Presentation.pdf, Memoori Webinar, 2019 (67 pages).
Fierro, "Writing Portable Building Analytics with the Brick Metadata Schema," UC Berkeley, ACM E-Energy, 2019 (39 pages).
Fierro, G., "Design of an Effective Ontology and Query Processor Enabling Portable Building Applications," Electrical Engineering and Computer Sciences, University of California at Berkeley, Technical Report No. UCB/EECS-2019-106, Jue 27, 2019 (118 pages).
File History for U.S. Appl. No. 12/776,159, filed May 7, 2010 (722 pages).
Final Conference Program, ACM BuildSys 2016, Stanford, CA, USA, Nov. 15-17, 2016 (7 pages).
Gao et al., "A large-scale evaluation of automated metadata inference approaches on sensors from air handling units," Advanced Engineering Informatics, 2018, 37 (pp. 14-30).
Harvey, T., "Quantum Part 3: The Tools of Autonomy, How PassiveLogic's Quantum Creator and Autonomy Studio software works," URL: https://www.automatedbuildings.com/news/jan22/articles/passive/211224010000passive.html, Jan. 2022 (7 pages).
Harvey, T., "Quantum: The Digital Twin Standard for Buildings," URL: https://www.automatedbuildings.com/news/feb21/articles/passivelogic/210127124501passivelogic.html, Feb. 2021 (6 pages).
Hu, S. et al., "Building performance optimisation: A hybrid architecture for the integration of contextual information and time-series data," Automation in Construction, 2016, 70 (pp. 51-61).
International Search Report and Written Opinion for PCT Appl. Ser. No. PCT/US2017/013831 dated Mar. 31, 2017 (14 pages).
International Search Report and Written Opinion for PCT Appl. Ser. No. PCT/US2017/035524 dated Jul. 24, 2017 (14 pages).
International Search Report and Written Opinion on PCT/US2017/052060, mailed Oct. 5, 2017, 11 pages.
International Search Report and Written Opinion on PCT/US2017/052633, mailed Oct. 23, 2017, 9 pages.
International Search Report and Written Opinion on PCT/US2017/052829, mailed Nov. 27, 2017, 24 pages.
International Search Report and Written Opinion on PCT/US2018/024068, mailed Jun. 15, 2018, 22 pages.
International Search Report and Written Opinion on PCT/US2018/052971, dated Mar. 1, 2019, 19 pages.
International Search Report and Written Opinion on PCT/US2018/052974, mailed Dec. 19, 2018, 13 pages.
International Search Report and Written Opinion on PCT/US2018/052975, mailed Jan. 2, 2019, 13 pages.
International Search Report and Written Opinion on PCT/US2018/052994, mailed Jan. 7, 2019, 15 pages.
International Search Report and Written Opinion on PCT/US2019/015481, dated May 17, 2019, 78 pages.
International Search Report and Written Opinion on PCT/US2020/058381, dated Jan. 27, 2021, 30 pages.
Japanese Office Action on JP Appl. No. 2018-534963 dated May 11, 2021 (16 pages with English language translation).
Koh et al., "Plaster: An Integration, Benchmark, and Development Framework for Metadata Normalization Methods," BuildSys '18, Shenzhen, China, Nov. 7-8, 2018 (10 pages).
Koh et al., "Scrabble: Transferrable Semi-Automated Semantic Metadata Normalization using Intermediate Representation," BuildSys '18, Shenzhen, China, Nov. 7-8, 2018 (10 pages).
Koh et al., "Who can Access What, and When?" BuildSys '19, New York, NY, USA, Nov. 13-14, 2019 (4 pages).
Li et al., "Event Stream Processing with Out-of-Order Data Arrival," International Conferences on Distributed Computing Systems, 2007, (8 pages).
Nissin Electric Co., Ltd., "Smart power supply system (SPSS)," Outline of the scale verification plan, Nissin Electric Technical Report, Japan, Apr. 23, 2014, vol. 59, No. 1 (23 pages).
Passivelogic, "Explorer: Digital Twin Standard for Autonomous Systems. Made interactive." URL: https://passivelogic.com/software/quantum-explorer/, retrieved from internet Jan. 4, 2023 (13 pages).
Passivelogic, "Quantum: The Digital Twin Standard for Autonomous Systems, A physics-based ontology for next-generation control and AI." URL: https://passivelogic.com/software/quantum-standard/, retrieved from internet Jan. 4, 2023 (20 pages).
Quantum Alliance, "Quantum Explorer Walkthrough," 2022, (7 pages) (screenshots from video).
Results of the Partial International Search for PCT/US2018/052971, dated Jan. 3, 2019, 3 pages.
Sinha, Sudhi and Al Huraimel, Khaled, "Reimagining Businesses with AI" John Wiley & Sons, Inc., Hoboken, NJ, USA, 2021 (156 pages).
Sinha, Sudhi R. and Park, Youngchoon, "Building an Effective IoT Ecosystem for Your Business," Johnson Controls International, Springer International Publishing, 2017 (286 pages).
Sinha, Sudhi, "Making Big Data Work For Your Business: A guide to effective Big Data analytics," Impackt Publishing Ltd., Birmingham, UK, Oct. 2014 (170 pages).
The Virtual Nuclear Tourist, "Calvert Cliffs Nuclear Power Plant," URL: http://www.nucleartourist.com/us/calvert.htm, Jan. 11, 2006 (2 pages).
University of California at Berkeley, EECS Department, "Enabling Scalable Smart-Building Analytics," URL: https://www2.eecs.berkeley.edu/Pubs/TechRpts/2016/EECS-2016-201.html, retrieved from internet Feb. 15, 2022 (7 pages).
Van Hoof, Bert, "Announcing Azure Digital Twins: Create digital replicas of spaces and infrastructure using cloud, AI and IoT," URL: https://azure.microsoft.com/en-us/blog/announcing-azure-digital-twins-create-digital-replicas-of-spaces-and-infrastructure-using-cloud-ai-and-iot/, Sep. 24, 2018 (11 pages).
W3C, "SPARQL: Query Language for RDF," located on The Wayback Machine, URL: https://web.archive.org/web/20161230061728/http://www.w3.org/TR/rdf-sparql-query/), retrieved from internet Nov. 15, 2022 (89 pages).
Wei et al., "Development and Implementation of Software Gateways of Fire Fighting Subsystem Running on EBI," Control, Automation and Systems Engineering, IITA International Conference on, IEEE, Jul. 2009 (pp. 9-12).
White et al., "Reduce building maintenance costs with AWS IoT TwinMaker Knowledge Graph," The Internet of Things on AWS—Official Blog, URL: https://aws.amazon.com/blogs/iot/reduce-building-maintenance-costs-with-aws-iot-twinmaker-knowledge-graph/, Nov. 18, 2022 (10 pages).
Zhou, Q. et al., "Knowledge-infused and Consistent Complex Event Processing over Real-time and Persistent Streams," Further Generation Computer Systems, 2017, 76 (pp. 391-406).

* cited by examiner

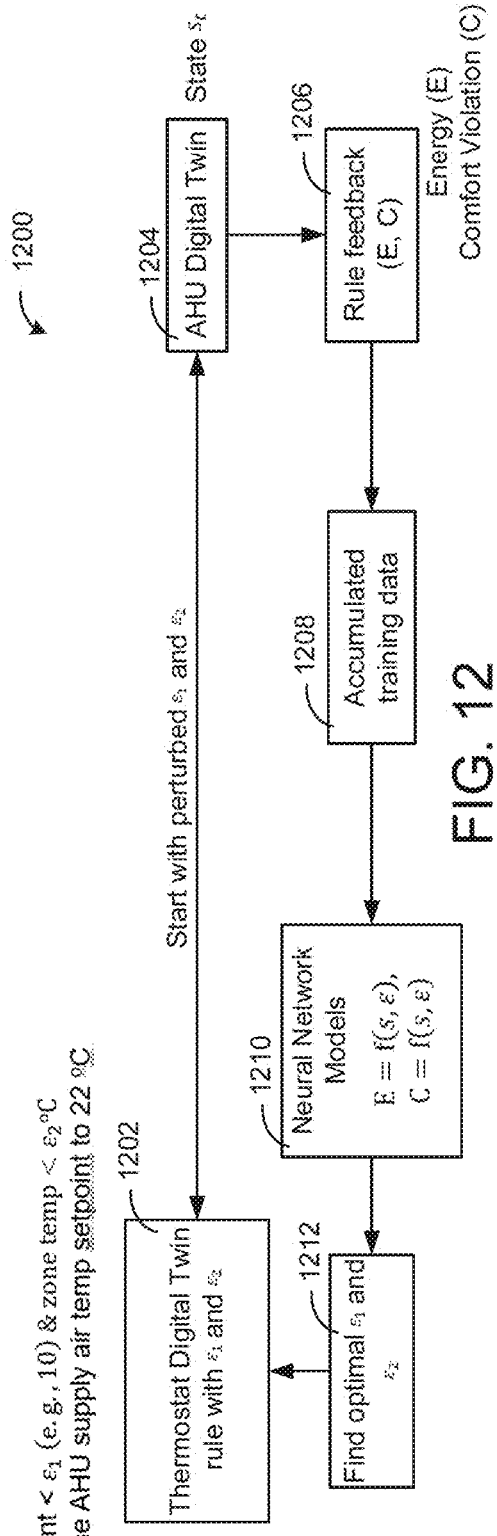
FIG. 12
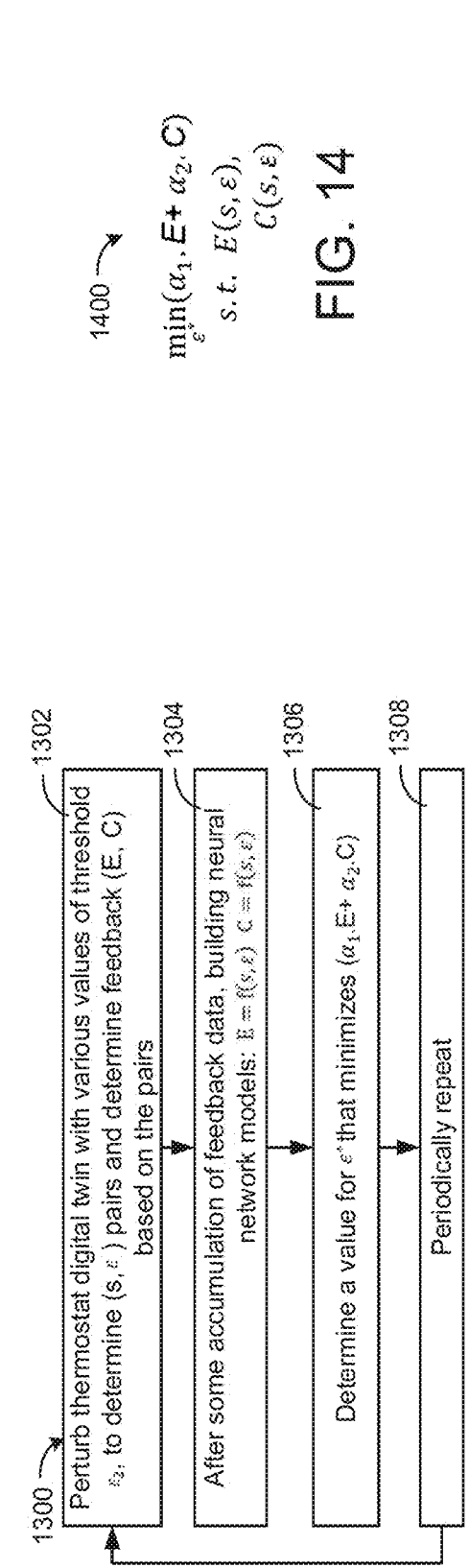
FIG. 13
$$\min_{\epsilon^*}(\alpha_1 \cdot E + \alpha_2 \cdot C)$$
$$s.t.\ E(s, \epsilon),$$
$$C(s, \epsilon)$$
FIG. 14

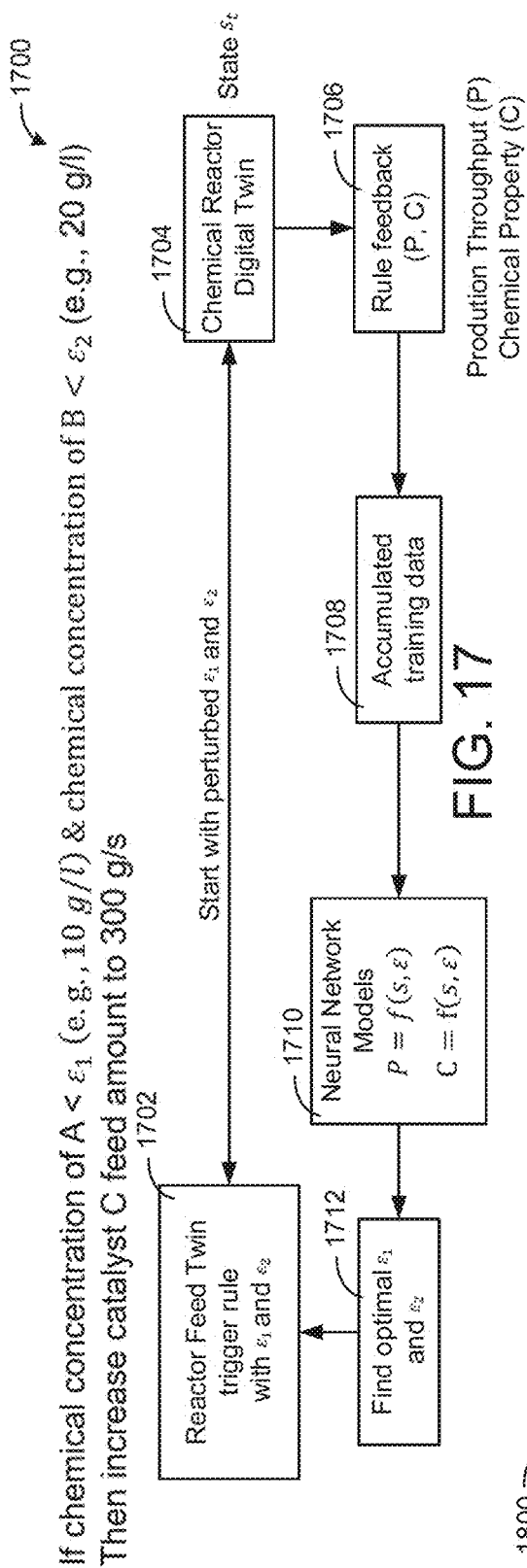
FIG. 17
FIG. 18
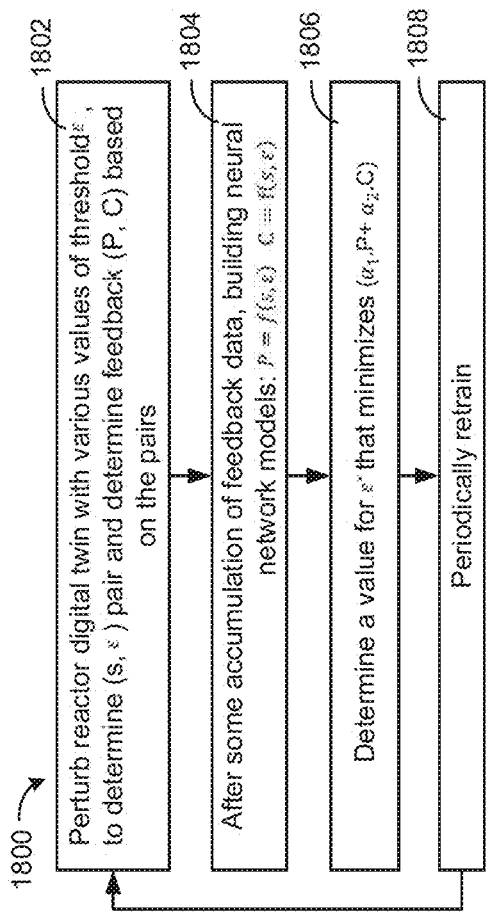
FIG. 19

| Display Name | Variable Name In Twin | Color Coding Rule |
|---|---|---|
| Clean Air Score | clean_air_score | Poor(Red):0-60; Average(Blue):60-80; Good(Green):80-100 |
| Reproductive Number | reproductive_number | Poor(Red):>2; Average(Blue):1-2; Good(Green):<1 |

| Display Name | Variable Name In Twin | Arrow Rule |
|---|---|---|
| Clean Air Delivery Rate | clean_air_delivery_rate | Rate Value = Speed; Arrow Color = Particular Color |

| Display Name | Variable Name In Twin | Alarm Trigger |
|---|---|---|
| Clean Air Score | clean_air_score | Clean Air Score < 30 |
| Reproductive Number | reproductive_number | Reproductive Number > 3 |

| | Occupant Number |
|---|---|
| AHU1 | 100 |
| AHU2 | 50 |
| AHU3 | 60 |
| AHU4 | 80 |

FIG. 41

BUILDING DATA PLATFORM WITH DIGITAL TWIN BASED PREDICTIVE RECOMMENDATION VISUALIZATION

CROSS-REFERENCE TO RELATED APPLICATION

This application is a continuation-in-part of U.S. patent application Ser. No. 17/537,046 filed Nov. 29, 2021, the entirety of which is incorporated by reference herein.

BACKGROUND

This application relates generally to a building system of a building. This application relates more particularly to a system for managing and processing data of the building system.

A building may aggregate and store building data received from building equipment and/or other data sources. The building data can be stored in a database. The building can include a building system that operates analytic and/or control algorithms against the data of the database to control the building equipment. However, the development and/or deployment of the analytic and/or control algorithms may be time consuming and require a significant amount of software development. Furthermore, the analytic and/or control algorithms may lack flexibility to adapt to changing circumstances in the building. In some cases, the output data of the analytic and/or control algorithms may be hard for a user to conceptualize and relate to the physical components of the building for which the information is generated for.

SUMMARY

Predictive Visualization

One implementation of the present disclosure is a building system of a building. The building system includes one or more storage devices storing instructions thereon that, when executed by one or more processors, cause the one or more processors to store a digital twin of the building in the one or more storage devices, the digital twin comprising a virtual representation of the building with an entity of the building, a data point, and an interrelationship between the entity of the building and the data point, wherein the digital twin further includes an artificial intelligence configured to generate a plurality of inference values of the data point for a plurality of future times, the data point related to the building by the interrelationship of the digital twin, generate a recommendation based on the plurality of inference values for the data point for the plurality of future times, the recommendation recommending making one or more updates to the building, and cause a graphic representation of the building to display an indication of the recommendation at a location within the graphic representation of the building associated with the entity based on the digital twin indicating the data point being related to the entity.

In some implementations, the instructions cause the one or more processors to receive a plurality of data point values for the data point from building equipment, the building equipment generates the data point values based on operation to control an environmental condition of the building, identify the data point based on the digital twin by identifying the interrelationship between the entity and the data point, the entity representing the building equipment, and store the plurality of data points, or a link to the plurality of data points, in the data point of the digital twin.

In some implementations, the plurality of inference values include predicted future values of the data point. In some implementations, the instructions cause the one or more processors to generate the inference values by identifying the data point of the digital twin and retrieving the plurality of data values based on the data point of the digital twin and executing the artificial intelligence to generate the plurality of inference values based on the plurality of data values. In some implementations, the plurality of inference values are predicted future values of a virtual indicator, wherein the virtual indicator is at least one of a clean air virtual indicator indicating a level of air quality of a building space, an occupancy number indicating a number of occupants in the building space, or a reproduction number indicating a spread of an infectious disease in a population.

In some implementations, the digital twin includes a building graph data structure including a plurality of nodes representing a plurality of entities of the building and a plurality of edges between the plurality of nodes representing a plurality of relationships between the plurality of entities of the building. In some implementations, the instructions cause the one or more processors to cause the graphic representation of the building to display the indication of the recommendation through the plurality of future times. In some implementations, the recommendation includes a recommendation to update operating settings of building equipment of the building, the operating settings updating operation of the building equipment. In some implementations, the instructions cause the one or more processors to cause the graphic representation of the building to display updated operation of the building equipment through the plurality of future times.

In some implementations, the recommendation to update operating settings of the building equipment includes at least one of a recommendation to make a command for an air handling unit to change an air flow through the building, a recommendation to command the air handling unit to change an air filtration setting for the building, a recommendation to command one or more disinfectant lights to activate, or a recommendation to command building security mechanisms to restrict access to one or more portions of the building. In some implementations, the recommendation includes a status of the actuation on the physical asset. In some implementations, the inference value includes at least one of a disease reproduction number indicating a rate at which an infectious disease spreads in a population, an energy consumption value indicating a level of energy consumed by building equipment of the building, or a clean air score indicating a quality of air in the building. In some implementations, the instructions further cause the one or more processors to generate diagnostics for at least one of a reproduction number, an energy consumption value, and a clean air score, wherein the diagnostic includes text indicating a cause of values of the reproduction number, an energy consumption value, or a clean air score.

Another implementation of the present disclosure is a method. The method includes storing a digital twin of the building in the one or more storage devices, the digital twin comprising a virtual representation of the building with an entity of the building, a data point, and an interrelationship between the entity of the building and the data point, wherein the digital twin further includes an artificial intelligence configured to generate a plurality of inference values of the data point for a plurality of future times, the data point related to the building by the interrelationship of the digital twin, generating a recommendation based on the plurality of inference values for the data point for the plurality of future times, the recommendation recommending making one or more updates to the building, and causing a graphic representation of the building to display an indication of the recommendation at a location within the graphic representation of the building associated with the entity based on the digital twin indicating the data point being related to the entity.

In some implementations, the method further includes receiving a plurality of data point values for the data point from building equipment, the building equipment generates the data point values based on operation to control an environmental condition of the building, identifying the data point based on the digital twin by identifying the interrelationship between the entity and the data point, the entity representing the building equipment, and storing the plurality of data points, or a link to the plurality of data points, in the data point of the digital twin. In some implementations, the plurality of inference values include predicted future values of the data point. In some implementations, the method generates the plurality of inference values by identifying the data point of the digital twin and retrieving the data values based on the data point of the digital twin and executing the artificial intelligence to generate the plurality of inference values based on the data values.

In some implementations, the plurality of inference values are predicted future values of a virtual indicator, wherein the virtual indicator is at least one of a clean air virtual indicator indicating a level of air quality of a building space, an occupancy number indicating a number of occupants in the building space, or a reproduction number indicating a spread of an infectious disease in a population. In some implementations, the method further includes generating diagnostics for at least one of a reproduction number, an energy consumption value, and a clean air score, wherein the diagnostic includes text indicating a cause of values of the reproduction number, an energy consumption value, or a clean air score. In some implementations, the recommendation includes a recommendation to update operating settings of building equipment of the building, the operating settings updating operation of the building equipment. In some implementations, the recommendation to update operating settings of the building equipment includes at least one of a recommendation to make a command for an air handling unit to change an air flow through the building, a recommendation to command the air handling unit to change an air filtration setting for the building, a recommendation to command one or more disinfectant lights to activate, or a recommendation to command building security mechanisms to restrict access to one or more portions of the building.

Another implementation of the present disclosure is a non-transitory computer readable media containing program instructions that, when executed by one or more processors, cause the one or more processors to perform operations. The operations include storing a digital twin of the building in the one or more storage devices, the digital twin comprising a virtual representation of the building with an entity of the building, a data point, and an interrelationship between the entity of the building and the data point, wherein the digital twin further includes an artificial intelligence configured to generate a plurality of inference values of the data point for a plurality of future times, the data point related to the building by the interrelationship of the digital twin, generating a recommendation based on the plurality of inference values for the data point for the plurality of future times, the recommendation recommending making one or more updates to the building, and causing a graphic representation of the building to display an indication of the recommendation at a location within the graphic representation of the building associated with the entity based on the digital twin indicating the data point being related to the entity.

Infectious Disease Management

Another implementation of the present disclosure is a building system of a building. The building system includes one or more storage devices storing instructions thereon that, when executed by one or more processors, cause the one or more processors to store a digital twin of the building in the one or more storage devices, the digital twin comprising a virtual representation of the building with an entity of the building, a data point, and an interrelationship between the entity of the building and the data point, wherein an infectious disease indicator of an infectious disease is related to the entity of the building by the digital twin, receive building data for the entity and generate the infectious disease indicator based on the building data, generate a recommendation for reducing a spread of the infectious disease within the building based on the infectious disease indicator, and cause a graphic representation of the building to display an indication of the recommendation at a location within the graphic representation of the building associated with the entity based on the digital twin indicating the infectious disease indicator being related to the entity.

In some implementations, the recommendation includes at least one of updating operation of an air handling unit to change an air flow through the building, updating operation of the air handling unit to change an air filtration setting for the building, operating one or more disinfectant lights to go from an off position to an on position, and operating one or more building security mechanisms to restrict access to one or more portions of the building. In some implementations, the recommendation includes occupant behavior policies for the building, wherein the occupant behavior policies includes at least one or a remote work policy, a mask wearing policy, an occupant social distancing policy, and an occupant limit for one or more spaces. In some embodiments, the infectious disease indicator is a disease reproductive number. In some embodiments, the entities of the building includes at least one of a building space, a floor of the building, a piece of building equipment, and the building occupant.

In some implementations, the recommendation to update operating settings of the building equipment includes at least one of a recommendation to make a command for an air handling unit to change an air flow through the building, a recommendation to command the air handling unit to change an air filtration setting for the building, a recommendation to command one or more disinfectant lights to activate, or a recommendation to command building security mechanisms to restrict access to one or more portions of the building. In some implementations, the recommendation includes recommendations to implement or change a remote work policy, a mask wearing policy, an occupant social distancing policy, or an occupant limit for one or more spaces.

In some implementations, the infectious disease indicator is a disease reproductive number indicating a spread of an infectious disease in a population. In some implementations, the infection disease indicator is generated for at least one of a building space, a floor of the building, a piece of building equipment, and the building occupant. In some implementations, the instructions cause the one or more processors to receive a plurality of data point values for the data point from building equipment, the building equipment generates the data point values based on operation to control an environmental condition of the building, identifies the data point based on the digital twin by identifying the interrelationship between the entity and the data point, the entity representing the building equipment, and stores the plurality of data points, or a link to the plurality of data points, in the data point of the digital twin.

In some implementations, the plurality of inference values include predicted future values of the data point. In some implementations, the instructions cause the one or more processors to generate the plurality of inference values by identifying the data point of the digital twin and retrieving the plurality of data values based on the data point of the digital twin executing the artificial intelligence to generate the plurality of inference values based on the plurality of data values. In some implementations, the digital twin includes a building graph data structure including a plurality of nodes representing the plurality of entities of the building and a plurality of edges between the plurality of nodes representing the interrelationship between the plurality of entities of the building. In some implementations, the instructions cause the one or more processors to perform a comparison of the infectious disease indicator to a threshold and determine an appearance of the infectious disease indicator based on the comparison. In some implementations, the instructions further cause the one or more processors to generate diagnostics for at least one of a reproduction number, an energy consumption value, and a clean air score, wherein the diagnostic provides a reasoning for why the reproduction number, an energy consumption value, and a clean air score are what they are.

Another implementation of the present disclosure is a method. The method includes storing a digital twin of the building in the one or more storage devices, the digital twin comprising a virtual representation of the building with an entity of the building, a data point, and an interrelationship between the entity of the building and the data point, wherein an infectious disease indicator of an infectious disease is related to the entity of the building by the digital twin, receiving building data for the entity and generate the infectious disease indicator based on the building data, generating a recommendation for reducing a spread of the infectious disease within the building based on the infectious disease indicator, and causing a graphic representation of the building to display an indication of the recommendation at a location within the graphic representation of the building associated with the entity based on the digital twin indicating the infectious disease indicator being related to the entity.

In some implementations, the recommendation to update operating settings of the building equipment includes at least one of a recommendation to make a command for an air handling unit to change an air flow through the building, a recommendation to command the air handling unit to change an air filtration setting for the building, a recommendation to command one or more disinfectant lights to activate, or a recommendation to command building security mechanisms to restrict access to one or more portions of the building. In some implementations, the recommendation includes recommendations to implement or change a remote work policy, a mask wearing policy, an occupant social distancing policy, or an occupant limit for one or more spaces. In some implementations, the infectious disease indicator is a disease reproductive number indicating a spread of an infectious disease in a population. In some implementations, the infection disease indicator is generated for at least one of a building space, a floor of the building, a piece of building equipment, and the building occupant. In some implementations, the method further includes receiving a plurality of data point values for the data point from building equipment, the building equipment generates the data point values based on operation to control an environmental condition of the building, identifying the data point based on the digital twin by identifying the interrelationship between the entity and the data point, the entity representing the building equipment, and storing the plurality of data points, or a link to the plurality of data points, in the data point of the digital twin.

In some implementations, the method includes generating the plurality of inference values by identifying the data point of the digital twin, retrieving the plurality of data values based on the data point of the digital twin, and executing the artificial intelligence to generate the plurality of inference values based on the plurality of data values. In some implementations, the method includes performing a comparison of the infectious disease indicator to a threshold, and determining an appearance of the infectious disease indicator based on the comparison. In some implementations, the digital twin includes a building graph data structure including a plurality of nodes representing the plurality of entities of the building and a plurality of edges between the plurality of nodes representing the interrelationship between the plurality of entities of the building.

Another implementation of the present disclosure is a non-transitory computer readable media containing program instructions that, when executed by one or more processors, cause the one or more processors to perform operations. The operations include storing a digital twin of the building in the one or more storage devices, the digital twin comprising a virtual representation of the building with an entity of the building, a data point, and an interrelationship between the entity of the building and the data point, wherein an infectious disease indicator of an infectious disease is related to the entity of the building by the digital twin, receiving building data for the entity and generate the infectious disease indicator based on the building data, generating a recommendation for reducing a spread of the infectious disease within the building based on the infectious disease indicator, and causing a graphic representation of the building to display an indication of the recommendation at a location within the graphic representation of the building associated with the entity based on the digital twin indicating the infectious disease indicator being related to the entity.

Contact Tracing

Another implementation of the present disclosure is a building system of a building. The building system includes one or more storage devices storing instructions thereon that, when executed by one or more processors, cause the one or more processors to: store a digital twin of the building in the one or more storage devices, the digital twin comprising a virtual representation of the building with a plurality of entities of the building and interrelationships between the plurality of entities of the building, wherein the digital twin further includes an artificial intelligence configured to simulate an airflow through the building and predict whether one or more occupants are potentially infected with an infectious disease, receive building data for the building from one or more pieces of equipment of the building, receive an indication of a location of an occupant and one or more indications of locations of one or more other occupants of the building, receive an indication that the occupant is infected with an infectious disease, and execute the artificial intelligence causing the artificial intelligence to simulate the air flow through the building based on the virtual representation of the building with the entities of the building and the interrelationships and the building data and predict whether the one or more other occupants of the building are potentially infected with the infectious disease based on the airflow, the location of the occupant, and the locations of the one or more other occupants.

In some implementations, the instructions further cause the one or more processors to animate a graphic representation of the building to display the simulated airflow through the building. In some implementations, the instructions further cause the one or more processors to generate a user notification and push the user notification to a user device based on the prediction that the one or more other occupants of the building are potentially infected with the infectious disease. In some implementations, the instructions further cause the one or more processors to perform a comparison of the simulated airflow to a level, determine a characteristic of the airflow based on the comparison of the simulated airflow to the level, and display a representation of the characteristic of the airflow in the graphic representation. In some implementations, the characteristic of the airflow is a speed of the airflow. In some implementations, the representation of the characteristic is a color of one or more arrows representing a speed and direction of the simulated airflow. In some implementations, the digital twin includes a building graph data structure including a plurality of nodes representing the plurality of entities of the building and a plurality of edges between the nodes representing the interrelationship between the plurality of entities of the building.

In some implementations, an infectious disease indicator of an infectious disease is related to an entity of the plurality of entities of the building by the digital twin. In some implementations, the instructions further cause the one or more processors to receive building data for the entity and generate the infectious disease indicator based on the building data, generate a recommendation for reducing a spread of the infectious disease within the building based on the infectious disease indicator, and cause a graphic representation of the building to display an indication of the recommendation at a location within the graphic representation of the building associated with the entity based on the digital twin indicating the infectious disease indicator being related to the entity. In some implementations, the recommendation to update operating settings of the building equipment includes at least one of a recommendation to make a command for an air handling unit to change an air flow through the building, a recommendation to command the air handling unit to change an air filtration setting for the building, a recommendation to command one or more disinfectant lights to activate, or a recommendation to command building security mechanisms to restrict access to one or more portions of the building. In some implementations, the recommendation includes recommendations to implement or change a remote work policy, a mask wearing policy, an occupant social distancing policy, or an occupant limit for one or more spaces. In some implementations, the infection disease indicator is generated for at least one of a building space, a floor of the building, a piece of building equipment, and the building occupant.

Another implementation of the present disclosure is a method. The method includes storing a digital twin of the building in the one or more storage devices, the digital twin comprising a virtual representation of the building with a plurality of entities of the building and interrelationships between the plurality of entities of the building, wherein the digital twin further includes an artificial intelligence configured to simulate an airflow through the building and predict whether one or more occupants are potentially infected with an infectious disease, receiving building data for the building from one or more pieces of equipment of the building, receiving an indication of a location of an occupant and one or more indications of locations of one or more other occupants of the building, receiving an indication that the occupant is infected with an infectious disease, and executing the artificial intelligence causing the artificial intelligence to simulate the air flow through the building based on the virtual representation of the building with the entities of the building and the interrelationships and the building data and predict whether the one or more other occupants of the building are potentially infected with the infectious disease based on the airflow, the location of the occupant, and the locations of the one or more other occupants.

In some implementations, the method further includes comprising animating a graphic representation of the building to display the simulated airflow through the building. In some implementations, the method includes generating a user notification and push the user notification to a user device based on the prediction that the one or more other occupants of the building are potentially infected with the infectious disease. In some implementations, the method includes performing a comparison of the simulated airflow to a level, determining a characteristic of the airflow based on the comparison of the simulated airflow to the level, and displaying a representation of the characteristic of the airflow in the graphic representation. In some implementations, the digital twin includes a building graph data structure including a plurality of nodes representing the plurality of entities of the building and a plurality of edges between the plurality of nodes representing the interrelationship between the plurality of entities of the building. In some implementations, an infectious disease indicator of an infectious disease is related to an entity of the plurality of entities of the building by the digital twin. In some implementations, the method includes receiving building data for the entity and generate the infectious disease indicator based on the building data, generating a recommendation for reducing a spread of the infectious disease within the building based on the infectious disease indicator, and causing a graphic representation of the building to display an indication of the recommendation at a location within the graphic representation of the building associated with the entity based on the digital twin indicating the infectious disease indicator being related to the entity.

In some implementations, the recommendation to update operating settings of the building equipment includes at least one of a recommendation to make a command for an air handling unit to change an air flow through the building, a recommendation to command the air handling unit to change an air filtration setting for the building, a recommendation to command one or more disinfectant lights to activate, or a recommendation to command building security mechanisms to restrict access to one or more portions of the building. In some implementations, the recommendation includes recommendations to implement or change a remote work policy, a mask wearing policy, an occupant social distancing policy, or an occupant limit for one or more spaces. In some implementations, the infection disease indicator is generated for at least one of a building space, a floor of the building, a piece of building equipment, and the building occupant.

Another implementation of the present disclosure is a non-transitory computer readable media containing program instructions that, when executed by one or more processors, cause the one or more processors to perform operations. The operations include storing a digital twin of the building in the one or more storage devices, the digital twin comprising a virtual representation of the building with a plurality of entities of the building and interrelationships between the plurality of entities of the building, wherein the digital twin further includes an artificial intelligence configured to simulate an airflow through the building and predict whether one or more occupants are potentially infected with an infectious disease, receiving building data for the building from one or more pieces of equipment of the building, receiving an indication of a location of an occupant and one or more indications of locations of one or more other occupants of the building, receiving an indication that the occupant is infected with an infectious disease, and executing the artificial intelligence causing the artificial intelligence to simulate the air flow through the building based on the virtual representation of the building with the entities of the building and the interrelationships and the building data and predict whether the one or more other occupants of the building are potentially infected with the infectious disease based on the airflow, the location of the occupant, and the locations of the one or more other occupants.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

FIG. 12 is a block diagram of a trigger rule of a thermostat digital twin where parameters of the trigger rule is trained, according to an exemplary embodiment.

FIG. 13 is a flow diagram of a process for identifying values for the parameters of the trigger rule of FIG. 12, according to an exemplary embodiment.

FIG. 14 is a minimization that can be performed to identify the values for the parameters of the trigger rule of FIGS. 12-13, according to an exemplary embodiment.

FIG. 17 is a block diagram of a trigger rule of a chemical reactor digital twin where parameters of the trigger rule are trained, according to an exemplary embodiment.

FIG. 18 is a flow diagram of a process for identifying values for the parameters of the trigger rule of FIG. 17, according to an exemplary embodiment.

FIG. 19 is a minimization that can be performed to identify the values for the parameters of the trigger rule of FIGS. 17-18, according to an exemplary embodiment.

FIG. 41 is a table indicating information that could be displayed within a graphical building, according to an exemplary embodiment.

DETAILED DESCRIPTION

Overview

Figure 1:
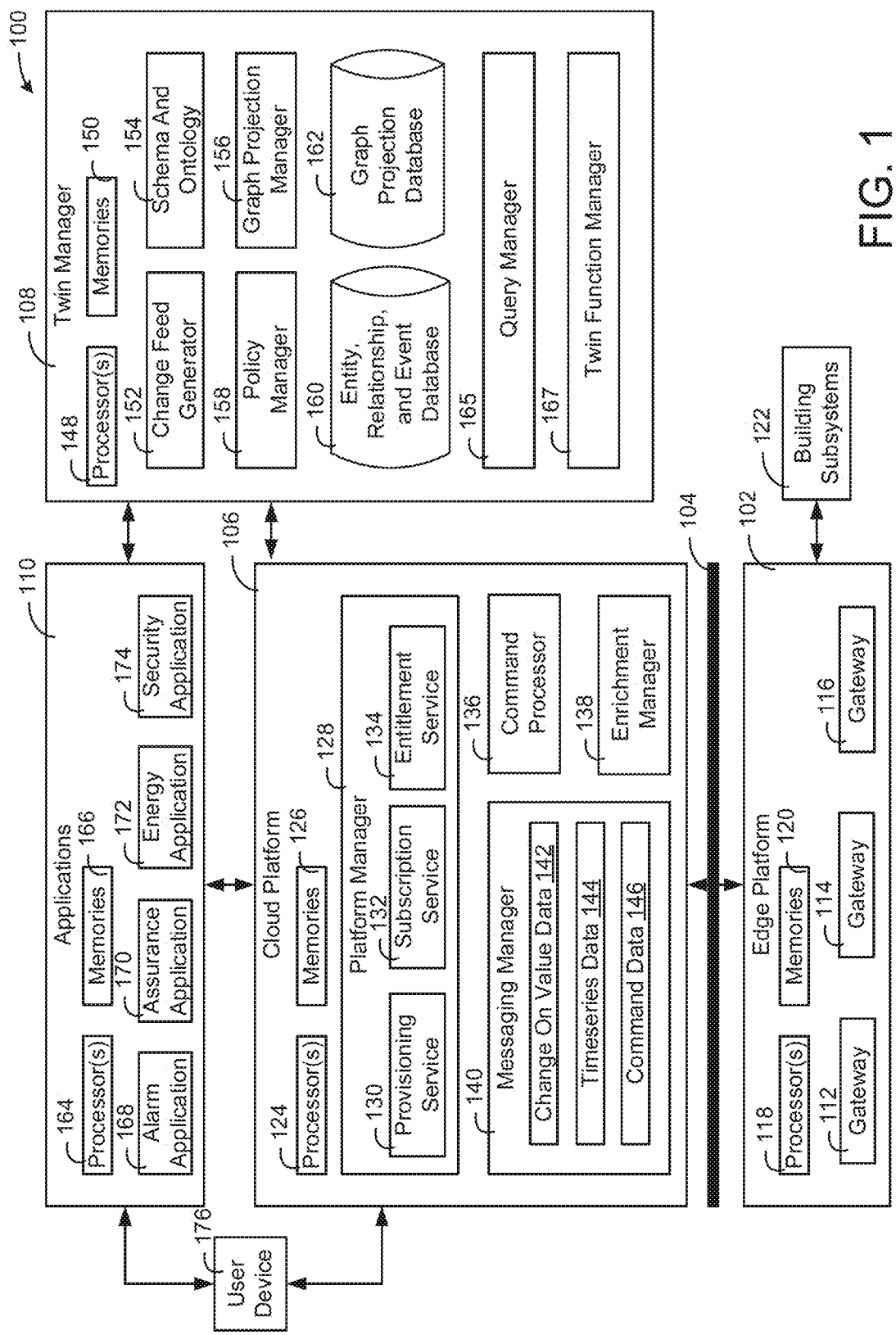
FIG. 1 is a block diagram of a building data platform including an edge platform, a cloud platform, and a twin manager, according to an exemplary embodiment.

Referring generally to the FIGURES, systems and methods for digital twins of a building that integrate inferences and predictions with graphical building models are shown, according to various exemplary embodiments. In some embodiments, the graphical building models may be two-dimensional or three-dimensional graphical representation of the building. A digital twin can be a virtual representation of a building and/or an entity of the building (e.g., space, piece of equipment, occupant, etc.). Furthermore, the digital twin can represent a service performed in a building, e.g., facility management, clean air optimization, energy prediction, equipment maintenance, etc.

A digital twin can be a virtual representation of a building and/or an entity of the building (e.g., space, piece of equipment, occupant, etc.). A virtual representation of a building could be a graph data structure. The virtual representation could be a graphic model, e.g., a building information model (BIM). The virtual representation of the building could be a hierarchical model, in some embodiments. Furthermore, the digital twin can represent a service performed in a building, e.g., facility management, equipment maintenance, etc. The digital twin can be displayed via virtual reality (VR) or augmented reality (AR) systems, in some embodiments.

In some embodiments, the digital twin can include an information data store and a connector. The information data store can store the information describing the entity that the digital twin operates for (e.g., attributes of the entity, measurements associated with the entity, control points or commands of the entity, etc.). In some embodiments, the data store can be a graph including various nodes and edges. The connector can be a software component that provides telemetry from the entity (e.g., physical device) to the information store. Furthermore, the digital twin can include artificial intelligence (AI), e.g., an AI agent. The AI can be one or more machine learning algorithms and/or models that operate based on information of the information data store and outputs information. The AI agent can run against a common data model, e.g., BRICK, and can be easily implemented in various different buildings, e.g., against various different building models. Running against BRICK can allow for the AI agent to be plug-and-play and reduce AI design and/or deployment time. In some embodiments, the digital twin including the artificial intelligence may store the machine learning algorithms and/or models within the stored data structures (e.g., graph 526). In some embodiments, the digital twin including the artificial intelligence may store a link to the machine learning algorithms and/or models within the data storage/graph where the machine learning algorithms and/or model is stored and executed remotely to where the twin data is stored in the digital twin. In some embodiments, the digital twin including the artificial intelligence may store an identifier of the machine learning algorithms and/or model algorithm to be executed.

In some embodiments, the AI agent for the digital twin can call an AI service to determine inferences and/or predict future data values. In some embodiments, the predictions are potential future states. In some embodiments, the predictions predict a timeseries of a data point into the future. The predictions could be predicted indoor temperature for an hour, inferred future air quality from 15 minute air quality readings, etc. In some embodiments, the digital twin can store predicted and/or inferred information in a graph data store as a node in the graph data store related to an entity that the digital twin represents or otherwise operates for. In some embodiments, the digital twin, or other digital twins, can operate against the predicted and/or inferred data, e.g., operate to construct and implement control algorithms for operating equipment of a building based on predicted future data points of the building.

Furthermore, the AI agent can include various triggers and/or actions, conditions that define when and how command and control occurs for an entity. The triggers and actions can be rule based conditional and operational statements that are associated with a specific digital twin, e.g., are stored and executed by an AI agent of the digital twin. In some embodiments, the building system can identify actions and/or triggers (or parameters for the actions and/or triggers) through machine learning algorithms. In some embodiments, the building system can evaluate the conditions/context of the graph and determine and/or modify the triggers and actions of a digital twin.

In some embodiments, the building system can implement and manage a three-dimensional (or two-dimensional) building model. The building system can cause the model to render in a user interface of a user device and allow a user to view the model, view information associated with the components of the model, and/or navigate throughout the model. The model can include information for various physical components, e.g., data for VAVs, data for thermostats, data for sensors, data for spaces, etc. In some embodiments, the information for the various physical components is generated based on a digital twin for those physical components, e.g., inferences or predictions generated for the physical components by one or more AI agents. The inferred and/or predicted information of the digital twin can be presented to the user in the three-dimensional and/or two-dimensional building model.

Furthermore, in some embodiments, a user can provide commands and/or inputs into the digital twin via the building model. Various buttons and/or other input elements can be provided within the building model that a user can interact with via their user device. The inputs can be ingested into a graph of the digital twin and various agents of the digital twin can operate based on the ingested input. For example, a command or analysis request for data could be made via the building model. The command or analysis request could cause an agent to run to operate the building equipment based on the command and/or derive data for presentation in the building model. In some embodiments, the building model could be presented within a virtual reality (VR) view of the building configured to be presented on a virtual reality headset or other computing device. In some embodiments, the building model could be presented within an augmented reality (AR) view of the building configured to be presented on an augmented reality headset or other computing device configured to overlay the information on a live or real-world view of the building or a portion thereof. Furthermore, in some embodiments, the building model could be presented within a VR representation provided within a virtual metaverse.

Referring now to FIG. 1, a building data platform 100 including an edge platform 102, a cloud platform 106, and a twin manager 108 are shown, according to an exemplary embodiment. The edge platform 102, the cloud platform 106, and the twin manager 108 can each be separate services deployed on the same or different computing systems. In some embodiments, the cloud platform 106 and the twin manager 108 are implemented in off premises computing systems, e.g., outside a building. The edge platform 102 can be implemented on-premises, e.g., within the building. However, any combination of on-premises and off-premises components of the building data platform 100 can be implemented.

The building data platform 100 includes applications 110. The applications 110 can be various applications that operate to manage the building subsystems 122. The applications 110 can be remote or on-premises applications (or a hybrid of both) that run on various computing systems. The applications 110 can include an alarm application 168 configured to manage alarms for the building subsystems 122. The applications 110 include an assurance application 170 that implements assurance services for the building subsystems 122. In some embodiments, the applications 110 include an energy application 172 configured to manage the energy usage of the building subsystems 122. The applications 110 include a security application 174 configured to manage security systems of the building.

In some embodiments, the applications 110 and/or the cloud platform 106 interacts with a user device 176. In some embodiments, a component or an entire application of the applications 110 runs on the user device 176. The user device 176 may be a laptop computer, a desktop computer, a smartphone, a tablet, and/or any other device with an input interface (e.g., touch screen, mouse, keyboard, etc.) and an output interface (e.g., a speaker, a display, etc.).

The applications 110, the twin manager 108, the cloud platform 106, and the edge platform 102 can be implemented on one or more computing systems, e.g., on processors and/or memory devices. For example, the edge platform 102 includes processor(s) 118 and memories 120, the cloud platform 106 includes processor(s) 124 and memories 126, the applications 110 include processor(s) 164 and memories 166, and the twin manager 108 includes processor(s) 148 and memories 150.

The processors can be a general purpose or specific purpose processors, an application specific integrated circuit (ASIC), one or more field programmable gate arrays (FPGAs), a group of processing components, or other suitable processing components. The processors may be configured to execute computer code and/or instructions stored in the memories or received from other computer readable media (e.g., CDROM, network storage, a remote server, etc.).

The memories can include one or more devices (e.g., memory units, memory devices, storage devices, etc.) for storing data and/or computer code for completing and/or facilitating the various processes described in the present disclosure. The memories can include random access memory (RAM), read-only memory (ROM), hard drive storage, temporary storage, non-volatile memory, flash memory, optical memory, or any other suitable memory for storing software objects and/or computer instructions. The memories can include database components, object code components, script components, or any other type of information structure for supporting the various activities and information structures described in the present disclosure. The memories can be communicably connected to the processors and can include computer code for executing (e.g., by the processors) one or more processes described herein.

The edge platform 102 can be configured to provide connection to the building subsystems 122. The edge platform 102 can receive messages from the building subsystems 122 and/or deliver messages to the building subsystems 122. The edge platform 102 includes one or multiple gateways, e.g., the gateways 112-116. The gateways 112-116 can act as a gateway between the cloud platform 106 and the building subsystems 122. The gateways 112-116 can be the gateways described in U.S. Provisional Patent Application No. 62/951,897 filed Dec. 20, 2019, the entirety of which is incorporated by reference herein. In some embodiments, the applications 110 can be deployed on the edge platform 102. In this regard, lower latency in management of the building subsystems 122 can be realized.

The edge platform 102 can be connected to the cloud platform 106 via a network 104. The network 104 can communicatively couple the devices and systems of building data platform 100. In some embodiments, the network 104 is at least one of and/or a combination of a Wi-Fi network, a wired Ethernet network, a ZigBee network, a Bluetooth network, and/or any other wireless network. The network 104 may be a local area network or a wide area network (e.g., the Internet, a building WAN, etc.) and may use a variety of communications protocols (e.g., BACnet, IP, LON, etc.). The network 104 may include routers, modems, servers, cell towers, satellites, and/or network switches. The network 104 may be a combination of wired and wireless networks.

The cloud platform 106 can be configured to facilitate communication and routing of messages between the applications 110, the twin manager 108, the edge platform 102, and/or any other system. The cloud platform 106 can include a platform manager 128, a messaging manager 140, a command processor 136, and an enrichment manager 138. In some embodiments, the cloud platform 106 can facilitate messaging between the building data platform 100 via the network 104.

The messaging manager 140 can be configured to operate as a transport service that controls communication with the building subsystems 122 and/or any other system, e.g., managing commands to devices (C2D), commands to connectors (C2C) for external systems, commands from the device to the cloud (D2C), and/or notifications. The messaging manager 140 can receive different types of data from the applications 110, the twin manager 108, and/or the edge platform 102. The messaging manager 140 can receive change on value data 142, e.g., data that indicates that a value of a point has changed. The messaging manager 140 can receive timeseries data 144, e.g., a time correlated series of data entries each associated with a particular time stamp. Furthermore, the messaging manager 140 can receive command data 146. All of the messages handled by the cloud platform 106 can be handled as an event, e.g., the data 142-146 can each be packaged as an event with a data value occurring at a particular time (e.g., a temperature measurement made at a particular time).

The cloud platform 106 includes a command processor 136. The command processor 136 can be configured to receive commands to perform an action from the applications 110, the building subsystems 122, the user device 176, etc. The command processor 136 can manage the commands, determine whether the commanding system is authorized to perform the particular commands, and communicate the commands to the commanded system, e.g., the building subsystems 122 and/or the applications 110. The commands could be a command to change an operational setting that control environmental conditions of a building, a command to run analytics, etc.

The cloud platform 106 includes an enrichment manager 138. The enrichment manager 138 can be configured to enrich the events received by the messaging manager 140. The enrichment manager 138 can be configured to add contextual information to the events. The enrichment manager 138 can communicate with the twin manager 108 to retrieve the contextual information. In some embodiments, the contextual information is an indication of information related to the event. For example, if the event is a timeseries temperature measurement of a thermostat, contextual information such as the location of the thermostat (e.g., what room), the equipment controlled by the thermostat (e.g., what VAV), etc. can be added to the event. In this regard, when a consuming application, e.g., one of the applications 110 receives the event, the consuming application can operate based on the data of the event, the temperature measurement, and also the contextual information of the event.

The enrichment manager 138 can solve a problem that when a device produces a significant amount of information, the information may contain simple data without context. An example might include the data generated when a user scans a badge at a badge scanner of the building subsystems 122. This physical event can generate an output event including such information as "DeviceBadgeScannerID," "BadgeID," and/or "Date/Time." However, if a system sends this data to a consuming application, e.g., Consumer A and a Consumer B, each customer may need to call the building data platform knowledge service to query information with queries such as, "What space, building, floor is that badge scanner in?" or "What user is associated with that badge?"

By performing enrichment on the data feed, a system can be able to perform inferences on the data. A result of the enrichment may be transformation of the message "DeviceBadgeScannerId, BadgeId, Date/Time," to "Region, Building, Floor, Asset, DeviceId, BadgeId, UserName, EmployeeId, Date/Time Scanned." This can be a significant optimization, as a system can reduce the number of calls by 1/n, where n is the number of consumers of this data feed.

By using this enrichment, a system can also have the ability to filter out undesired events. If there are 100 buildings in a campus that receive 100,000 events per building each hour, but only 1 building is actually commissioned, only 1/10 of the events are enriched. By looking at what events are enriched and what events are not enriched, a system can do traffic shaping of forwarding of these events to reduce the cost of forwarding events that no consuming application wants or reads.

An example of an event received by the enrichment manager 138 may be:

```
{
"id": "someguid",
"eventType": "Device_Heartbeat",
"eventTime": "2018-01-27T00:00:00+00:00"
"eventValue": 1,
"deviceID": "someguid"
}
```

An example of an enriched event generated by the enrichment manager 138 may be:

```
{
    "id": "someguid",
    "eventType": "Device_Heartbeat",
    "eventTime": "2018-01-27T00:00:00+00:00",
    "eventValue": 1,
    "deviceID": "someguid",
    "buildingName": "Building-48",
    "buildingID": "SomeGuid",
    "panelID": "SomeGuid",
    "panelName": "Building-48-Panel-13",
    "cityID": 371,
    "cityName": "Milwaukee",
    "stateID": 48,
    "stateName": "Wisconsin (WI)",
    "countryID": 1,
    "countryName": "United States"
}
```

By receiving enriched events, an application of the applications 110 can be able to populate and/or filter what events are associated with what areas. Furthermore, user interface generating applications can generate user interfaces that include the contextual information based on the enriched events.

The cloud platform 106 includes a platform manager 128. The platform manager 128 can be configured to manage the users and/or subscriptions of the cloud platform 106. For example, what subscribing building, user, and/or tenant utilizes the cloud platform 106. The platform manager 128 includes a provisioning service 130 configured to provision the cloud platform 106, the edge platform 102, and the twin manager 108. The platform manager 128 includes a subscription service 132 configured to manage a subscription of the building, user, and/or tenant while the entitlement service 134 can track entitlements of the buildings, users, and/or tenants.

The twin manager 108 can be configured to manage and maintain a digital twin. The digital twin can be a digital representation of the physical environment, e.g., a building. The twin manager 108 can include a change feed generator 152, a schema and ontology 154, a projection manager 156, a policy manager 158, an entity, relationship, and event database 160, and a graph projection database 162.

Figure 11:
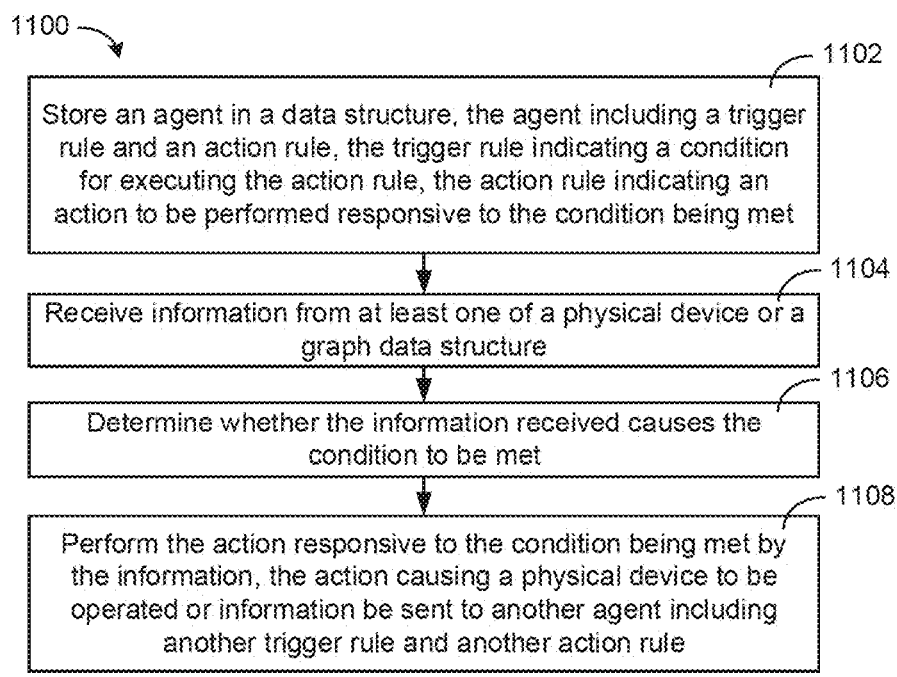
FIG. 11 is a flow diagram an agent of a digital twin executing a trigger rule and an action rule, according to an exemplary embodiment.

The graph projection manager 156 can be configured to construct graph projections and store the graph projections in the graph projection database 162. Examples of graph projections are shown in FIGS. 11-13. Entities, relationships, and events can be stored in the database 160. The graph projection manager 156 can retrieve entities, relationships, and/or events from the database 160 and construct a graph projection based on the retrieved entities, relationships and/or events. In some embodiments, the database 160 includes an entity-relationship collection for multiple subscriptions.

In some embodiments, the graph projection manager 156 generates a graph projection for a particular user, application, subscription, and/or system. In this regard, the graph projection can be generated based on policies for the particular user, application, and/or system in addition to an ontology specific for that user, application, and/or system. In this regard, an entity could request a graph projection and the graph projection manager 156 can be configured to generate the graph projection for the entity based on policies and an ontology specific to the entity. The policies can indicate what entities, relationships, and/or events the entity has access to. The ontology can indicate what types of relationships between entities the requesting entity expects to see, e.g., floors within a building, devices within a floor, etc. Another requesting entity may have an ontology to see devices within a building and applications for the devices within the graph.

The graph projections generated by the graph projection manager 156 and stored in the graph projection database 162 can be a knowledge graph and is an integration point. For example, the graph projections can represent floor plans and systems associated with each floor. Furthermore, the graph projections can include events, e.g., telemetry data of the building subsystems 122. The graph projections can show application services as nodes and API calls between the services as edges in the graph. The graph projections can illustrate the capabilities of spaces, users, and/or devices. The graph projections can include indications of the building subsystems 122, e.g., thermostats, cameras, VAVs, etc. The graph projection database 162 can store graph projections that keep up a current state of a building.

The graph projections of the graph projection database 162 can be digital twins of a building. Digital twins can be digital replicas of physical entities that enable an in-depth analysis of data of the physical entities and provide the potential to monitor systems to mitigate risks, manage issues, and utilize simulations to test future solutions. Digital twins can play an important role in helping technicians find the root cause of issues and solve problems faster, in supporting safety and security protocols, and in supporting building managers in more efficient use of energy and other facilities resources. Digital twins can be used to enable and unify security systems, employee experience, facilities management, sustainability, etc.

In some embodiments the enrichment manager 138 can use a graph projection of the graph projection database 162 to enrich events. In some embodiments, the enrichment manager 138 can identify nodes and relationships that are associated with, and are pertinent to, the device that generated the event. For example, the enrichment manager 138 could identify a thermostat generating a temperature measurement event within the graph. The enrichment manager 138 can identify relationships between the thermostat and spaces, e.g., a zone that the thermostat is located in. The enrichment manager 138 can add an indication of the zone to the event.

Furthermore, the command processor 136 can be configured to utilize the graph projections to command the building subsystems 122. The command processor 136 can identify a policy for a commanding entity within the graph projection to determine whether the commanding entity has the ability to make the command. For example, the command processor 136, before allowing a user to make a command, determine, based on the graph projection database 162, to determine that the user has a policy to be able to make the command.

In some embodiments, the policies can be conditional based policies. For example, the building data platform 100 can apply one or more conditional rules to determine whether a particular system has the ability to perform an action. In some embodiments, the rules analyze a behavioral based biometric. For example, a behavioral based biometric can indicate normal behavior and/or normal behavior rules for a system. In some embodiments, when the building data platform 100 determines, based on the one or more conditional rules, that an action requested by a system does not match a normal behavior, the building data platform 100 can deny the system the ability to perform the action and/or request approval from a higher level system.

For example, a behavior rule could indicate that a user has access to log into a system with a particular IP address between 8 A.M. through 5 P.M. However, if the user logs in to the system at 7 P.M., the building data platform 100 may contact an administrator to determine whether to give the user permission to log in.

The change feed generator 152 can be configured to generate a feed of events that indicate changes to the digital twin, e.g., to the graph. The change feed generator 152 can track changes to the entities, relationships, and/or events of the graph. For example, the change feed generator 152 can detect an addition, deletion, and/or modification of a node or edge of the graph, e.g., changing the entities, relationships, and/or events within the database 160. In response to detecting a change to the graph, the change feed generator 152 can generate an event summarizing the change. The event can indicate what nodes and/or edges have changed and how the nodes and edges have changed. The events can be posted to a topic by the change feed generator 152.

The change feed generator 152 can implement a change feed of a knowledge graph. The building data platform 100 can implement a subscription to changes in the knowledge graph. When the change feed generator 152 posts events in the change feed, subscribing systems or applications can receive the change feed event. By generating a record of all changes that have happened, a system can stage data in different ways, and then replay the data back in whatever order the system wishes. This can include running the changes sequentially one by one and/or by jumping from one major change to the next. For example, to generate a graph at a particular time, all change feed events up to the particular time can be used to construct the graph.

The change feed can track the changes in each node in the graph and the relationships related to them, in some embodiments. If a user wants to subscribe to these changes and the user has proper access, the user can simply submit a web API call to have sequential notifications of each change that happens in the graph. A user and/or system can replay the changes one by one to reinstitute the graph at any given time slice. Even though the messages are "thin" and only include notification of change and the reference "id/seq id," the change feed can keep a copy of every state of each node and/or relationship so that a user and/or system can retrieve those past states at any time for each node. Furthermore, a consumer of the change feed could also create dynamic "views" allowing different "snapshots" in time of what the graph looks like from a particular context. While the twin manager 108 may contain the history and the current state of the graph based upon schema evaluation, a consumer can retain a copy of that data, and thereby create dynamic views using the change feed.

The schema and ontology 154 can define the message schema and graph ontology of the twin manager 108. The message schema can define what format messages received by the messaging manager 140 should have, e.g., what parameters, what formats, etc. The ontology can define graph projections, e.g., the ontology that a user wishes to view. For example, various systems, applications, and/or users can be associated with a graph ontology. Accordingly, when the graph projection manager 156 generates an graph projection for a user, system, or subscription, the graph projection manager 156 can generate a graph projection according to the ontology specific to the user. For example, the ontology can define what types of entities are related in what order in a graph, for example, for the ontology for a subscription of "Customer A," the graph projection manager 156 can create relationships for a graph projection based on the rule:

Region←→Building←→Floor←→Space←→Asset

For the ontology of a subscription of "Customer B," the graph projection manager 156 can create relationships based on the rule:

Building←→Floor←→Asset

The policy manager 158 can be configured to respond to requests from other applications and/or systems for policies. The policy manager 158 can consult a graph projection to determine what permissions different applications, users, and/or devices have. The graph projection can indicate various permissions that different types of entities have and the policy manager 158 can search the graph projection to identify the permissions of a particular entity. The policy manager 158 can facilitate fine grain access control with user permissions. The policy manager 158 can apply permissions across a graph, e.g., if "user can view all data associated with floor 1" then they see all subsystem data for that floor, e.g., surveillance cameras, HVAC devices, fire detection and response devices, etc.

The twin manager 108 includes a query manager 165 and a twin function manager 167. The query manger 164 can be configured to handle queries received from a requesting system, e.g., the user device 176, the applications 110, and/or any other system. The query manager 165 can receive queries that include query parameters and context. The query manager 165 can query the graph projection database 162 with the query parameters to retrieve a result. The query manager 165 can then cause an event processor, e.g., a twin function, to operate based on the result and the context. In some embodiments, the query manager 165 can select the twin function based on the context and/or perform operates based on the context. In some embodiments, the query manager 165 is configured to perform the operations described with reference to FIGS. 5-10.

The twin function manager 167 can be configured to manage the execution of twin functions. The twin function manager 167 can receive an indication of a context query that identifies a particular data element and/or pattern in the graph projection database 162. Responsive to the particular data element and/or pattern occurring in the graph projection database 162 (e.g., based on a new data event added to the graph projection database 162 and/or change to nodes or edges of the graph projection database 162, the twin function manager 167 can cause a particular twin function to execute. The twin function can execute based on an event, context, and/or rules. The event can be data that the twin function executes against. The context can be information that provides a contextual description of the data, e.g., what device the event is associated with, what control point should be updated based on the event, etc. The twin function manager 167 can be configured to perform the operations of the FIGS. 11-15.

Figure 2:
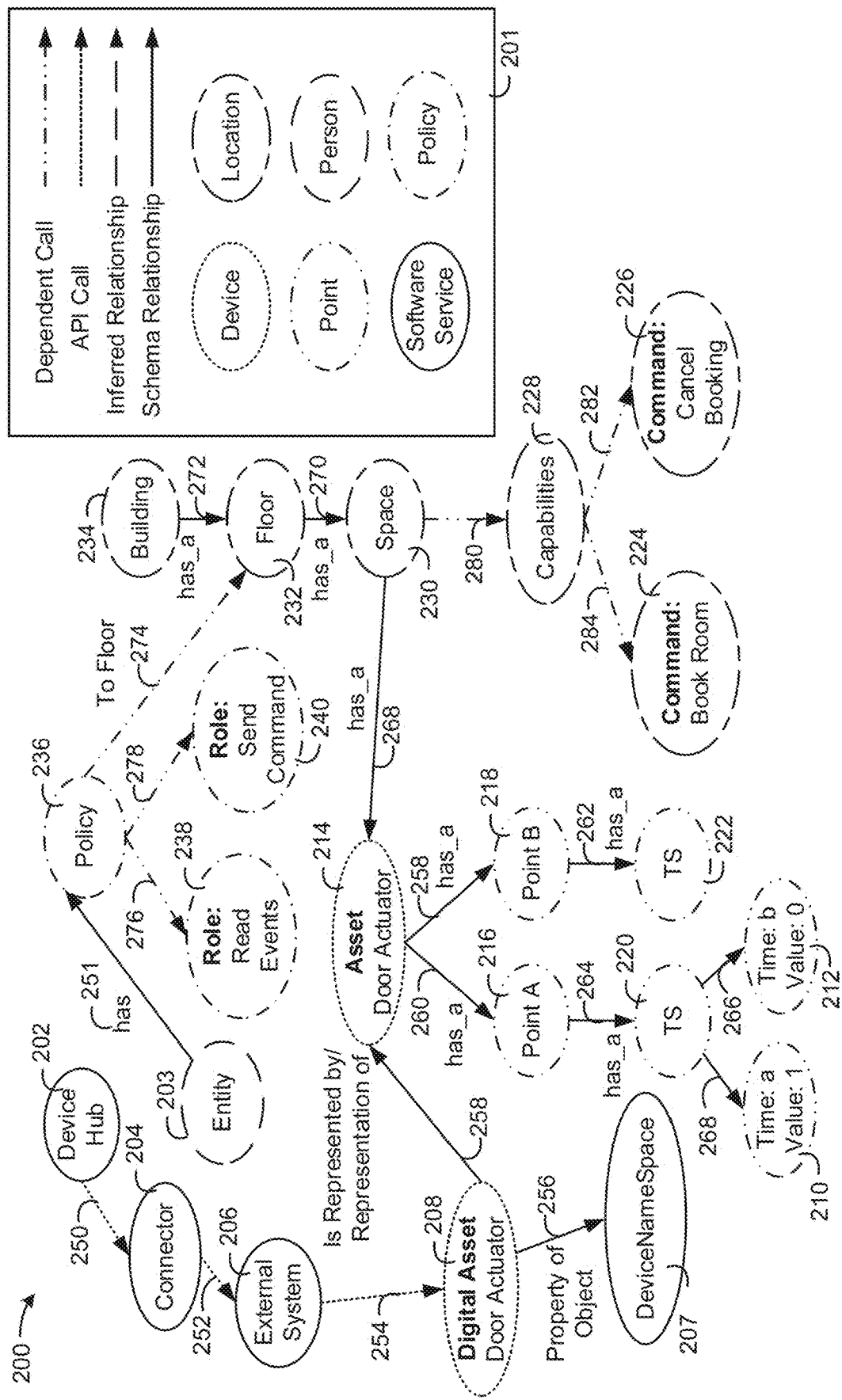
FIG. 2 is a graph projection of the twin manager of FIG. 1 including application programming interface (API) data, capability data, policy data, and services, according to an exemplary embodiment.

Referring now to FIG. 2, a graph projection 200 of the twin manager 108 including application programming interface (API) data, capability data, policy data, and services is shown, according to an exemplary embodiment. The graph projection 200 includes nodes 202-240 and edges 250-272. The nodes 202-240 and the edges 250-272 are defined according to the key 201. The nodes 202-240 represent different types of entities, devices, locations, points, persons, policies, and software services (e.g., API services). The edges 250-272 represent relationships between the nodes 202-240, e.g., dependent calls, API calls, inferred relationships, and schema relationships (e.g., BRICK relationships).

The graph projection 200 includes a device hub 202 which may represent a software service that facilitates the communication of data and commands between the cloud platform 106 and a device of the building subsystems 122, e.g., door actuator 214. The device hub 202 is related to a connector 204, an external system 206, and a digital asset "Door Actuator" 208 by edge 250, edge 252, and edge 254.

The cloud platform 106 can be configured to identify the device hub 202, the connector 204, the external system 206 related to the door actuator 214 by searching the graph projection 200 and identifying the edges 250-254 and edge 258. The graph projection 200 includes a digital representation of the "Door Actuator," node 208. The digital asset "Door Actuator" 208 includes a "DeviceNameSpace" represented by node 207 and related to the digital asset "Door Actuator" 208 by the "Property of Object" edge 256.

The "Door Actuator" 214 has points and timeseries. The "Door Actuator" 214 is related to "Point A" 216 by a "has_a" edge 260. The "Door Actuator" 214 is related to "Point B" 218 by a "has_A" edge 258. Furthermore, timeseries associated with the points A and B are represented by nodes "TS" 220 and "TS" 222. The timeseries are related to the points A and B by "has_a" edge 264 and "has_a" edge 262. The timeseries "TS" 220 has particular samples, sample 210 and 212 each related to "TS" 220 with edges 268 and 266 respectively. Each sample includes a time and a value. Each sample may be an event received from the door actuator that the cloud platform 106 ingests into the entity, relationship, and event database 160, e.g., ingests into the graph projection 200.

The graph projection 200 includes a building 234 representing a physical building. The building includes a floor represented by floor 232 related to the building 234 by the "has_a" edge from the building 234 to the floor 232. The floor has a space indicated by the edge "has_a" 270 between the floor 232 and the space 230. The space has particular capabilities, e.g., is a room that can be booked for a meeting, conference, private study time, etc. Furthermore, the booking can be canceled. The capabilities for the floor 232 are represented by capabilities 228 related to space 230 by edge 280. The capabilities 228 are related to two different commands, command "book room" 224 and command "cancel booking" 226 related to capabilities 228 by edge 284 and edge 282 respectively.

If the cloud platform 106 receives a command to book the space represented by the node, space 230, the cloud platform 106 can search the graph projection 200 for the capabilities for the 228 related to the space 230 to determine whether the cloud platform 106 can book the room.

In some embodiments, the cloud platform 106 could receive a request to book a room in a particular building, e.g., the building 234. The cloud platform 106 could search the graph projection 200 to identify spaces that have the capabilities to be booked, e.g., identify the space 230 based on the capabilities 228 related to the space 230. The cloud platform 106 can reply to the request with an indication of the space and allow the requesting entity to book the space 230.

The graph projection 200 includes a policy 236 for the floor 232. The policy 236 is a related set for the floor 232 based on a "To Floor" edge 274 between the policy 236 and the floor 232. The policy 236 is related to different roles for the floor 232, read events 238 via edge 276 and send command 240 via edge 278. The policy 236 is set for the entity 203 based on has edge 251 between the entity 203 and the policy 236.

The twin manager 108 can identify policies for particular entities, e.g., users, software applications, systems, devices, etc. based on the policy 236. For example, if the cloud platform 106 receives a command to book the space 230. The cloud platform 106 can communicate with the twin manager 108 to verify that the entity requesting to book the space 230 has a policy to book the space. The twin manager 108 can identify the entity requesting to book the space as the entity 203 by searching the graph projection 200. Furthermore, the twin manager 108 can further identify the edge has 251 between the entity 203 and the policy 236 and the edge 1178 between the policy 236 and the command 240.

Furthermore, the twin manager 108 can identify that the entity 203 has the ability to command the space 230 based on the edge 1174 between the policy 236 and the edge 270 between the floor 232 and the space 230. In response to identifying the entity 203 has the ability to book the space 230, the twin manager 108 can provide an indication to the cloud platform 106.

Furthermore, if the entity 203 makes a request to read events for the space 230, e.g., the sample 210 and the sample 212, the twin manager 108 can identify the edge 251 between the entity 203 and the policy 236, the edge 1178 between the policy 236 and the read events 238, the edge 1174 between the policy 236 and the floor 232, the "has_a" edge 270 between the floor 232 and the space 230, the edge 268 between the space 230 and the door actuator 214, the edge 260 between the door actuator 214 and the point A 216, the "has_a" edge 264 between the point A 216 and the TS 220, and the edges 268 and 266 between the TS 220 and the samples 210 and 212 respectively.

Figure 3:
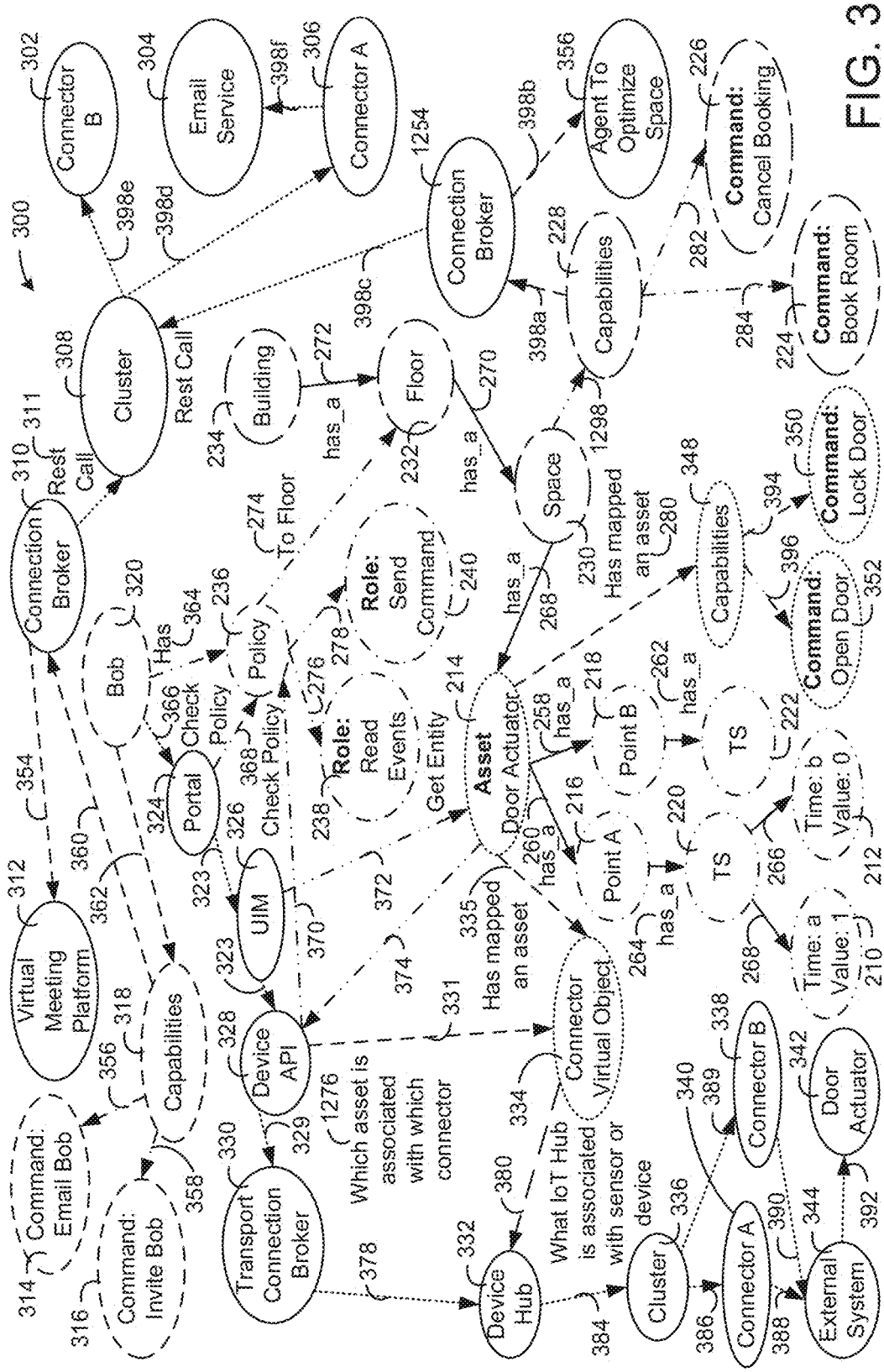
FIG. 3 is another graph projection of the twin manager of FIG. 1 including application programming interface (API) data, capability data, policy data, and services, according to an exemplary embodiment.

Referring now to FIG. 3, a graph projection 300 of the twin manager 108 including application programming interface (API) data, capability data, policy data, and services is shown, according to an exemplary embodiment. The graph projection 300 includes the nodes and edges described in the graph projection 200 of FIG. 2. The graph projection 300 includes a connection broker 354 related to capabilities 228 by edge 398a. The connection broker 354 can be a node representing a software application configured to facilitate a connection with another software application. In some embodiments, the cloud platform 106 can identify the system that implements the capabilities 228 by identifying the edge 398a between the capabilities 228 and the connection broker 354.

The connection broker 354 is related to an agent that optimizes a space 356 via edge 398b. The agent represented by the node 356 can book and cancel bookings for the space represented by the node 230 based on the edge 398b between the connection broker 354 and the node 356 and the edge 398a between the capabilities 228 and the connection broker 354.

The connection broker 354 is related to a cluster 308 by edge 398c. Cluster 308 is related to connector B 302 via edge 398e and connector A 306 via edge 398d. The connector A 306 is related to an external subscription service 304. A connection broker 310 is related to cluster 308 via an edge 311 representing a rest call that the connection broker represented by node 310 can make to the cluster represented by cluster 308.

The connection broker 310 is related to a virtual meeting platform 312 by an edge 354. The node 312 represents an external system that represents a virtual meeting platform 312. The connection broker represented by node 310 can represent a software component that facilitates a connection between the cloud platform 106 and the virtual meeting platform represented by node 312. When the cloud platform 106 needs to communicate with the virtual meeting platform represented by the node 312, the cloud platform 106 can identify the edge 354 between the connection broker 310 and the virtual meeting platform 312 and select the connection broker represented by the node 310 to facilitate communication with the virtual meeting platform represented by the node 312.

A capabilities node 318 can be connected to the connection broker 310 via edge 360. The capabilities 318 can be capabilities of the virtual meeting platform represented by the node 312 and can be related to the node 312 through the edge 360 to the connection broker 310 and the edge 354 between the connection broker 310 and the node 312. The capabilities 318 can define capabilities of the virtual meeting platform represented by the node 312. The node 320 is related to capabilities 318 via edge 362. The capabilities 318 may be an invite bob command represented by node 316 and an email bob command represented by node 314. The capabilities 318 can be linked to a node 320 representing a user, Bob. The cloud platform 106 can facilitate email commands to send emails to the user Bob via the email service represented by the node 304. The node 304 is related to the connect a node 306 via edge 398f. Furthermore, the cloud platform 106 can facilitate sending an invite for a virtual meeting via the virtual meeting platform represented by the node 312 linked to the node 318 via the edge 358.

The node 320 for the user Bob can be associated with the policy 236 via the "has" edge 364. Furthermore, the node 320 can have a "check policy" edge 366 with a portal node 324. The device API node 328 has a check policy edge 370 to the policy node 236. The portal node 324 has an edge 368 to the policy node 236. The portal node 324 has an edge 323 to a node 326 representing a user input manager (UIM). The portal node 324 is related to the UIM node 326 via an edge 323. The UIM node 326 has an edge 323 to a device API node 328. The UIM node 326 is related to the door actuator node 214 via edge 372. The door actuator node 214 has an edge 374 to the device API node 328. The door actuator 214 has an edge 335 to the connector virtual object 334. The device hub 332 is related to the connector virtual object via edge 380. The device API node 328 can be an API for the door actuator 214. The connector virtual object 334 is related to the device API node 328 via the edge 331.

The device API node 328 is related to a transport connection broker 330 via an edge 329. The transport connection broker 330 is related to a device hub 332 via an edge 378. The device hub represented by node 332 can be a software component that hands the communication of data and commands for the door actuator 214. The cloud platform 106 can identify where to store data within the graph projection 300 received from the door actuator by identifying the nodes and edges between the points 216 and 218 and the device hub node 332. Similarly, the cloud platform 308 can identify commands for the door actuator that can be facilitated by the device hub represented by the node 332, e.g., by identifying edges between the device hub node 332 and an open door node 352 and a lock door node 350. The door actuator node 214 has an edge "has mapped an asset" 280 between the node 214 and a capabilities node 348. The capabilities node 348 and the nodes 352 and 350 are linked by edges 396 and 394.

The device hub 332 is linked to a cluster 336 via an edge 384. The cluster 336 is linked to connector A 340 and connector B 338 by edges 386 and the edge 389. The connector A 340 and the connector B 338 is linked to an external system 344 via edges 388 and 390. The external system 344 is linked to a door actuator 342 via an edge 392.

Figure 4:
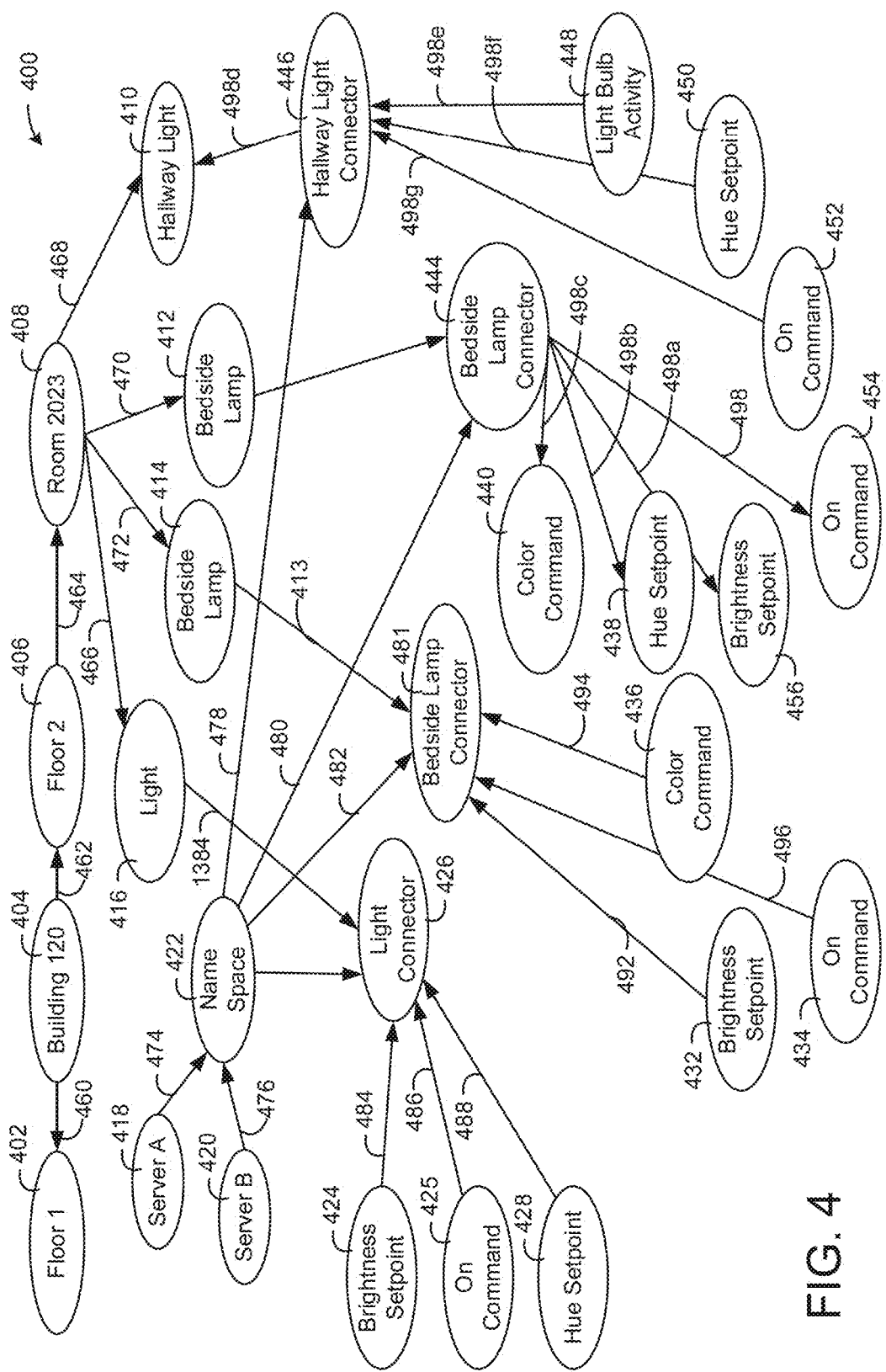
FIG. 4 is a graph projection of the twin manager of FIG. 1 including equipment and capability data for the equipment, according to an exemplary embodiment.

Referring now to FIG. 4, a graph projection 400 of the twin manager 108 including equipment and capability data for the equipment is shown, according to an exemplary embodiment. The graph projection 400 includes nodes 402-456 and edges 360-498f. The cloud platform 106 can search the graph projection 400 to identify capabilities of different pieces of equipment.

A building node 404 represents a particular building that includes two floors. A floor 1 node 402 is linked to the building node 404 via edge 460 while a floor 2 node 406 is linked to the building node 404 via edge 462. The floor 2 includes a particular room 2023 represented by edge 464 between floor 2 node 406 and room 2023 node 408. Various pieces of equipment are included within the room 2023. A light represented by light node 416, a bedside lamp node 414, a bedside lamp node 412, and a hallway light node 410 are related to room 2023 node 408 via edge 466, edge 472, edge 470, and edge 468.

The light represented by light node 416 is related to a light connector 426 via edge 484. The light connector 426 is related to multiple commands for the light represented by the light node 416 via edges 484, 486, and 488. The commands may be a brightness setpoint 424, an on command 425, and a hue setpoint 428. The cloud platform 106 can receive a request to identify commands for the light represented by the light 416 and can identify the nodes 424-428 and provide an indication of the commands represented by the node 424-428 to the requesting entity. The requesting entity can then send commands for the commands represented by the nodes 424-428.

The bedside lamp node 414 is linked to a bedside lamp connector 481 via an edge 413. The connector 481 is related to commands for the bedside lamp represented by the bedside lamp node 414 via edges 492, 496, and 494. The command nodes are a brightness setpoint node 432, an on command node 434, and a color command 436. The hallway light 410 is related to a hallway light connector 446 via an edge 498d. The hallway light connector 446 is linked to multiple commands for the hallway light node 410 via edges 498g, 498f, and 498e. The commands are represented by an on command node 452, a hue setpoint node 450, and a light bulb activity node 448.

The graph projection 400 includes a name space node 422 related to a server A node 418 and a server B node 420 via edges 474 and 476. The name space node 422 is related to the bedside lamp connector 481, the bedside lamp connector 444, and the hallway light connector 446 via edges 482, 480, and 478. The bedside lamp connector 444 is related to commands, e.g., the color command node 440, the hue setpoint command 438, a brightness setpoint command 456, and an on command 454 via edges 498c, 498b, 498a, and 498.

Figure 5:
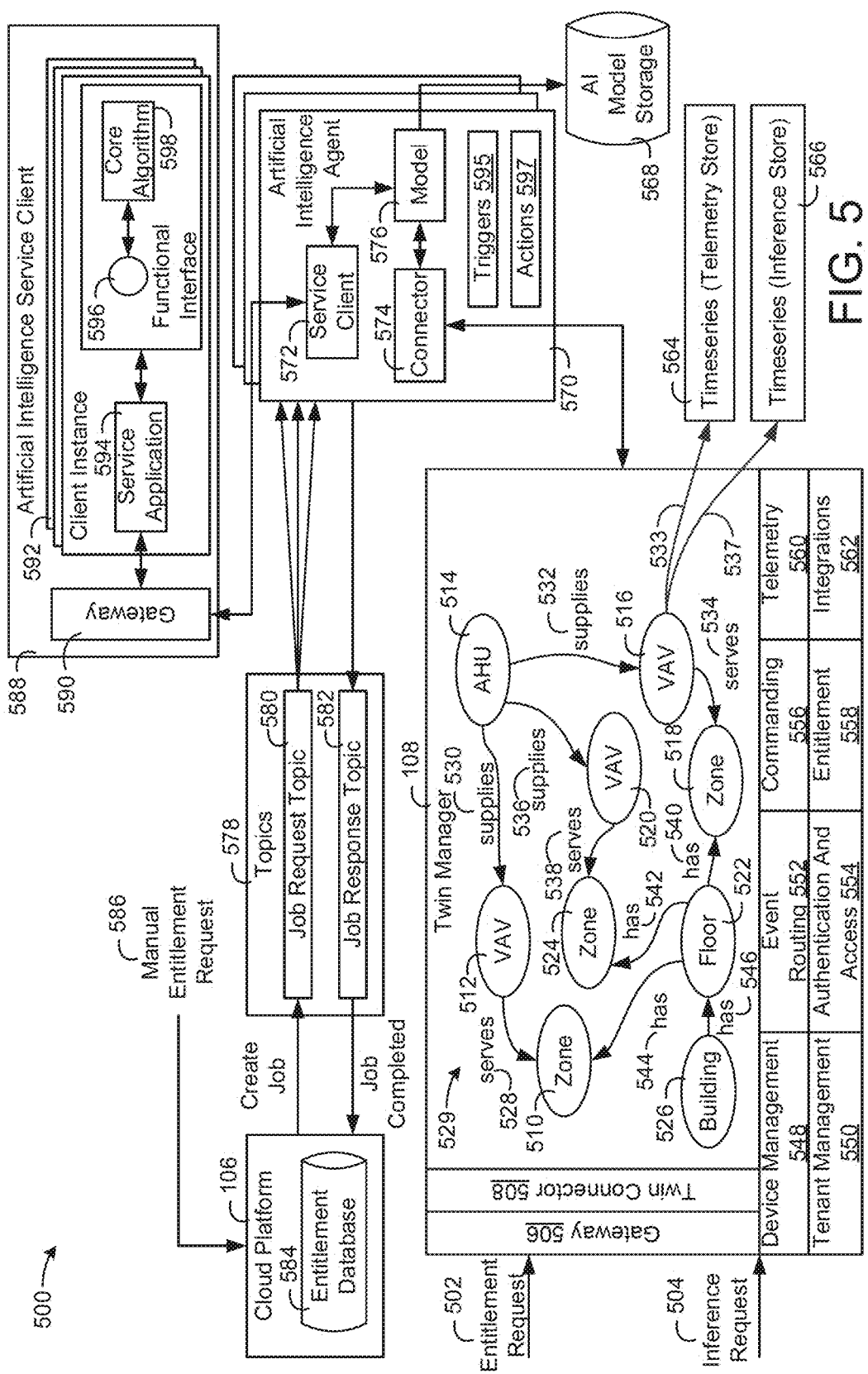
FIG. 5 is a block diagram of a system for managing a digital twin where an artificial intelligence agent can be executed to infer information for an entity of a graph, according to an exemplary embodiment.

Referring now to FIG. 5, a system 500 for managing a digital twin where an artificial intelligence agent can be executed to infer and/or predict information for an entity of a graph is shown, according to an exemplary embodiment. The system 500 can be components of the building data platform 100, e.g., components run on the processors and memories of the edge platform 102, the cloud platform 106, the twin manager 108, and/or the applications 110. The system 500 can, in some implementations, implement a digital twin with artificial intelligence.

A digital twin (or a shadow) may be a computing entity that describes a physical thing (e.g., a building, spaces of a building, devices of a building, people of the building, equipment of the building, etc.) through modeling the physical thing through a set of attributes that define the physical thing. A digital twin can refer to a digital replica of physical assets (a physical device twin) and can be extended to store processes, people, places, systems that can be used for various purposes. The digital twin can include both the ingestion of information and actions learned and executed through artificial intelligence agents.

In FIG. 5, the digital twin can be a graph 529 managed by the twin manager 108 and/or artificial intelligence agents 570. In some embodiments, the digital twin is the combination of the graph 529 with the artificial intelligence agents 570. In some embodiments, the digital twin enables the creation of a chronological time-series database of telemetry events for analytical purposes. In some embodiments, the graph 529 uses the BRICK schema.

The twin manager 108 stores the graph 529 which may be a graph data structure including various nodes and edges interrelating the nodes. The graph 529 may be the same as, or similar to, the graph projections described herein with reference to FIGS. 1-4. The graph 529 includes nodes 510-526 and edges 528-546. The graph 529 includes a building node 526 representing a building that has a floor indicated by the "has" edge 546 to the floor node 522. The floor node 522 is relate to a zone node 510 via a "has" edge 544 indicating that the floor represented by the node 522 has a zone represented by the zone 510.

The floor node 522 is related to the zone node 518 by the "has" edge 540 indicating that the floor represented by the floor node 522 has another zone represented by the zone node 518. The floor node 522 is related to another zone node 524 via a "has" edge 542 representing that the floor represented by the floor node 522 has a third zone represented by the zone node 524.

The graph 529 includes an AHU node 514 representing an AHU of the building represented by the building node 526. The AHU node 514 is related by a "supplies" edge 530 to the VAV node 512 to represent that the AHU represented by the AHU node 514 supplies air to the VAV represented by the VAV node 512. The AHU node 514 is related by a "supplies" edge 536 to the VAV node 520 to represent that the AHU represented by the AHU node 514 supplies air to the VAV represented by the VAV node 520. The AHU node 514 is related by a "supplies" edge 532 to the VAV node 516 to represent that the AHU represented by the AHU node 514 supplies air to the VAV represented by the VAV node 516.

The VAV node 516 is related to the zone node 518 via the "serves" edge 534 to represent that the VAV represented by the VAV node 516 serves (e.g., heats or cools) the zone represented by the zone node 518. The VAV node 520 is related to the zone node 524 via the "serves" edge 538 to represent that the VAV represented by the VAV node 520 serves (e.g., heats or cools) the zone represented by the zone node 524. The VAV node 512 is related to the zone node 510 via the "serves" edge 528 to represent that the VAV represented by the VAV node 512 serves (e.g., heats or cools) the zone represented by the zone node 510.

Furthermore, the graph 529 includes an edge 533 related to a timeseries node 564. The timeseries node 564 can be information stored within the graph 529 and/or can be information stored outside the graph 529 in a different database (e.g., a timeseries database). In some embodiments, the timeseries node 564 stores timeseries data (or any other type of data) for a data point of the VAV represented by the VAV node 516. The data of the timeseries node 564 can be aggregated and/or collected telemetry data of the timeseries node 564.

Furthermore, the graph 529 includes an edge 537 related to a timeseries node 566. The timeseries node 566 can be information stored within the graph 529 and/or can be information stored outside the graph 529 in a different database (e.g., a timeseries database). In some embodiments, the timeseries node 566 stores timeseries data (or any other type of data) for a data point of the VAV represented by the VAV node 516. The data of the timeseries node 564 can be inferred information, e.g., data inferred by one of the artificial intelligence agents 570 and written into the timeseries node 564 by the artificial intelligence agent 570. In some embodiments, the timeseries 546 and/or 566 are stored in the graph 529 but are stored as references to timeseries data stored in a timeseries database.

The twin manager 108 includes various software components. For example, the twin manager 108 includes a device management component 548 for managing devices of a building. The twin manager 108 includes a tenant management component 550 for managing various tenant subscriptions. The twin manager 108 includes an event routing component 552 for routing various events. The twin manager 108 includes an authentication and access component 554 for performing user and/or system authentication and granting the user and/or system access to various spaces, pieces of software, devices, etc. The twin manager 108 includes a commanding component 556 allowing a software application and/or user to send commands to physical devices. The twin manager 108 includes an entitlement component 558 that analyzes the entitlements of a user and/or system and grants the user and/or system abilities based on the entitlements. The twin manager 108 includes a telemetry component 560 that can receive telemetry data from physical systems and/or devices and ingest the telemetry data into the graph 529. Furthermore, the twin manager 108 includes an integrations component 562 allowing the twin manager 108 to integrate with other applications.

The twin manager 108 includes a gateway 506 and a twin connector 508. The gateway 506 can be configured to integrate with other systems and the twin connector 508 can be configured to allow the gateway 506 to integrate with the twin manager 108. The gateway 506 and/or the twin connector 508 can receive an entitlement request 502 and/or an inference request 504. The entitlement request 502 can be a request received from a system and/or a user requesting that an AI agent action be taken by the AI agent 570. The entitlement request 502 can be checked against entitlements for the system and/or user to verify that the action requested by the system and/or user is allowed for the user and/or system. The inference request 504 can be a request that the AI agent 570 generates an inference, e.g., a projection of information, a prediction of a future data measurement, an extrapolated data value, etc.

The cloud platform 106 is shown to receive a manual entitlement request 586. The request 586 can be received from a system, application, and/or user device (e.g., from the applications 110, the building subsystems 122, and/or the user device 176). The manual entitlement request 586 may be a request for the AI agent 570 to perform an action, e.g., an action that the requesting system and/or user has an entitlement for. The cloud platform 106 can receive the manual entitlement request 586 and check the manual entitlement request 586 against an entitlement database 584 storing a set of entitlements to verify that the requesting system has access to the user and/or system. The cloud platform 106, responsive to the manual entitlement request 586 being approved, can create a job for the AI agent 570 to perform. The created job can be added to a job request topic 580 of a set of topics 578.

The job request topic 580 can be fed to AI agents 570. For example, the topics 580 can be fanned out to various AI agents 570 based on the AI agent that each of the topics 580 pertains to (e.g., based on an identifier that identifies an agent and is included in each job of the topic 580). The AI agents 570 include a service client 572, a connector 574, and a model 576. The model 576 can be loaded into the AI agent 570 from a set of AI models stored in the AI model storage 568. The AI model storage 568 can store models for making energy load predictions for a building, weather forecasting models for predicting a weather forecast, action/decision models to take certain actions responsive to certain conditions being met, an occupancy model for predicting occupancy of a space and/or a building, etc. In some embodiments, the occupancy level may be a numerical value that indicates the amount of people within the building (e.g., total number, portion of the building capacity, scale between 1 (empty) and 10 (full), etc.). In some embodiments, the occupancy level may be a non-numerical indicator that indicates the amount of people within the building such as occupancy descriptors (e.g., "Empty", "Half-Full", "Full"). The models of the AI model storage 568 can be neural networks (e.g., convolutional neural networks, recurrent neural networks, deep learning networks, etc.), decision trees, support vector machines, and/or any other type of artificial intelligence, machine learning, and/or deep learning category. In some embodiments, the models are rule based triggers and actions that include various parameters for setting a condition and defining an action.

The AI agent 570 can include triggers 595 and actions 597. The triggers 595 can be conditional rules that, when met, cause one or more of the actions 597. The triggers 595 can be executed based on information stored in the graph 529 and/or data received from the building subsystems 122. The actions 597 can be executed to determine commands, actions, and/or outputs. The output of the actions 597 can be stored in the graph 529 and/or communicated to the building subsystems 122.

The AI agent 570 can include a service client 572 that causes an instance of an AI agent to run. The instance can be hosted by the artificial intelligence service client 588. The client 588 can cause a client instance 592 to run and communicate with the AI agent 570 via a gateway 590. The client instance 592 can include a service application 594 that interfaces with a core algorithm 598 via a functional interface 596. The core algorithm 598 can run the model 576, e.g., train the model 576 and/or use the model 576 to make inferences and/or predictions.

In some embodiments, the core algorithm 598 can be configured to perform learning based on the graph 529. In some embodiments, the core algorithm 598 can read and/or analyze the nodes and relationships of the graph 529 to make decisions. In some embodiments, the core algorithm 598 can be configured to use telemetry data (e.g., the timeseries data 564) from the graph 529 to make inferences on and/or perform model learning. In some embodiments, the result of the inferences can be the timeseries 566. In some embodiments, the timeseries 564 is an input into the model 576 that predicts the timeseries 566.

In some embodiments, the core algorithm 598 can generate the timeseries 566 as an inference for a data point, e.g., a prediction of values for the data point at future times. The timeseries 564 may be actual data for the data point. In this regard, the core algorithm 598 can learn and train by comparing the inferred data values against the true data values. In this regard, the model 576 can be trained by the core algorithm 598 to improve the inferences made by the model 576.

Figure 6:
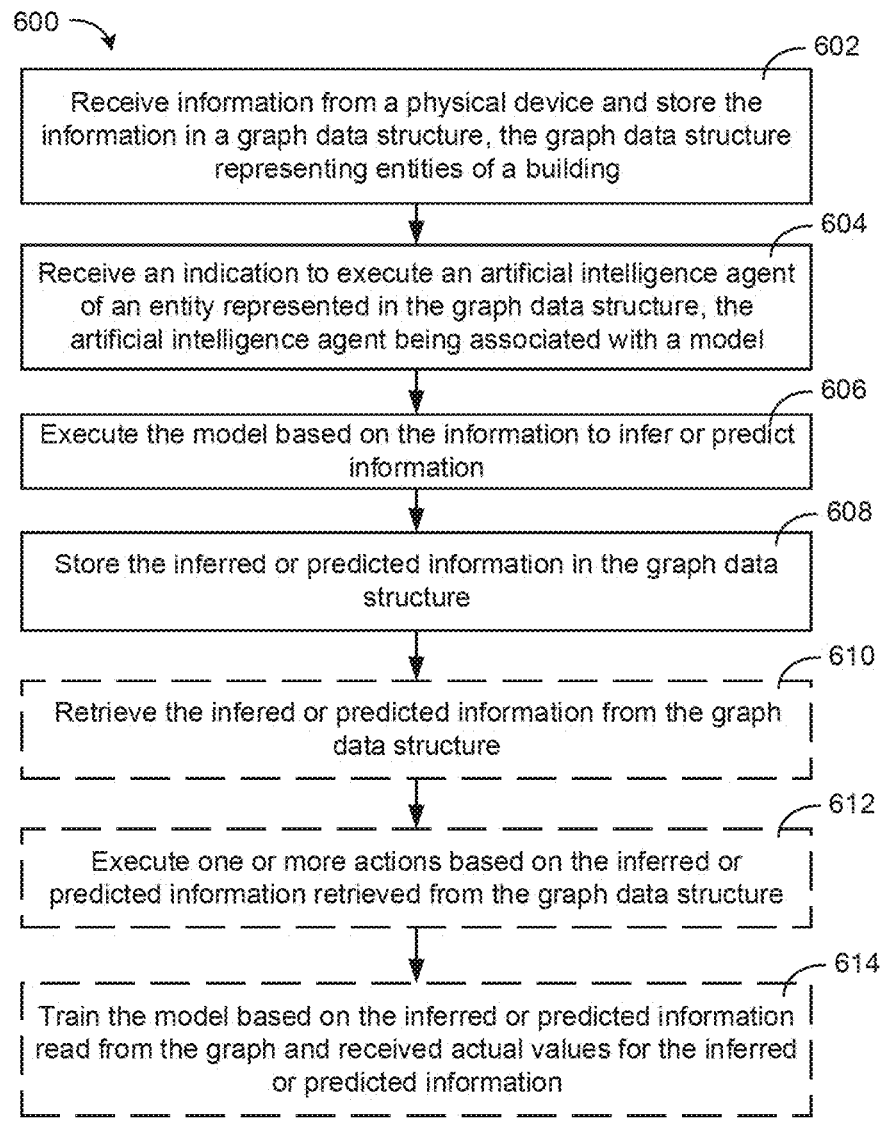
FIG. 6 is a flow diagram of a process for executing an artificial intelligence agent to infer and/or predict information, according to an exemplary embodiment.

Referring now to FIG. 6, a process 600 for executing an artificial intelligence agent to infer and/or predict information is shown, according to an exemplary embodiment. The process 600 can be performed by the system 500 and/or components of the system 500. The process 600 can be performed by the building data platform 100. Furthermore, the process 600 can be performed by any computing device described herein.

In step 602, the twin manager 108 receives information from a physical device and stores the information, or a link to the information, in the graph 529. For example, the telemetry component 560 can receive telemetry data from physical devices, e.g., the building subsystems 122. The telemetry can be measured data values, a log of historical equipment commands, etc. The telemetry component 560 can store the received information in the graph 529 by relating a node storing the information to a node representing the physical device. For example, the telemetry component 560 can store timeseries data as the timeseries 566 along by identifying that the physical device is a VAV represented by the VAV node 516 and that an edge 537 relates the VAV node 516 to the timeseries node 566.

In step 604, the twin manager 108 and/or the cloud platform 106 receives an indication to execute an artificial intelligence agent of an entity represented in the graph 529, the AI agent being associated with a model. In some embodiments, the indication is created by a user and provided via the user device 176. In some embodiments, the indication is created by an application, e.g., one of the applications 110. In some embodiments, the indication is a triggering event that triggers the agent and is received from the building subsystems 122 and/or another agent (e.g., an output of one agent fed into another agent).

In some embodiments, the AI agent is an agent for a specific entity represented in the graph 529. For example, the agent could be a VAV maintenance agent configured to identify whether a VAV (e.g., a VAV represented by the nodes 512, 530, and/or 516) should have maintenance performed at a specific time. Another agent could be a floor occupant prediction agent that is configure to predict the occupancy of a particular floor of a building, e.g., the floor represented by the floor node 522.

Responsive to receiving the indication, in step 606, the AI agent 570 causes a client instance 592 to run the model 576 based on the information received in step 602. In some embodiments, the information received in step 602 is provided directly to the AI agent 570. In some embodiments, the information is read from the graph 529 by the AI agent 570.

In step 608, the AI agent 570 stores the inferred and/or predicted information in the graph 529 (or stores the inferred and/or predicted information in a separate data structure with a link to the graph 529). In some embodiments, the AI agent 570 identifies that the node that represents the physical entity that the AI agent 570 inferred and/or predicted information for, e.g., the VAV represented by the VAV 516. The AI agent 570 can identify that the timeseries node 566 stores the inferred and/or predicted information by identifying the edge 537 between the VAV node 516 and the timeseries node 566.

In step 610, the AI agent 570 can retrieve the inferred or predicted information from the graph 529 responsive to receiving an indication to execute the model of the AI agent 570 of the inferred or predicted information, e.g., similar to the step 604. In step 612, the AI agent 570 can execute one or more actions based on the inferred and/or predicted information of the step 610 based the inferred and/or predicted information retrieved from the graph 529. In some embodiments, the AI agent 570 executes the model 576 based on the inferred and/or predicted information.

In step 614, the AI agent 570 can train the model 576 based on the inferred or predicted information read from the graph 529 and received actual values for the inferred or predicted information. In some embodiments, the AI agent 570 can train and update parameters of the model 576. For example, the timeseries 564 may represent actual values for a data point of the VAV represented by the VAV node 516. The timeseries 566 can be the inferred and/or predicted information. The AI agent 570 can compare the timeseries 564 and the timeseries 566 to determine an error in the inferences and/or predictions of the model 576. The error can be used by the model 576 to update and train the model 576.

Figure 7:
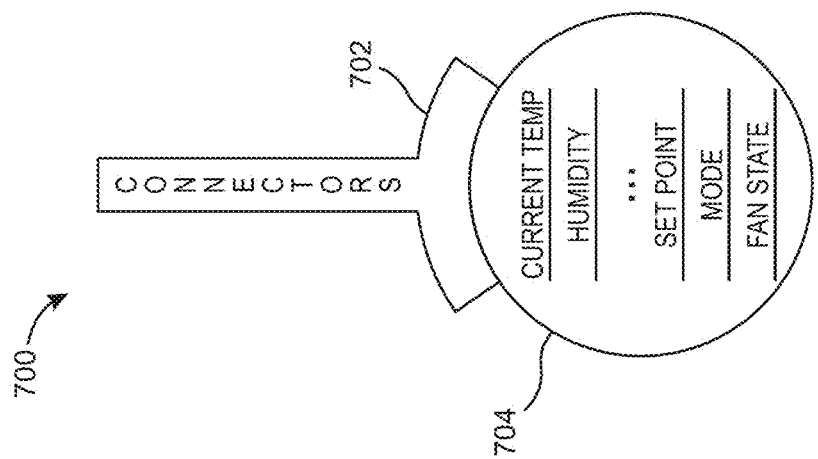
FIG. 7 is a diagram of a digital twin including a connector and a database, according to an exemplary embodiment.

Referring now to FIG. 7, a digital twin 700 including a connector and a database is shown, according to an exemplary embodiment. The digital twin 700 can be a software component stored and/or managed by the building data platform 100. The building data platform 100 includes connectors 702 and a database 704. The database 704 can store data attributes for a physical entity, e.g., a building, a VAV, etc. that describe the current state and/or operation of the physical entity. The connector 702 can be a software component that receives data from the physical device represented by the digital twin 700 and updates the attributes of the database 704. For example, the connector 702 can ingest device telemetry data into the database 704 to update the attributes of the digital twin 700.

Figure 8:
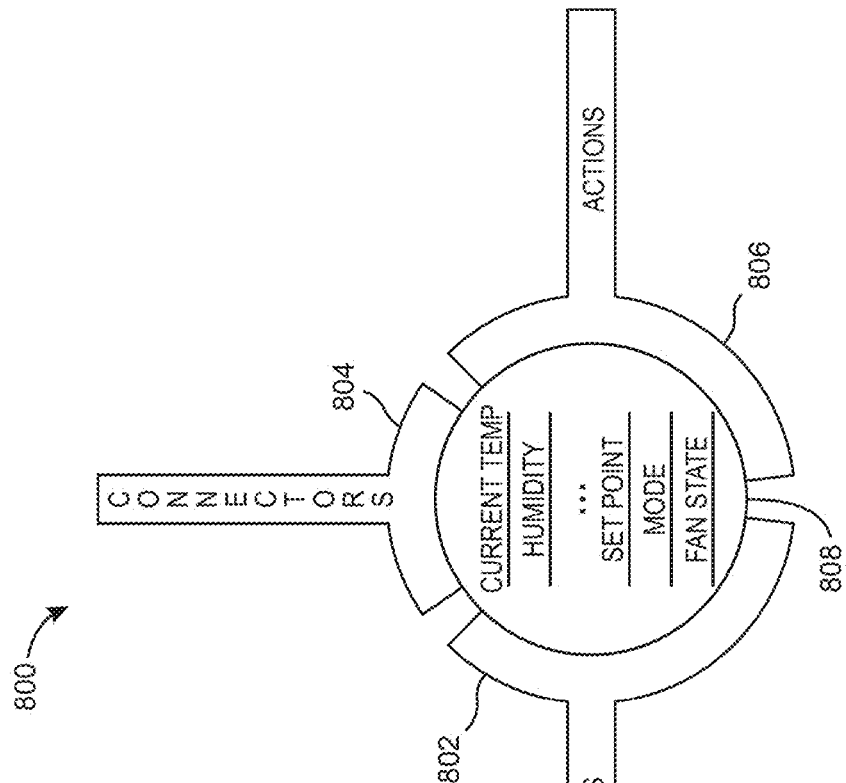
FIG. 8 is a block diagram of a digital twin including triggers, connectors, actions, and a graph, according to an exemplary embodiment.

Referring now to FIG. 8, a digital twin 800 including triggers 802, connectors 804, actions 806, and a graph 808 is shown, according to an exemplary embodiment. The digital twin 800 can be a digital replica of physical assets (e.g., a physical device twin, sensor twin, actuator twin, building device twin, etc.) and can be used to store processes, people, places, systems that can be used for various purposes. The digital twins can be created, managed, stored, and/or operated on by the building data platform 100.

In some cases, the devices can also be actuated on (told to perform an action). For example, a thermostat has sensors to measure temperature and humidity. A thermostat can also be asked to perform an action of setting the setpoint for an HVAC system. In this regard, the digital twin 800 can be configured so that information that the digital twin 800 can be made aware of can be stored by the digital twin 800 and there are also actions that the digital twin 800 can take.

The digital twin 800 can include a connector 804 that ingests device telemetry into the graph 808 and/or update the digital twin attributes stored in the graph 808. In some embodiments, the connectors 804 can ingest external data received from external data sources into the graph 808. The external data could be weather data, calendar data, etc. In some embodiments, the connectors 804 can send commands back to the devices, e.g., the actions determined by the actions 806.

The digital twin 800 includes triggers 802 which can set conditional logic for triggering the actions 706. The digital twin 800 can apply the attributes stored in the graph 808 against a rule of the triggers 802. When a particular condition of the rule of the triggers 802 involving that attribute is met, the actions 706 execute. One example of a trigger could be a conditional question, "when the temperature of the zone managed by the thermostat reaches x degrees Fahrenheit." When the question is met by the attributes stored in the graph 808, a rule of the actions 706 can execute.

The digital twin 800 can, when executing the actions 806, update an attribute of the graph 808, e.g., a setpoint, an operating setting, etc. These attributes can be translated into commands that the building data platform 100 can send to physical devices that operate based on the setpoint, the operating setting, etc. An example of an action rule for the actions 806 could be the statement, "update the setpoint of the HVAC system for a zone to x Degrees Fahrenheit."

In some embodiments, the triggers 802 and/or the actions 806 are predefined and/or manually defined through user input of the user device 176. In some cases, it may be difficult for a user to determine what the parameter values of the trigger rule should be (e.g., what values maximize a particular reward or minimize a particular penalty). Similarly, it may be difficult for a user to determine what the parameter values of the action rule should be (e.g., what values maximize the particular reward or minimize the particular penalty). Furthermore, even if the user is able to identify the ideal parameter values for the triggers 802 and the actions 806, the ideal values for the parameters may not be constant and may instead change over time. Therefore, it would be desirable if the values of the attributes for the triggers 802 and the actions 806 are tuned optimally and automatically by the building data platform 100 by observing the responses from other related digital twins.

Causal patterns between one or more digital twins having their triggering conditions satisfied and one or more digital twins (including the triggering digital twin) actuating by sending specific commands to their physical counterparts could be learned and defined by the building data platform 100. Automated learning can be used by the building data platform 100 during real operations, by running simulations using digital twins, or using predicted inference within the digital twin. There may not even be the need for all standard operating procedures in building systems to be defined upfront by a user since patterns of interaction between digital twins can be learned by the building data platform 100 to define and recommend those to building and facility owners.

Figure 9:
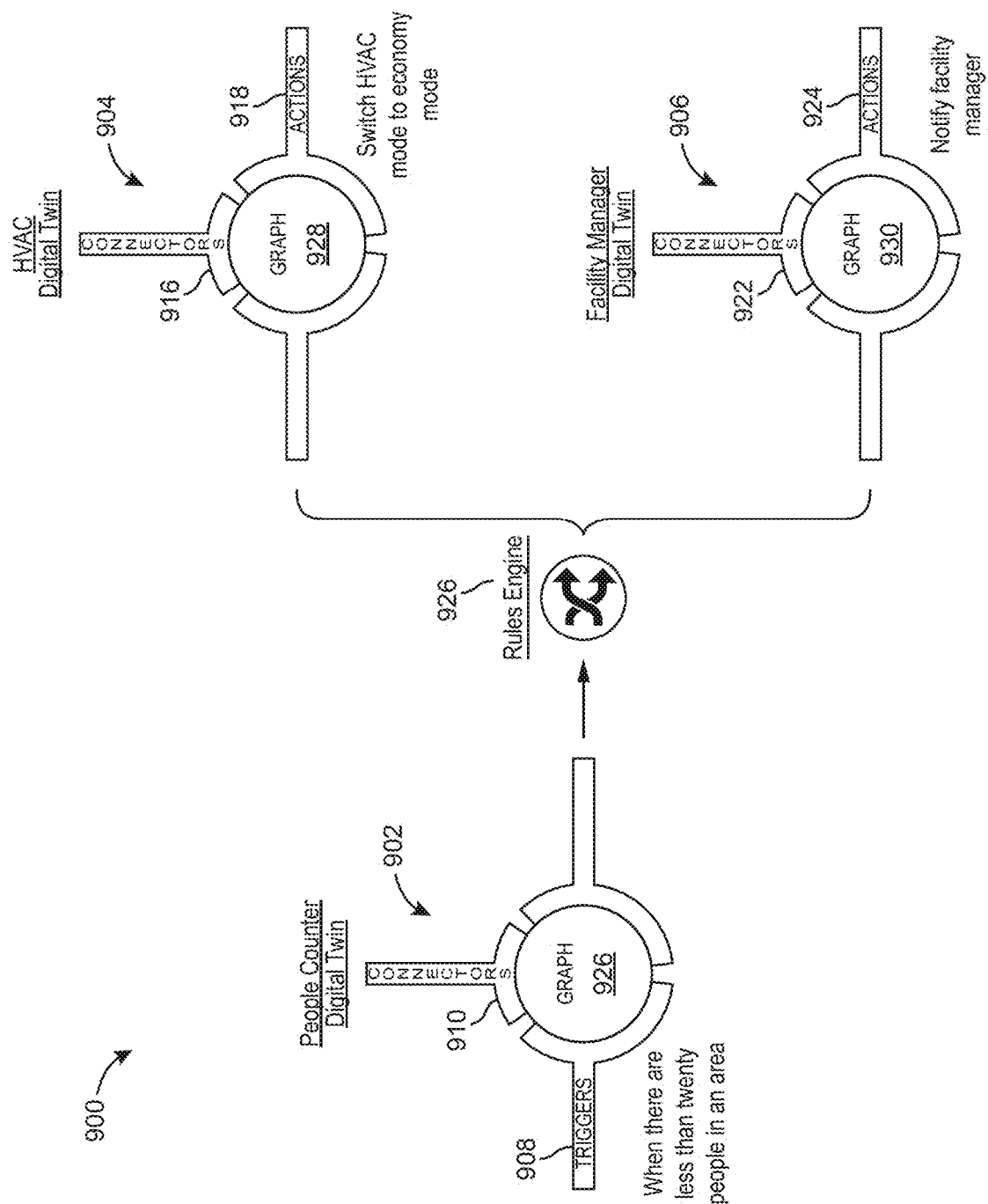
FIG. 9 is a block diagram of a people counter digital twin, an HVAC digital twin, and a facility manager digital twin that have triggers and actions that are interconnected, according to an exemplary embodiment.

Referring now to FIG. 9, a system 900 of digital twins including a people counter digital twin 902, an HVAC digital twin 904, and a facility manager digital twin 906 that have triggers and actions that are interconnected is shown, according to an exemplary embodiment. In FIG. 9, the people counter digital twin 902 is shown including triggers 908, connectors 910, actions 912, and the graph 926.

The system 900 further includes an HVAC digital twin 904 that includes triggers 914, connectors 916, and actions 918. The system 900 further includes the facility manager 906 that includes triggers 920, connectors 922, and actions 924. In some embodiments, the graph 926, the graph 928, and the graph 930 are the same graph or different graphs. In some embodiments, the graphs 926-930 are the graph 529.

In the system 900, the actions 912 are connected to the triggers 914 and the triggers 920. In this regard, whatever action is taken by the people counter digital twin 902, the result of the action will be provided to the HVAC digital twin 904 and the facility manager digital twin 906. The people counter digital twin 902 can output a "low occupancy" attribute which can be stored in the graph 926 and/or provided to the HVAC digital twin 904 and/or the facility manager digital twin 906. In some embodiments, if all of the digital twins use and/or have access to the same graph, if the people counter digital twin 902 stores the low occupancy indicator in the graph, the HVAC digital twin 904 and the facility manager digital twin 906 can read the attribute from the graph.

In some embodiments, the trigger 908 is the logical condition, "when there are less than twenty people in a particular area." Responsive to an occupancy count of the particular area is less than twenty, which the people counter digital twin 902 can determine from models and/or information of the graph 926, a low occupancy indication can be generated by the actions 912. The low occupancy indication can be provided to the HVAC digital twin 904.

In some embodiments, the trigger 914 of the HVAC digital twin 904 can be the logical condition, "if there is low occupancy." Similarly, the trigger 920 of the facility manager digital twin 906 can be the logical condition, "if there is low occupancy." Responsive to the trigger 914 being triggered, the actions 918 can execute to switch an HVAC mode to an economy mode. The economy mode status for an HVAC system can be stored in the graph 928 and/or communicated to an HVAC controller to execute on. Responsive to the trigger 920 being triggered, the actions 924 can execute to notify a facility manager of the low occupancy status, e.g., send a notification to a user device of the facility manager.

In some embodiments, the digital twins of the system 900 can be solution twins, e.g., the people counter twin 902, the HVAC digital twin 904, the facility manager twin 906, etc. The digital twin can be a solution twin because it represents a particular software solutions for the building. For example, in some embodiments, an occupancy sensor digital twin of a zone could be triggered with under-utilized criteria (e.g., the triggering of the people counter digital twin 902 shown in FIG. 9). The people counter digital twin 902 could be configured to identify what AHU is serving the zone that it has made an occupancy detection for based on the nodes and/or edges of the graph 926 relating a zone node for the zone and an AHU node for the AHU. In some embodiments, the AHU digital twin can evaluate the desired setting for the zone through running a simulation with one or more models. In some embodiments, an FM digital twin can evaluate space arrangement and/or purposing.

Figure 10:
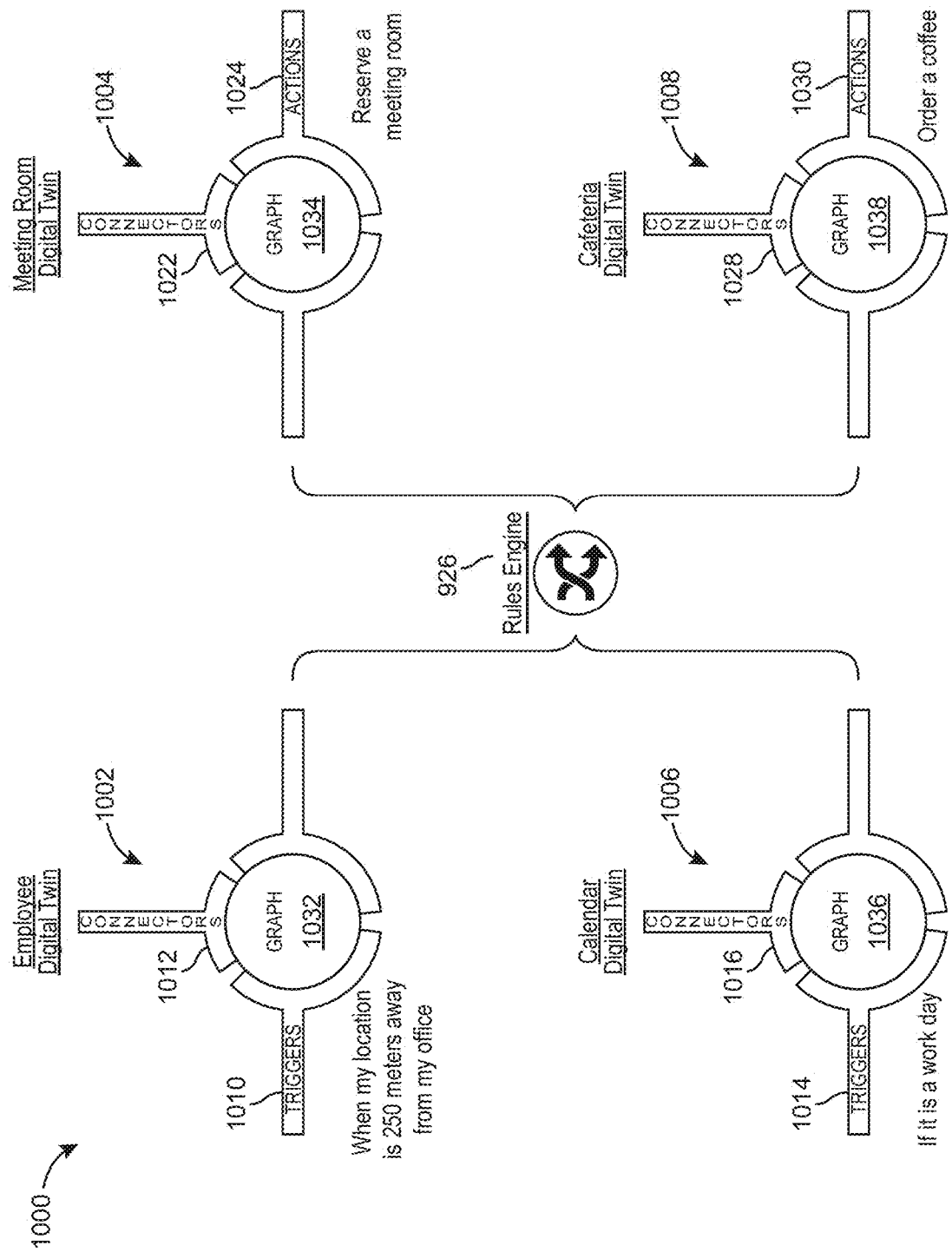
FIG. 10 is a block diagram of an employee digital twin, a calendar digital twin, a meeting room digital twin, and a cafeteria digital twin that have triggers and actions that are interconnected, according to an exemplary embodiment.

Referring now to FIG. 10, a system 1000 including an employee digital twin 1002, a calendar digital twin 1006, a meeting room digital twin 1004, and a cafeteria digital twin 1008 that have triggers and actions that are interconnected is shown, according to an exemplary embodiment. The system 1000 includes a solution digital twin for an employee, a meeting room, a cafeteria, and a calendar. In the system 1000, an employee digital twin 1002 and a calendar digital twin 1006 cause one or more associated digital twins, a meeting room digital twin 1004 and a cafeteria digital twin 1008 to execute. In FIG. 10, the state of the digital twins 1002 and 1006 are provided to the digital twins 1004 and 1008 as conditions for the triggers 1020 and 1026. The calendar digital twin 1006 can include a connector 1016, the meeting room digital twin can include a connector 1022, and the cafeteria digital twin 1008 can include a connector 1028 for ingesting information into the graphs 1034-1038.

In FIG. 10, the employee digital twin 1002 includes a graph 1032, the calendar digital twin 1006 includes a graph 1036, the meeting room digital twin 1004 includes a graph 1034, and the cafeteria digital twin 1008 includes a graph 1038. The graphs 1032-1038 can be the same graphs and/or different graphs and can be the same as, or similar to, the graph 529.

The employee digital twin 1002 can generate an "occupant near office" indication via the actions 1012 responsive to the trigger 1010 triggering when a particular occupant is a particular instance (e.g., 250 meters) from their office. The digital twin 1002 can identify the occupant, the occupant's office, and the location of the office through analyzing the nodes and/or edge of the graph 1032. The calendar digital twin 1006 determines, based on calendar data (e.g., calendar data stored in the graph 1036), whether it is a work day via the trigger 1014 (e.g., is a day Monday through Friday). Responsive to determining that it is a work day, the calendar digital twin 1006 generates an indication that it is a work day via the actions 1018.

The meeting room digital twin 1004 can receive the work day indication from the calendar digital twin 1006 and can receive the occupant near office indication from the employee digital twin 1002. The meeting room digital twin 1004 can take actions to reserve a meeting room via the actions 1024 responsive to the trigger 1020 indicating that the occupant is near their office and it is a work day. The cafeteria digital twin 1008 can receive the "occupant near office" indication from the employee digital twin 1002 and can receive the "it is a work day" indication from the calendar digital twin 1006. The cafeteria digital twin 1008 can trigger the ordering of a coffee for the occupant via the trigger 1030 responsive to the trigger 1026 being triggered.

Referring now to FIG. 11, a process 1100 of an agent executing a trigger rule and an action rule is shown, according to an exemplary embodiment. The process 1100 can be performed by the system 500 and/or components of the system 500. In some embodiments, the building data platform 100 can perform the process 1100. Furthermore, the process 1100 can be performed by any computing device described herein.

In step 1102, the building data platform 100 can store the AI agent 570 in a data structure. The AI agent 570 can include a trigger rule indicating a condition for executing an action rule and an action rule indicating an action to be performed responsive to the condition being met. In some embodiments, the model 576 includes, or can be replaced with, the trigger rule and the action rule. The trigger rule and the action rule can be logical statements and/or conditions that include parameter values and/or create an output action. The parameter values can, in some embodiments, be identified through a learning process, e.g., as described through FIGS. 12-22.

In step 1104, the AI agent 570 can receive information from at least one of a physical device and/or from the graph 529. The information can be generated by a physical device, e.g., the building subsystems 122. The building data platform 100 can, in some embodiments, receive the information from the physical device, ingest the information into the graph 529, and the AI agent 570 can read the information from the graph 529. In some embodiments, the AI agent 570 can check the information of the graph 529 against a trigger rule at a set period.

In step 1106, the agent 570 determines whether the information received in the step 1104 causes the condition to be met. The agent 570 can apply the information to the trigger rule to determine whether the trigger rule is triggered, i.e., the condition of the trigger rule being met.

In step 1108, the AI agent 570 can perform the action responsive to the condition being met by the information determined in step 1106. The action may cause a physical device to be operated or information be sent to another agent including another trigger rule and another action rule. In some embodiments, the action can be performed by executing the action rule of the AI agent 570. The action rule can perform an action based on one or more parameter value of the action rule. In some embodiments, the action output of the action rule can be sent directly to the physical device, e.g., the building subsystems 122. In some embodiments, the action output can be stored into the graph 529. Another operating component of the building data platform 100, e.g., the command processor 136, can read the action from the graph 529 can communicate a corresponding command to the building subsystems 122.

Referring generally to FIGS. 12-23, systems and methods for using artificial intelligence to determine triggers and actions for an agent is shown. The triggers can trigger autonomously based on received data and cause an action to occur. In some embodiments, multiple digital twins can interact with each other by identifying interrelationships between each other via the graph 529, e.g., a VAV digital twin could interact with an AHU digital twin responsive to identifying that a VAV represented by the VAV digital twin is related to an AHU represented by the AHU digital twin via the graph 529. The digital twins can in some embodiments, simulate the impact of triggers and/or actions to validate and learn triggers and/or actions.

In some embodiments, the building data platform 100 can perform q-learning (Reinforcement Learning) to train and/or retrain the triggers and/or actions of the agents. In some embodiments, the data used to train and/or retrain the triggers and/or actions can be simulated data determined by another digital twin.

One digital twin may have trigger conditions such as, "when the outside temperature is $x_0$," "when the inside humidity is x %," "when an AI-driven algorithm's threshold is reached," and "when it is a certain day of the week." In responsive to one or multiple triggers being met, the digital twin can perform actions (e.g., capabilities of a device either inherent and/or digital twin enhanced). The actions can include setting a setpoint to a value $x_0$. The actions can be to run a fan for x minutes. The actions can be to start an AI-driven energy saving schedule. The actions can be to change a mode status to an away status. In some embodiments, the building data platform 100 can user other digital twins to simulate a reward for various values of the triggers and/or actions. The reward can be optimized to determine values for the parameters of the triggers and/or actions.

In some embodiments, allowing the digital twin to learn and adjust the parameters of the triggers and/or rules allows the digital twin to optimize responses to internal and/or external events in real-time. In some embodiments, the digital twin performs operations with the correlation of contextual relationships to provide spatial intelligence. In some embodiments, the digital twin allows for AI-based self-learning solutions to operate on top of the digital twin. The digital twin can capture comprehensive data that drives rich analytics for security, compliance, etc. In some embodiments, the digital twin can enable and perform simulations.

In some embodiments, the building data platform 100 can identify events and/or event patterns if the building data platform 100 identifies a pattern that suggests a trigger and/or action should be updated. For example, if the building data platform 100 identifies a pattern occurring in a building, the building data platform 100 can set triggers and/or actions in digital twins to allow the pattern to occur automatically. For example, if a user closes their blinds at 5:00 P.M. regularly on weekdays, this could indicate that the user desires the blinds to be closed at 5:00 P.M. each day. The building data platform 100 can set a blind control digital twin to trigger a blind closing action at 5:00 P.M. each day.

In some embodiments, an agent of a digital twin can predict an inference in the future indicating that some action should be performed in the future. The building data platform 100 can identify that the action should be performed in the future and can set up a flow so that a prediction of one digital twin can be fed into another digital twin that can perform the action.

Referring now to FIG. 12, a system 1200 of a trigger rule 1202 of a thermostat digital twin where parameters of the trigger rule 1202 are trained is shown, according to an exemplary embodiment. In some embodiments, the system 1200 can implement a model that rewards triggers and/or actions of the thermostat digital twin using a neural network that is trained from data aggregated from a related digital twin of the thermostat digital twin, an air handler unit digital twin.

The building data platform 100 can perturb parameters, $\varepsilon_1$ and $\varepsilon_2$ of the trigger rule 1202 of the thermostat digital twin. The trigger rule 1202 may be that if a number of occupants is greater than $\varepsilon_1$ and a zone temperature is less than $\varepsilon_2°$ C. the rule is triggered and a corresponding action be performed. The corresponding action can be to increase a supply air temperature setpoint of an AHU to 22° C. The perturbation of the parameters can be increasing or decreasing the parameters in set amounts from existing values. The perturbation of the parameters can be selecting a space of values for the parameters and/or randomizing the parameters and/or parameter space.

With the perturbed values for $\varepsilon_1$ and $\varepsilon_2$, the AHU digital twin 1204 can simulate the state of the AHU via the AHU digital twin 1204 for various conditions of occupant number and zone temperature. The result of the various states of the AHU digital twin 1204. The simulation can be performed by the AI agent 570 via the model 576. The output of the model 576 can be the simulated states, e.g., timeseries 566.

The building data platform 100 can analyze the states produced by the AHU digital twin 1204 to determine energy and comfort results from the states of the AHU digital twin 1204. For example, an energy score can be generated for each state. For example, a power consumption level can be determined for each state. Similarly, a comfort violation score can be determined for each state. The comfort violation can indicate whether or not a temperature, humidity, or other condition of a physical space controlled by the AHU would be uncomfortable for a user (e.g., go below or above certain levels).

The building data platform 100 can generate accumulated training data. The accumulated training data can include the values of the parameters $\varepsilon_1$ and $\varepsilon_2$, the state of the AHU digital twin 1204 for each value of the parameters, and the energy score and comfort violation score for each state. In some embodiments, the triggers and/or actions that can be recommended for the thermostat digital twin can be determined by observing the responses of other digital twins on perturbed thresholds of existing triggers and/or actions.

The building data platform 100 can generate neural networks 1210 for predicting an energy score based on the parameters $\varepsilon_1$ and $\varepsilon_2$. Furthermore, the neural networks 1210 can indicate a comfort violation score for the parameters $\varepsilon_1$ and $\varepsilon_2$. The neural networks 1210 can be trained by the building data platform 100 based on the accumulated training data 1208.

Based on the trained neural network models 1210, the building data platform 100 can determine optimal values for the parameters $\varepsilon_1$ and $\varepsilon_2$. The building data platform 100 can search a space of potential values for $\varepsilon_1$ and $\varepsilon_2$ that consider predicted energy scores and/or comfort violation scores predicted by the trained neural network models 1210. The optimization can be the relation 1400 shown in FIG. 14. The optimization 1212 performed by the building data platform 100 can be a method of computing the optimal threshold of a trigger conditions using the neural network models 1210 of rewards (e.g., energy and comfort) and solving constrained optimization model. Similarly, the optimization 1212 performed by the building data platform 100 to determine the optimal threshold of action commands using the neural network models 1210 of rewards and solving constrained optimization.

In some embodiments, the optimal values for the parameters found by the building data platform 100 can be presented to a user for review and/or approval via a user interface, e.g., via the user device 176. In some embodiments, the recommendations produced by the building data platform 100 through the components 1202-1212 can be restricted by only looking at state/value changes of digital twins that are nearest neighbors in the graph 529, e.g., two nodes are directed related by one edge, e.g., a thermostat node for the thermostat digital twin is directed to an AHU node for the AHU digital twin 1204. In some embodiments, the building data platform 100 can use spatial correlation to assume contextual relationship between assets that can affect each other's attribute states/values.

Referring now to FIG. 13, a process 1300 for identifying values for the parameters of the trigger rule 1202 of FIG. 12 is shown, according to an exemplary embodiment. The process 1300 can be performed by the building data platform 100 and/or any component of the building data platform 100. The process 1300 can be performed by the system 500 and/or components of the system 500. Furthermore, the process 1300 can be performed by any computing device described herein.

In step 1302, the building data platform 100 can perturb a thermostat digital twin (e.g., the thermostat digital twin rule 1202) with various value for thresholds and/or other parameters, E. The result of the perturbed parameters can result in various states, s. The states can be states predicted by the thermostat digital twin or another digital twin that operates based on the thresholds and/or parameters ε, e.g., the AHU digital twin 1204. The perturbations and simulated states can result in pairs (S, ε). The pairs can be used to determine feedback for energy and/or comfort, e.g., (E, C).

In step 1304, the building data platform 100 can build neural network models, e.g., the neural networks 1210 based on the data determined in step 1302. The neural networks 1210 can predict energy rewards as a function of the state and the parameters, e.g., E=f(s, ε). Furthermore, the neural networks 1210 can predict comfort rewards as a function of the state and the parameters, e.g., C=f(s, ε).

In step 1306, the building data platform 100 can determine a value for the parameter, E that minimizes a relation, $(\alpha_1 \cdot E + \alpha_2 \cdot C)$. The minimization is shown in relation 1400 of FIG. 14. The values of $\alpha_1$ and $\alpha_2$ can weigh the various rewards in the relation that is minimized, e.g., the energy reward and/or the comfort reward. In step 1308, the building data platform 100 can periodically repeat the steps 1302-1306. For example, the building data platform 100 can repeat the steps at a defined time period. In some embodiments, the building data platform 100 can compute rewards for the actions of the thermostat digital twin. If the rewards indicate that the thermostat digital twin need retraining, the building data platform 100 can repeat the steps 1302-1308.

Figure 15:
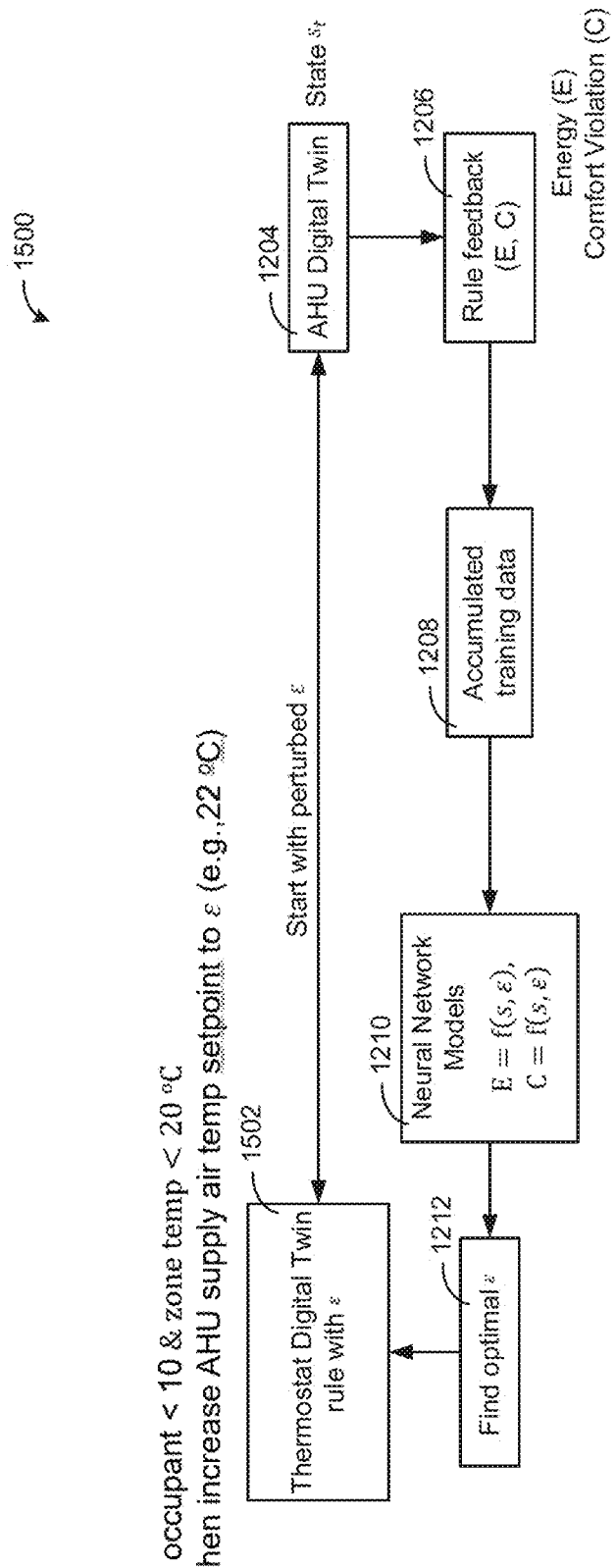
FIG. 15 is a block diagram of an action rule of a thermostat digital twin where parameters of the action rule is trained, according to an exemplary embodiment.

Referring now to FIG. 15, a system 1500 of components where an action rule 1502 of a thermostat digital twin is shown where parameters of the action rule 1502 are trained, according to an exemplary embodiment. The system 1500 can include similar and/or the same components of FIG. 14.

The process 1300 of FIG. 13 can be applied to the action rule 1502 to train the parameters of the action rule 1502.

The thermostat digital twin rule 1502 can be an action rule that if a trigger is met (e.g., the trigger 1402), the action rule 1502 executes to command the AHU digital twin 1204. The trigger rule may be to execute the action rule if an occupant count is greater than ten and a zone temperature is less than twenty degrees Celsius. The action rule 1502 may be to increase an AHU supply air temperature setpoint to a value, e.g., E. The value can, in some embodiments, be 22 degrees Celsius.

The building data platform 100 can predict states resulting from perturbed values of E by executing the AHU digital twin 1204 to simulate the states. The building data platform 100 can collect rule feedback 1206 to construct accumulated training data 1208. Furthermore, the building data platform 100 can train neural network models 1210 based on the accumulated training data 1208 and find optimal values for the parameter E based on the trained neural network models 1210

Figure 16:
FIG. 16 is lists of states of a zone and of an air handler unit that can be used to train the parameters of the trigger rule and the action rule of the thermostat digital twins of FIGS. 12-15, according to an exemplary embodiment.

Referring now to FIG. 16, a list 1600 and a list 1602 of states of a zone and of an air handler unit that can be used to train the parameters of the trigger rule and the action rule of the thermostat digital twins of FIGS. 12-15 is shown, according to an exemplary embodiment. The list 1600 includes states for a zone. The states can be zone temperature, zone humidity, outdoor air temperature, outdoor air humidity, zone occupancy, etc. These states can be predicted and/or determined based on a digital twin for a space based on perturbed parameter values for a trigger rule, an action rule, weather forecasts, etc. In this regard, the rule feedback 1206, in some embodiments, can be generated based on the digital twin for the space and used to tune the values of the parameters for the trigger rule 1402 and/or the action rule 1502.

The list 1602 includes states for an AHU. The states can be supply air temperature, supply air flow rate, return air temperature, return air flow rate, outdoor air flow rate, etc. These states can be predicted and/or determined based on a digital twin for an AHU (e.g., the AHU digital twin 1204) based on perturbed parameter values for a trigger rule, an action rule, etc. In this regard, the rule feedback 1206 in some embodiments, can be generated based on the digital twin for the AHU and used to tune the values of the parameters for the trigger rule 1402 and/or the action rule 1502.

Referring now to FIG. 17, a system 1700 of a trigger rule of a chemical reactor digital twin where parameters of a trigger rule are trained is shown, according to an exemplary embodiment. A reactor feed digital twin which may model the feed of a chemical reactor can include various trigger rules and/or action rules, e.g., the trigger rule 1702. The trigger rule 1702 can be that if a chemical concentration of a first chemical A is less than $\varepsilon_1$ (e.g., 10 g/l) and a chemical concentration of a second chemical B is less than $\varepsilon_2$ (e.g., 20 g/l) then an action rule is triggered. The action rule may be increase a catalyst C feed amount to 300 g/s.

The building data platform 100 can perturb the values for the parameters $\varepsilon_1$ and $\varepsilon_2$ of the reactor feed digital twin trigger rule 1702 (e.g., pseudo-randomly, increasing and/or decreasing in a particular number of predefined increments, etc.). A chemical reactor digital twin 1704 can simulate a state of the chemical reactor for the various perturbed parameters $\varepsilon_1$ and $\varepsilon_2$. The building data platform 100 can determine a rule feedback 1706 for the state simulate by the chemical reactor digital twin 1704. The rule feedback 1706 can identify scores for production throughput (P) and chemical property (C).

The building data platform 100 can accumulate training data 1708. The accumulated training data 1708 can include the feedback 1706, the state simulated by the chemical reactor digital twin 1704, and/or the parameter values for $\varepsilon_1$ and $\varepsilon_2$. The building data platform 100 can train neural network models 1710 to predict production throughput and/or chemical property for the various parameter and/or state pairs, e.g., the state resulting from the parameters of the trigger rule 1702. The building data platform 100 can use the trained neural network models 1710 to identify optimal values for $\varepsilon_1$ and $\varepsilon_2$. In element 1712, the building data platform 100 can identify values for $\varepsilon_1$ and $\varepsilon_2$ that minimize the relation 1900 shown in FIG. 19. In some embodiment, the optimization can optimize production throughput and/or chemical property.

Referring now to FIG. 18, a process 1800 for identifying values for the parameters of the trigger rule of FIG. 17 is shown, according to an exemplary embodiment. The process 1800 can be performed by the building data platform 100 and/or any component of the building data platform 100. The process 1900 can be performed by the system 500 and/or components of the system 500. Furthermore, the process 1800 can be performed by any computing device described herein. The steps 1802-1808 can be the same as or similar to the steps 1302-1308. However, the steps 1802-1808 can be executed for a reactor digital twin and the reward for training the neural networks can be production throughput and chemical property.

In step 1802, the building data platform 100 can perturb a reactor digital twin 1704 with various values of a threshold E of a trigger rule 1702 with various values which cause the reactor digital twin to determine resulting states for the various values of the threshold, E. The states and the values for the threshold E can create state threshold pairs. The pairs can be used to determine feedback, e.g., production throughput and chemical property.

In step 1804, after some accumulation of feedback data, the building data platform 100 can build neural network models 1710 based on the pairs that predict production throughput and chemical property based on the values for the threshold E. In step 1806, the building data platform 100 can determine a value for the threshold E that maximizes a reward and/or minimizes a penalty. The building data platform 100 can minimize the relation 1900 of FIG. 19. In step 1808, the building data platform 100 can periodically retrain the values for the threshold E for the trigger rule 1702.

Figure 20:
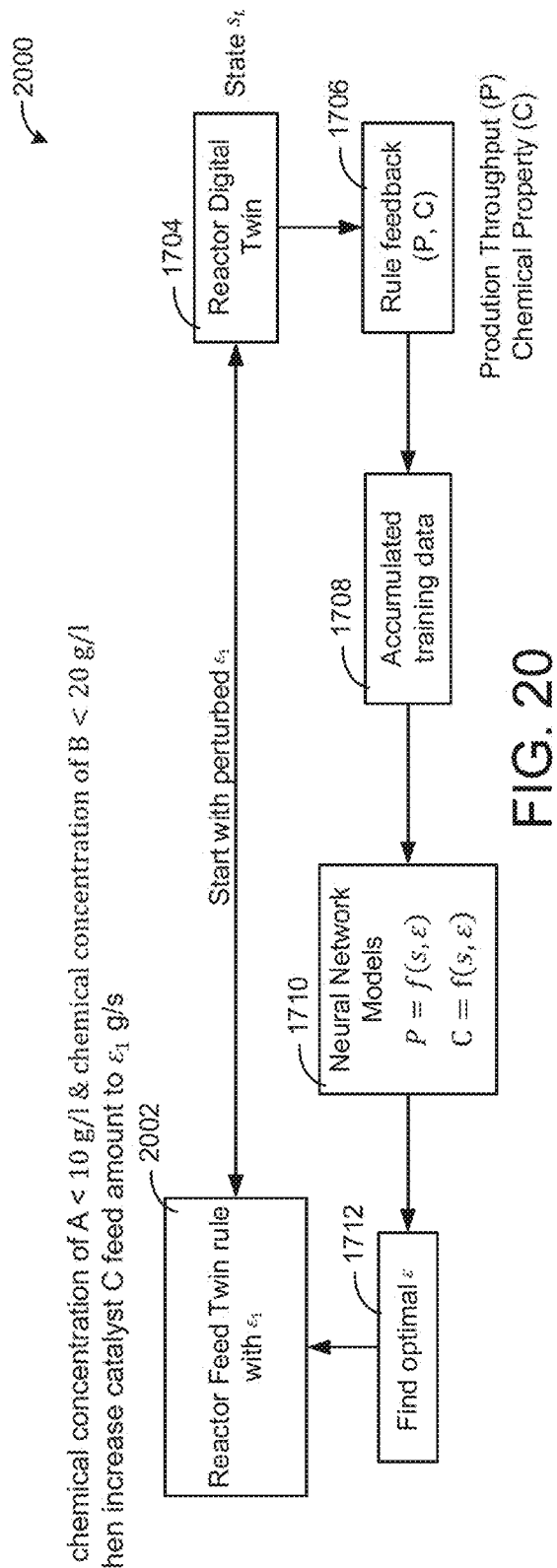
FIG. 20 is a block diagram of an action rule of a chemical reactor digital twin where parameters of the action rule are trained, according to an exemplary embodiment.

Referring now to FIG. 20, a system 2000 including an action rule 2002 of a chemical reactor digital twin where parameters of the action rule 2002 are trained is shown, according to an exemplary embodiment. The reactor feed twin rule 2002 can be an action rule to increase a catalyst C feed amount to $\varepsilon_1$ g/s in response to an trigger rule being triggered, e.g., the trigger rule 1702. The building data platform 100 can perturb the values of the parameter $\varepsilon_1$ and the reactor digital twin 1704 can predict states resulting from the perturbed parameter. The building data platform 100 can determine rule feedback 1706 and generate accumulated training data 1708 based on the rule feedback 1706. The building data platform 100 can train the neural network models 1710. Based on the neural network models 1710, the building data platform 100 can find optimal values for the parameter $\varepsilon_1$.

Figure 21:
FIG. 21 is lists of states of a reactor and a feed of a reactor that can be included in the trigger rule and the action rule of FIGS. 12-15, according to an exemplary embodiment.

Referring now to FIG. 21, a list 2100 and a list 2102 of states of a feed of a reactor and a reactor that can be included in the trigger rule and the action rule of FIGS. 12-15 are shown, according to an exemplary embodiment. The list 2100 includes states for a feed of a chemical reactor. The states can be reactants feed amount, catalysts feed amount, feed stream temperature, etc. These states can be predicted and/or determined based on a digital twin for a space based on perturbed parameter values for a trigger rule, an action rule, etc. In this regard, the rule feedback 1706 in some embodiments, can be generated based on the digital twin for the space and used to tune the values of the parameters for the trigger rule 1702 and/or the action rule 2002.

The list 2102 includes states for a chemical reactor. The states can be product concentration, cooling coil temperature, product temperature, etc. These states can be predicted and/or determined based on a digital twin for a chemical reactor (e.g., the reactor digital twin 1704) based on perturbed parameter values for a trigger rule, an action rule, etc. In this regard, the rule feedback 1706 in some embodiments, can be generated based on the digital twin for the chemical reactor and used to tune the values of the parameters for the trigger rule 1702 and/or the action rule 2002.

Figure 22:
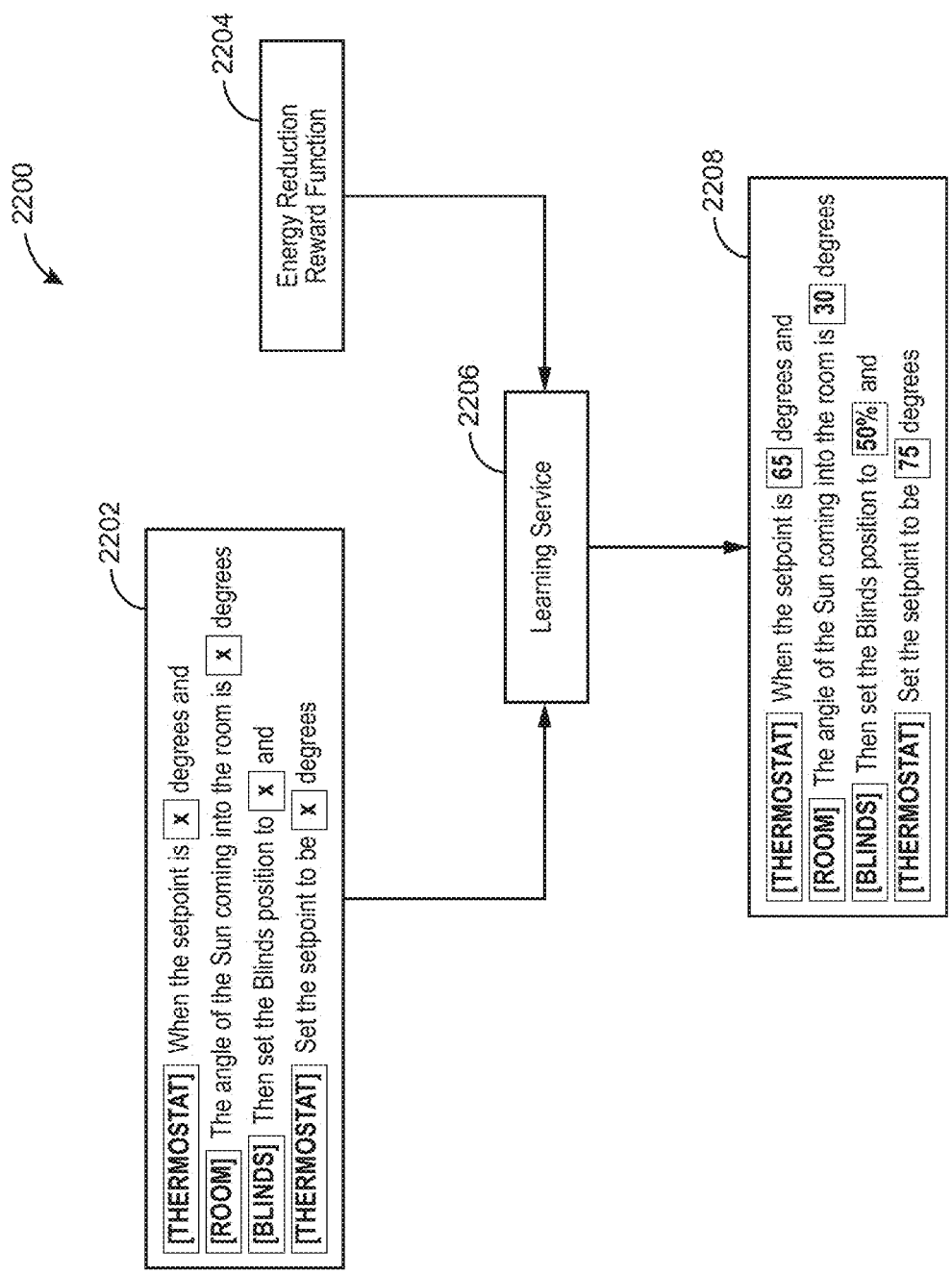
FIG. 22 is a block diagram of triggers and actions that can be constructed and learned for a digital twin, according to an exemplary embodiment.

Referring now to FIG. 22, a system 2200 where triggers and actions that can be constructed and learned for a digital twin is shown, according to an exemplary embodiment. Considering a building where a room in the building has a thermostat, the building data platform 100 can construct triggers and/or actions of an agent of a digital twin or the room. The triggers and/or actions can be determined with an energy reduction reward function 2204 by a learning service 2206. The energy reduction reward function 2204 can produce triggers and/or actions that have values that minimize energy usage.

In some embodiments, the building data platform 100 can search the graph 529 to identify information related to the space, e.g., related pieces of equipment, spaces, people, etc. For example, the building data platform 100 can identify which entities of the graph 529 are related and operate to affect each other. The building data platform 100 can identify which actions each entity can perform and/or what measurements each entity can make, e.g., by identifying related data nodes for each entity. The identified entities, measurements, and/or commands can be combined into the rule 2202 by the building data platform 100.

In some embodiments, the learning service 2206, which may be a component of the building data platform 100, can run a learning process with the rule 2202 and/or one or more reward functions (e.g., comfort reward function, carbon footprint reduction reward function, the energy reduction reward function 2204, etc.). The learning service 2206 can learn the rule 2208 from the rule 2202 and/or the energy reduction reward function 2204.

The learning service 2206 can run an optimization to determine combinations between measurements and actions triggered based on the measurements. The learning service 2206 can determine values for each measurement and/or action. Furthermore, the learning service 2206 can identify the relational operations for causing a trigger, e.g., equals to, greater than, less than, not equal to, etc. Furthermore, the learning service 2206 can identify action operations, e.g., increase by a particular amount, decrease by a particular amount, set an output equal to a value, run a particular algorithm, etc.

Figure 23:
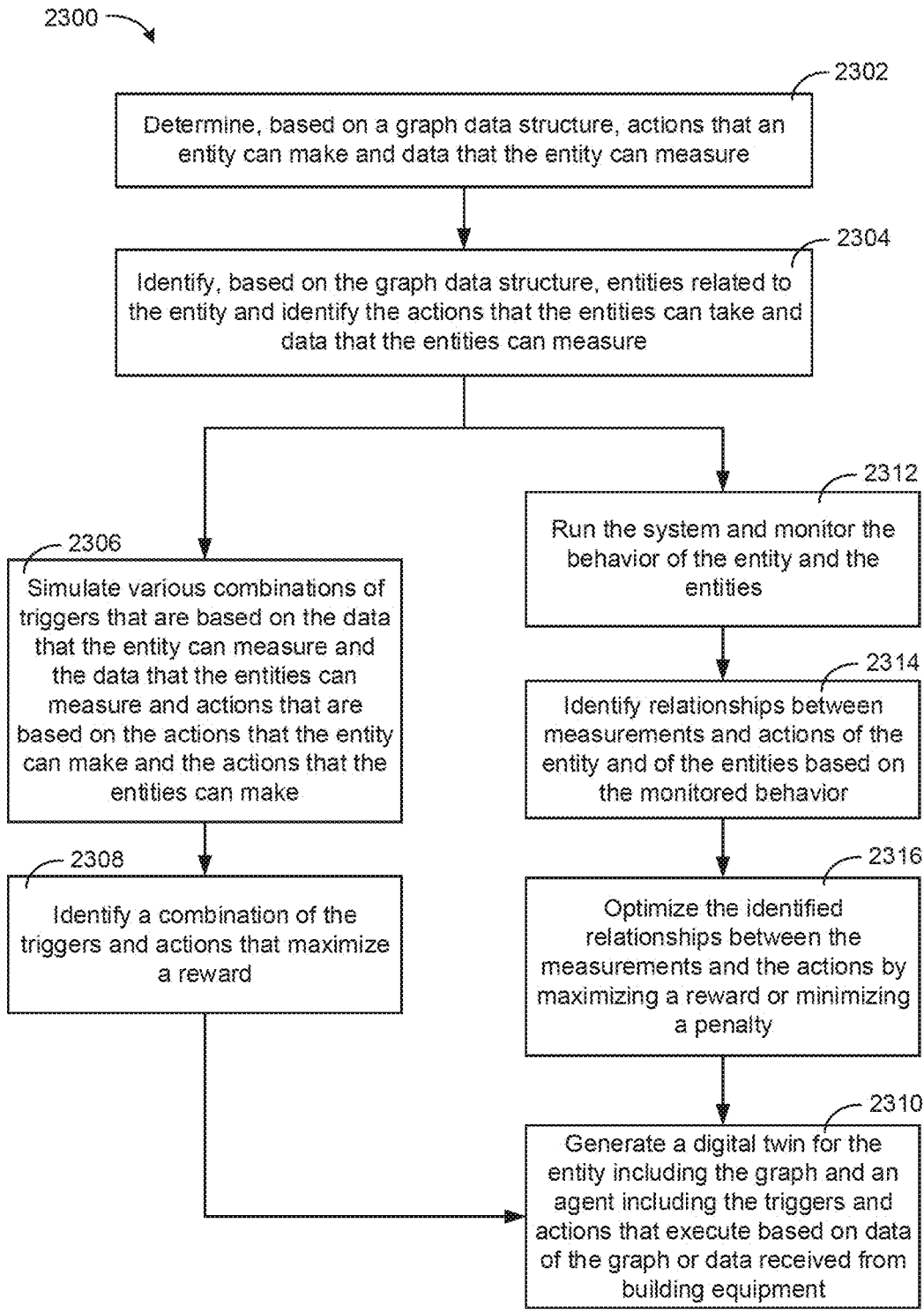
FIG. 23 is a flow diagram of a process for constructing triggers and actions for a digital twin, according to an exemplary embodiment.

Referring now to FIG. 23, a process 2300 for constructing triggers and actions for a digital twin is shown, according to an exemplary embodiment. In some embodiments, the process 2300 can be performed by the building data platform 100. In some embodiments, the process 2300 can be performed by the learning service 2206.

In step 2302, the building data platform 100 can determine actions that a particular entity can take and data that the entity can measure by analyzing a graph 529. The entity can be a thermostat, an air handler unit, a zone of a building, a person, a VAV unit, and/or any other entity. For example, if the entity is a thermostat the building data platform 100 could identify room temperature measurements for a thermostat and/or a cooling stage command, a heating stage command, a fan command, etc. that the thermostat can perform. Responsive to identifying data that the entity can measure, the building data platform 100 can generate a trigger condition based on the data type, e.g., when the temperature is equal to, less than, greater than, and/or not equal to some parameter value, trigger an action.

In step 2304, the building data platform 100 identifies, based on the graph 529, entities related to the entity and actions that the entities can take and data that the entities can measure. For example, if the entity is for a thermostat for a zone, the building data platform 100, could identify a shade control system for controlling a shade of the zone, an air handler unit that serves the zone, a VAV that serves the zone, etc. For example, the building data platform 100 can identify, based on the building graph 529, that a blinds node is associated with a zone node which the thermostat node is related to. The building data platform 100 can identify a list of actions that the entities can perform, e.g., setting blind position from 0% (fully open) to 100% (fully closed).

In some 2306, the building data platform 100 can simulate various combinations of triggers that are based on the data that the entity and/or entities can measure and actions that are based on the actions that the entity and/or entities can make. The building data platform 100 can simulate various combinations, trigger operations, action operations, and/or parameters.

In step 2308, the building data platform 100 can identify a combination of triggers and actions that maximizes a reward. The building data platform 100 can search the simulated combinations of triggers and/or actions to identify a trigger and/or action that maximizes a reward and/or minimizes a reward. In some embodiments, the building data platform 100 uses a policy gradient and value function instead of brute force to try out combinations of the triggers and/or actions in the steps 2306-2308.

In some embodiments, the building data platform 100 can identify the operations for the triggers and/or actions. For example, the operation could be comparing a measurement to a threshold, determining whether a measurement is less than a threshold, determining whether a measurement is greater than the threshold, determining whether the measurement is not equal to the threshold, etc.

In step 2310, the building data platform 100 can generate a digital twin for the entity. The entity can include (or reference) the graph 529 and include an agent that operates the triggers and/or actions. The triggers and/or actions can operate based on the graph 529 and/or based on data received building equipment, e.g., the building subsystems 122.

In step 2312, the building data platform 100 can run a building system of a building and monitor the behavior of the entity and entities of the building. In some embodiments, the building system can be the building subsystems 122. In step 2314, the building data platform 100 can identify relationships between the measurements and actions of the entity and/or the entities based on the monitored behavior. The building data platform 100 can discover existing relationships by identifying how the measurements are currently affecting actions based on the monitored behavior. In step 2316, the building data platform 100 can optimize the identified relationships between the measurements and the actions by maximizing a reward or minimizing a penalty.

Figure 24:
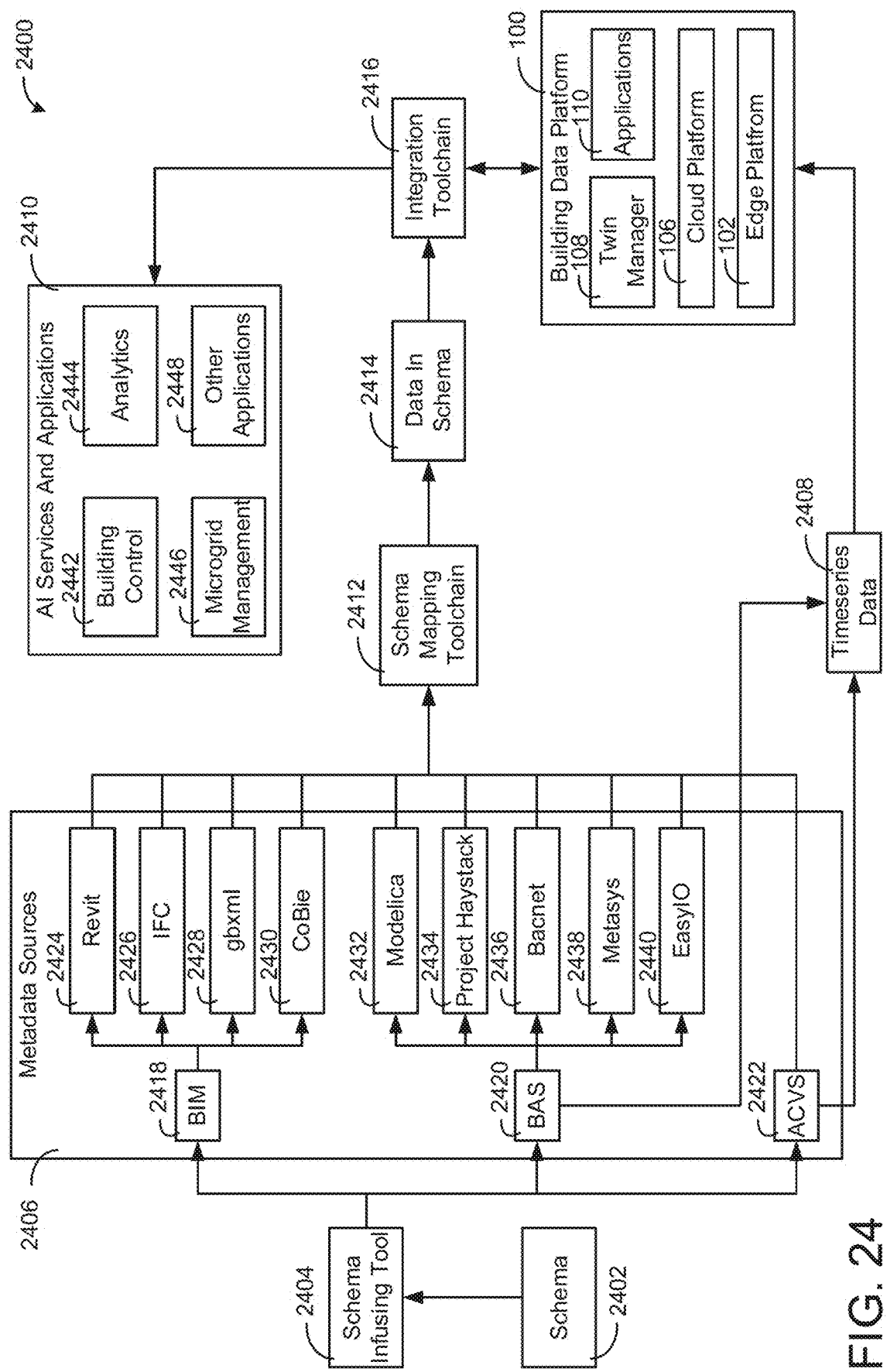
FIG. 24 is a block diagram of metadata sources being integrated with the building data platform of FIG. 1, according to an exemplary embodiment.

Referring now to FIG. 24, a system 2400 where metadata sources 2406 are integrated with the building data platform 100 is shown, according to an exemplary embodiment. The system 2400 can be implemented on one or more processing circuits, e.g., as instructions stored on one or more memory devices and executed on one or more processors. The memory devices and processors may be the same as or similar to the memory devices and processors described with reference to FIG. 1.

The system 2400 includes a schema infusing tool 2404. The schema infusing tool can infuse a particular schema, the schema 2402, into various systems, services, and/or equipment in order to integrate the data of the various systems, services, and/or equipment into the building data platform 100. The schema 2402 may be the BRICK schema, in some embodiments. In some embodiment, the schema 2402 may be a schema that uses portions and/or all of the BRICK schema but also includes unique class, relationship types, and/or unique schema rules. The schema infusing tool 2404 can infuse the schema 2402 into systems such as systems that manage and/or produce building information model (BIM) data 2418, building automation system (BAS) systems that produce BAS data 2420, and/or access control and video surveillance (ACVS) systems that produce ACVS data 2422. In some embodiments, the BIM data 2418 can be generated by BIM automation utilities 2501.

The BIM data 2418 can include data such as Revit data 2424 (e.g., Navisworks data), industrial foundation class (IFC) data 2426, gbxml data 2428, and/or CoBie data 2430. The BAS data 2420 can include Modelica data 2432 (e.g., Control Description Language (CDL) data), Project Haystack data 2434, Bacnet data 2436, Metasys data 2438, and/or Easy IO data 2440. All of this data can utilizing the schema 2402 and/or be capable of being mapped into the schema 2402.

The BAS data 2420 and/or the ACVS data 2422 may include timeseries data 2408. The timeseries data 2408 can include trends of data points over time, e.g., a time correlated set of data values each corresponding to time stamps. The timeseries data can be a timeseries of data measurements, e.g., temperature measurements, pressure measurements, etc. Furthermore, the timeseries data can be a timeseries of inferred and/or predicted information, e.g., an inferred temperature value, an inferred energy load, a predicted weather forecast, identities of individuals granted access to a facility over time, etc. The timeseries data 2408 can further indicate command and/or control data, e.g., the damper position of a VAV over time, the setpoint of a thermostat over time, etc.

The system 2400 includes a schema mapping toolchain 2412. The schema mapping toolchain 2412 can map the data of the metadata sources 2406 into data of the schema 2402, e.g., the data in schema 2414. The data in schema 2414 may be in a schema that can be integrated by an integration toolchain 2416 with the building data platform 100 (e.g. ingested into the databases, graphs, and/or knowledge bases of the building data platform 100) and/or provided to the AI services and applications 2410 for execution).

The AI services and applications 2410 include building control 2442, analytics 2444, microgrid management 2446, and various other applications 2448. The building control 2442 can include various control applications that may utilize AI, ML, and/or any other software technique for managing control of a building. The building control 2442 can include auto sequence of operation, optimal supervisory controls, etc. The analytics 2444 include clean air optimization (CAO) applications, energy prediction model (EPM) applications, and/or any other type of analytics.

Figure 25:
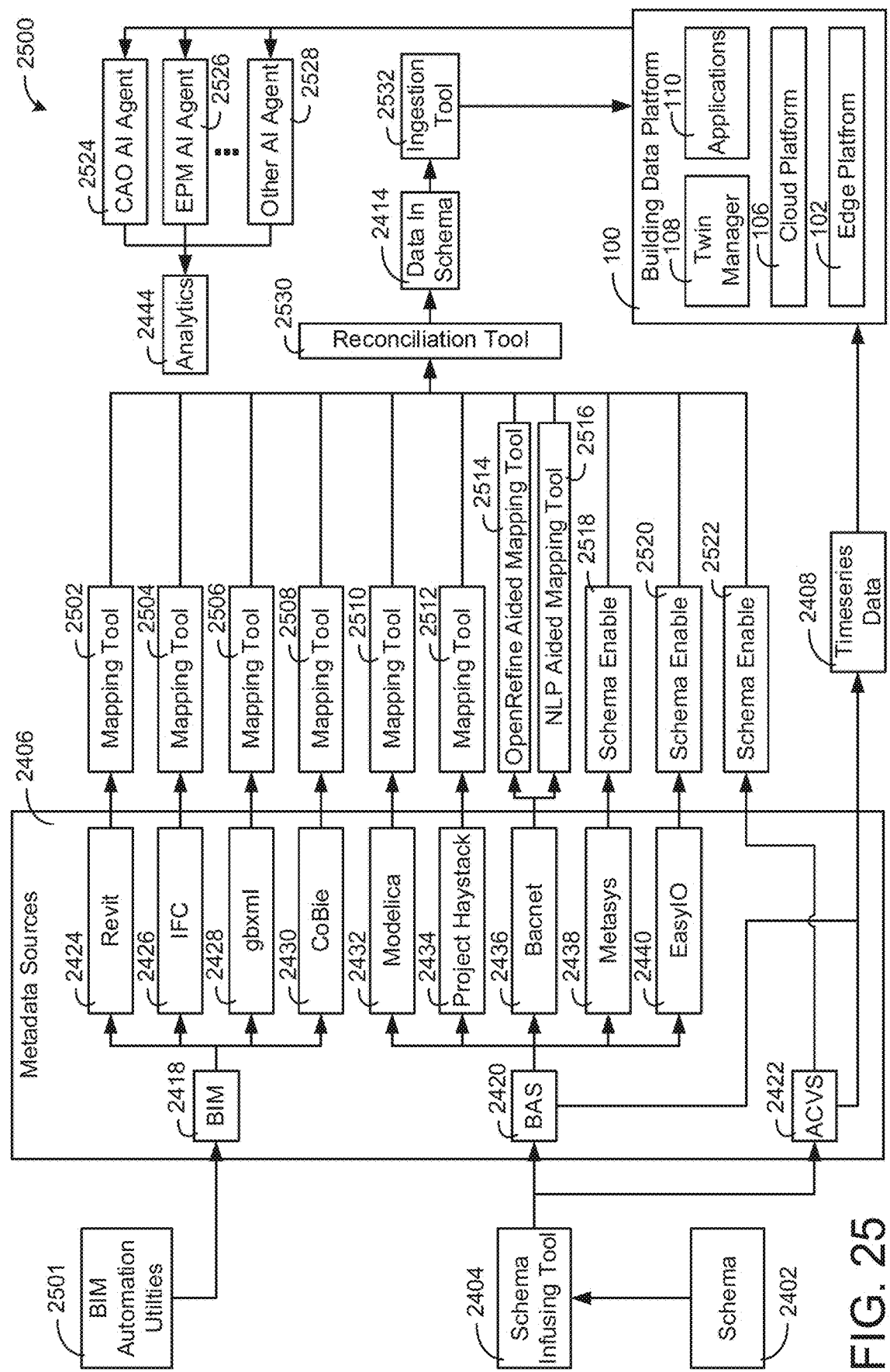
FIG. 25 is another block diagram of metadata sources being integrated with the building data platform of FIG. 1 and including AI agents, according to an exemplary embodiment.

Referring now to FIG. 25, a system 2500 including metadata sources 2406 being integrated with the building data platform 100 and including AI agents is shown, according to an exemplary embodiment. The system 2500 can be implemented on one or more processing circuits, e.g., as instructions stored on one or more memory devices and executed on one or more processors. The memory devices and processors may be the same as or similar to the memory devices and processors described with reference to FIG. 1.

The system 2500 includes various tools for converting the metadata sources 2406 into the data in schema 2414. Various mapping tools 2502-2512 can map data from an existing schema into the schema 2402. For example, the mapping tools 2502-2512 can utilize a dictionary that provides mapping rules and syntax substitutions. In some embodiments, that data sources can have the schema 2402 activated, e.g., schema enable 2518-2522. If the schema 2402 is enabled for a Metasys data source, an easy 10 data source, or an ACVS data sources, the output data by said systems can be in the schema 2402. Examples of schema mapping techniques can be found in U.S. patent application Ser. No. 16/663,623 filed Oct. 25, 2019, U.S. patent application Ser. No. 16/885,968 filed May 28, 2020, and U.S. patent application Ser. No. 16/885,959 filed May 28, 2020, the entireties of which are incorporated by reference herein.

For the EasyIO data 2440, the EasyIO controller objects could be tagged with classes of the schema 2402. For the Revit data 2424, the metadata of a REVIT model could be converted into the schema 2402, e.g., into a resource description format (RDF). For the Metasys data 2438, Metasys SCT data could be converted into RDF. An OpenRefine aided mapping tool 2514 and/or a natural language aided mapping tool 2516 could perform the schema translation for the Bacnet data 2436.

The schema data output by the tools 2502-2522 can be provided to a reconciliation tool 2530. The reconciliation tool 2530 can be configured to merge complementary or duplicate information and/or resolve any conflicts in the data received from the tools 2502-2522. The result of the reconciliation performed by the reconciliation tool 2530 can be the data in schema 2414 which can be ingested into the building data platform 100 by the ingestion tool 2532. The ingestion tool 2532 can generate and/or update one or more graphs managed and/or stored by the twin manager 108. The graph could be the graphs described with reference to FIGS. 1-5 and further the graph shown in FIG. 26.

The system 2500 includes agents that perform operations on behalf of the AI services and applications 2410. For example, as shown in the system 2500, the analytics 2444 are related to various agents, a CAO AI agent 2524, an EPM AI agent 2526, and various other AI agents 2528. The agents 2524-2528 can receive data from the building data platform 100, e.g., the data that the ingestion tool 2532 ingests into the building data platform 100, and generate analytics data for the analytics 2444.

Figure 26:
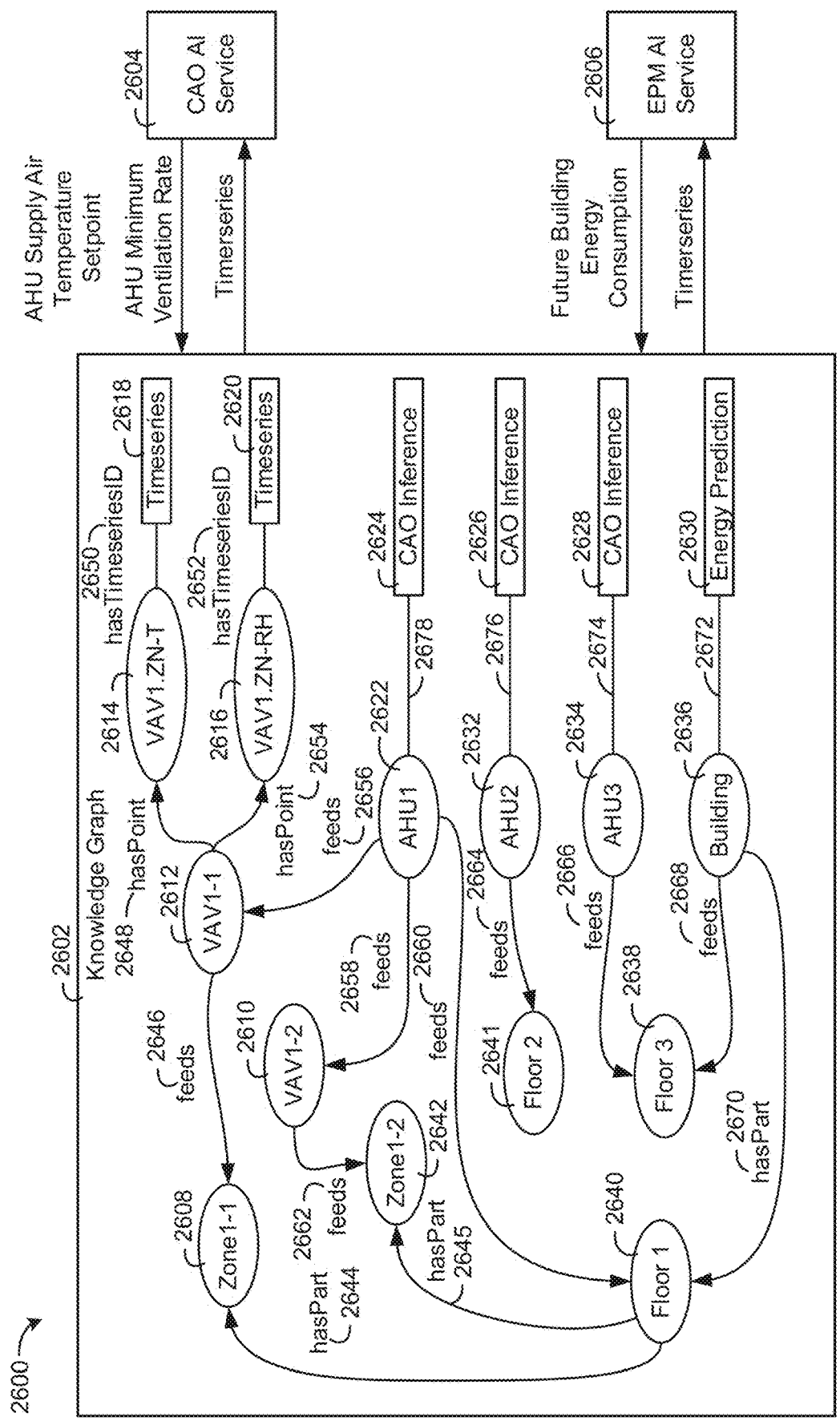
FIG. 26 is a block diagram of a system where a clean air optimization (CAO) AI service 2604 and an energy prediction model (EPM) AI service operate to make inferences and predictions based on data of a knowledge graph is shown, according to an exemplary embodiment.

Referring now to FIG. 26, a system 2600 where a clean air optimization (CAO) AI service 2604 and an energy prediction model (EPM) AI service 2606 operate to make inferences and predictions based on data of a knowledge graph 2602 is shown, according to an exemplary embodiment. The knowledge graph 2602 includes various nodes and edges. The nodes may be the nodes 2608-2642. The edges may be the edges 2644-2678.

The nodes may represent various entities of a building and/or buildings. The entities may be a campus, a building, a floor, a space, a zone, a piece of equipment, a person, a control point, a data measurement point, a sensor, an actuator, telemetry data, a piece of timeseries data, etc. The edges 2644-2678 can interrelate the nodes 2608-2642 to represent the relationships between the various entities of the building. The edges 2644-2678 can be semantic language based edges 2644-2678. The edges can include words and/or phrases that represent the relationship. The words and/or phrases can include at least one predicate, in some cases.

The knowledge graph 2602 includes a building node 2636 representing a building. The building can include floors, represented by the building node 2636 being related to a floor 1 node 2640 via a "hasPart" edge 2670 and the building node 2636 being related to a floor 3 node 2638 via a "feeds" edge 2668. The building includes an energy prediction, e.g., a value or a timeseries of values indicating energy usage of the building. This can be represented by the building node 2636 being related to an energy prediction node 2630 via the edge 2672.

The floor 1 includes zones, indicated by the floor 1 node 2640 being related to a zone1-1 node 2608 via a "hasPart" edge 2644 and the floor 1 node 2640 being related to a zone1-2 node 2642 via a "hasPart" edge 2645. Furthermore, the floor 1 can be fed by a particular AHU, AHU1. This is indicated by an AHU1 node 2622 being related to the floor 1 node 2640 via the "feeds" edge 2660. The zone1-2 can include a VAV1-2 that feeds air to it. This can be indicated by the VAV1-2 node 2610 being related to the zone1-2 node 2642 by the "feeds" node 2662. The AHU1 can feed the VAV1-2, indicated by the AHU1 node 2622 being related to the VAV1-2 node 2610 by the "feeds" edge 2658.

An AHU 3 can feed air to the floor 3, indicated by the "AHU3" node 2634 being related to the "floor 3" node 2638 by the "feeds" edge 2666. The "AHU3" node 2634 is related to a CAO inference 2628 via an edge 2674 representing that the AHU has a clean air optimization inference that could be determined by the CAO AI service 2604. The knowledge graph 2602 includes an AHU2 node 2632. The AHU2 2632 is related to a floor 2 node 2641 via a "feeds" edge 2664 indicating that the AHU2 feeds air to the floor 2. The AHU2 node 2632 is related to a CAO inference 2626 via the edge 2676. The CAO inference 2626 can indicate an inference made by the CAO AI service 2604 for the AHU2. The AHU1 2622 is related to a CAO inference 2624 via edge 2678. The CAO inference 2624 can indicate a clean air optimization inference made by the CAO AI service 2604 for the AHU1.

The knowledge graph 2602 includes a VAV1-1 node 2612 indicating a VAV1-1. The VAV1-1 node 2612 is related to the zone1-1 node 2608 via a "feeds" edge 2646 indicating that the VAV1-1 feeds air to the zone1-1. The AHU1 can feed air to the VAV1-1 indicated by the AHU1 node 2622 being related to the VAV1-1 node 2612 via the "feeds" edge 2656. The VAV1-1 node 2612 includes various points, e.g., a zone temperature point (represented by the VAV1.ZN-T node 2614) and a zone relative humidity point (represented by the VAV1.ZN-RH node 2616). The VAV1-1 node 2612 is related to the VAV1.ZN-T node 2614 via the "hasPoint" edge 2648. The VAV1-1 node 2612 is related to the VAV1.ZN-RH node 2616 via the "hasPoint" edge 2654.

The VAV1.ZN-T point includes a timeseries node 2618 representing and/or storing a timeseries for the zone temperature, indicated by the timeseries node 2618 being related to the VAV1.ZN-T node 2614 via the "hasTimeseriesID" node 2650. The VAV1.ZN-RH point includes a timeseries node 2620 representing and/or storing a timeseries for the zone humidity, indicated by the timeseries node 2620 being related to the VAV1.ZN-RH node 2616 via the "hasTimeseriesID" node 2652. In some embodiments, the timeseries node 2618 and the timeseries node 2620 are identifiers of a particular timeseries stored in a separate timeseries database, the identifier uniquely identifying the location of the timeseries so a system can consult the knowledge graph 2602 and use the identifiers to retrieve the timeseries data from the separate timeseries database.

The system 2600 includes a CAO AI service 2604. The CAO AI service 2604 can be configured to identify timeseries that it needs to execute on. For example, if the CAO AI service 2604 is executing for the AHU1, the CAO AI service 2604 could identify timeseries data linked to the AHU1. The CAO AI service 2604 can generate CAO inferences, e.g., can infer ideal settings for clean air. The ideal settings could be an AHU supply air temperature setpoint, an AHU minimum ventilation rate, etc. The ideal settings can be ingested into the knowledge graph 2602, e.g., as the CAO inferences 2624-2630.

In some embodiments, the CAO AI service 2604 (or an agent for the CAO AI service 2604) operates on behalf of a particular entity, e.g., the AHU 1. The CAO AI service 2604 can generate inferences with data of the AHU 1, e.g., by identifying timeseries data of the AHU 1 by identifying timeseries nodes of the knowledge graph 2602 via an edge. The inferences can be ingested into the knowledge graph 2602 by generating a new node and/or adding an edge between the new node and the node of the AHU 1, AHU 1 node 2622. Similarly, the inferences can be added to the knowledge graph 2602 by updating an existing node related to the AHU 1 node 2622 via an existing edge. In some embodiments, the inferences of the CAO AI service 2604 can generate a recommendation, e.g., a control setting for improving or optimizing air quality, which can be reviewed and approved by a user via the user device 176.

The EPM AI service 2606 can generate energy predictions for various buildings, spaces, or devices of a building, e.g., entities of the knowledge graph 2602. For example, the EPM AI service 2606 could predict a future energy consumption level of the building 2636, e.g., a future energy demand. The energy prediction can be a node 2630 related to the building node 2636 via the edge 2672. In some embodiments, the EPM AI service 2606 can generate the energy prediction node 2630 responsive to generating the future building energy consumption and cause the node 2630 to include a value for the future building energy consumption. The node 2630 can be added to the graph 2602 and the edge 2672 can be generated by the EPM AI service 2606 and added between the building node 2636 and the energy prediction 2630.

In some embodiments, the energy prediction node 2630 already exists within the knowledge graph 2602. In this example, the EPM AI service 2606 can identify the energy prediction node 2630 by identifying an edge 2672 between the building 2636 and the energy prediction node 2630. The EPM AI service 2606 can then ingest the energy prediction into the node 2630.

Figure 27:
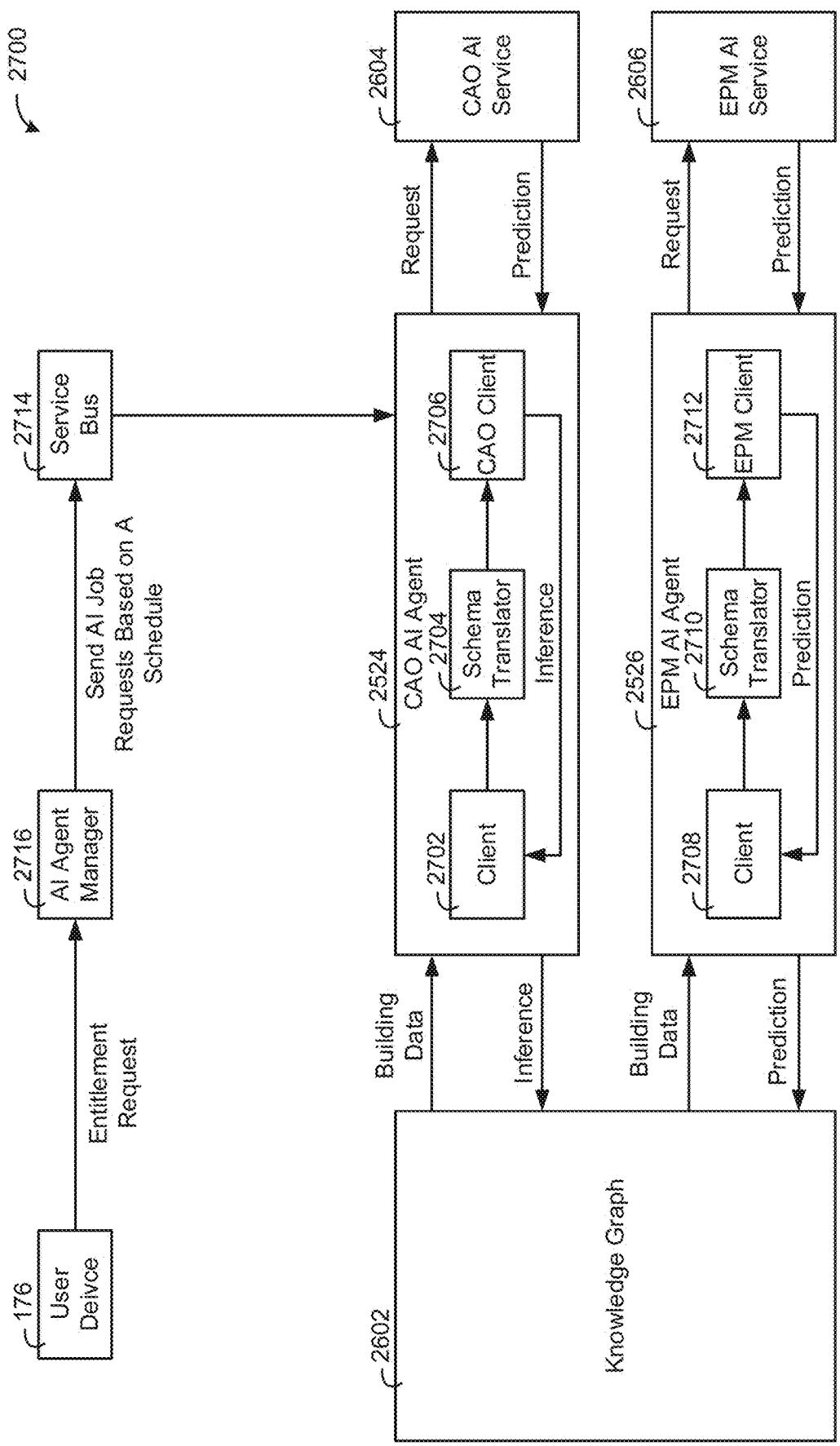
FIG. 27 is a block diagram of a CAO AI agent and an EPM AI agent operating against the knowledge graph of FIG. 26 to generate inferences and predictions, according to an exemplary embodiment.

Referring now to FIG. 27, a system 2700 including a CAO AI agent 2524 and an EPM AI agent 2526 operating against the knowledge graph 2602 to generate inferences and predictions is shown, according to an exemplary embodiment. The system 2700 can be implemented on one or more processing circuits, e.g., as instructions stored on one or more memory devices and executed on one or more processors. The memory devices and processors may be the same as or similar to the memory devices and processors described with reference to FIG. 1.

The CAO AI agent 2524 can operate on behalf of the CAO AI service 2604. Similarly, the EPM AI agent 2526 can operate on behalf of the EPM AI service 2606. Furthermore a service bus 2714 can interface with the agent 2524 and/or the agent 2526. A user can interface with the agents 2524-2526 via the user device 176. The user can provide an entitlement request, e.g., a request that the user is entitled to make and can be verified by the AI agent manager 2716. The AI agent manager 2716 can send an AI job request based on a schedule to the service bus 2714 based on the entitlement request. The service bus 2714 can communicate the AI job request to the appropriate agent and/or communicate results for the AI job back to the user device 176.

In some embodiments, the CAO AI agent 2524 can provide a request for generating an inference to the CAO AI service 2604. The request can include data read from the knowledge graph 2602, in some embodiments.

The CAO AI agent 2524 includes a client 2702, a schema translator 2704, and a CAO client 2706. The client 2702 can be configured to interface with the knowledge graph 2602, e.g., read data out of the knowledge graph 2602. The client 2702 can further ingest inferences back into the knowledge graph 2602. For example, the client 2702 could identify timeseries nodes related to the AHU1 node 2622, e.g., timeseries nodes related to the AHU1 node 2622 via one or more edges. The client 2702 can then ingest the inference made by the CAO AI agent 2524 into the knowledge graph 2602, e.g., add the CAO inference 2624 or update the CAO inference 2624.

The client 2702 can provide data it reads from the knowledge graph 2602 to a schema translator 2704 that may translate the data into a specific format in a specific schema that is appropriate for consumption by the CAO client 2706 and/or the CAO AI service 2604. The CAO client 2706 can run one or more algorithms, software components, machine learning models, etc. to generate the inference and provide the inference to the client 2702. In some embodiments, the client 2706 can interface with the EPM AI service 2606 and provide the translated data to the EPM AI service 2606 for generating an inference. The inference can be returned by the EPM AI service 2606 to the CAO client 2706.

The EPM AI agent 2526 can operate in a similar manner to the CAO AI agent 2524, in some embodiments. The client 2708 can retrieve data from the knowledge graph 2602 and provide the data to the schema translator 2710. The schema translator 2710 can translate the data into a readable format by the CAO AI service 2604 and can provide the data to the EPM client 2712. The EPM client 2712 can provide the data along with a prediction request to the CAO AI service 2604. The CAO AI service 2604 can generate the prediction and provide the prediction to the EPM client 2712. The EPM client 2712 can provide the prediction to the client 2708 and the client 2708 can ingest the prediction into the knowledge graph 2602.

In some embodiments, the knowledge graph 2602 includes data necessary for the inferences and/or predictions that the agents 2524 and 2526 generate. For example, the knowledge graph 2602 can store information such as the size of a building, the number of floors of the building, the equipment of each floor of the building, the square footage of each floor, square footage of each zone, ceiling heights, etc. The data can be stored as nodes in the knowledge graph 2602 representing the physical characteristics of the building. In some embodiments, the EPM AI agent 2526 makes the predictions based on the characteristic data of the building and/or physical areas of the building.

Figure 28:
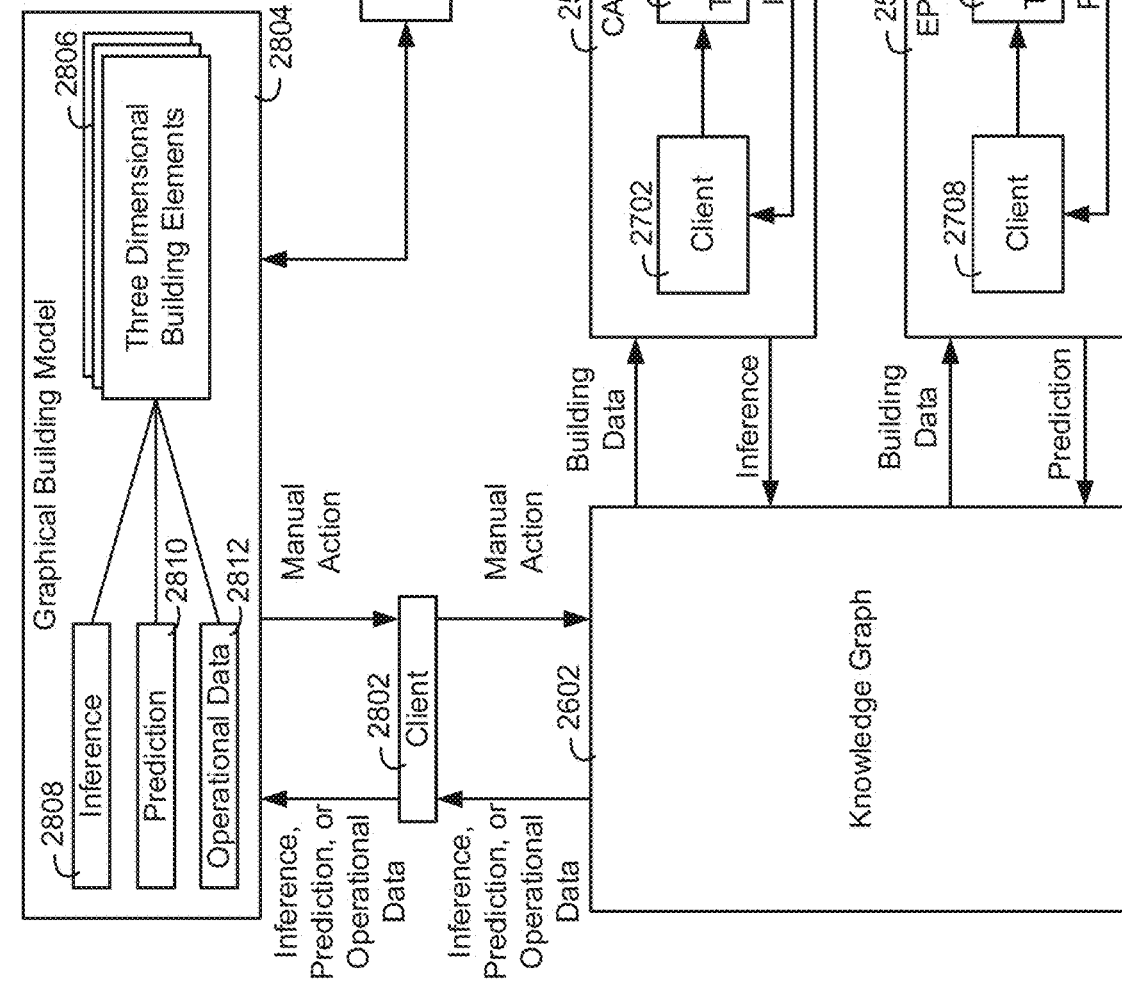
FIG. 28 is a block diagram of inferences and predictions of the CAO AI agent and the EPM AI agent being presented in a graphic interface, according to an exemplary embodiment.

Referring now to FIG. 28, inferences and/or predictions of the CAO AI agent 2524 and the EPM AI agent 2526 being presented in a graphic interface is shown, according to an exemplary embodiment. The system 2800 can be implemented on one or more processing circuits, e.g., as instructions stored on one or more memory devices and executed on one or more processors. The memory devices and processors may be the same as or similar to the memory devices and processors described with reference to FIG. 1.

The system 2800 includes a client 2802. The client 2802 can integrate with the knowledge graph 2602 and also with a graphical building model 2804 that can be rendered on a screen of the user device 176.

The client 2802 can retrieve information from the knowledge graph 2602, e.g., an inference generated by the CAO AI agent 2524, a prediction made by the EPM AI agent 2526, and/or operational data stored in the knowledge graph 2602. The client 2802 can ingest the values of the retrieved information into the graphical building model 2804 which can be displayed on the user device 176. In some embodiments, when a particular visual component is being displayed on the user device 176 for the virtual model 2804, e.g., a building, the corresponding information for the building can be displayed in the interface, e.g., inferences, predictions, and/or operational data.

For example, the client 2802 could identify a node of the building in the knowledge graph 2602, e.g., the building node 2636. The client 2802 could identify information linked to the building node 2636 via edges, e.g., the energy prediction 2630 related to the building node 2636 via edge 2672. The client 2802 can cause the energy prediction 2630 to be displayed in the graphical building model 2804.

In some embodiments, a user can provide input through the graphical building model 2804. The input may be a manual action that a user provides via the user device 176. The manual action can be ingested into the knowledge graph 2602 and stored as a node within the knowledge graph 2602. In some embodiments, the manual action can trigger one of the agents 2524-2526 causing the agent to generate an inference and/or prediction which is ingested into the knowledge graph 2602 and presented for user review in the model 2804.

In some embodiments, the agents 2524-2526 are the same as, or similar to, the agents described with reference to FIGS. 5-23. For example, the agents 2524-2526 combined with the knowledge graph 2602 can create a digital twin. In some embodiments, the agents 2524-2526 are implemented for a specific node of the knowledge graph 2602, e.g., on behalf of some and/or all of the entities of the knowledge graph 2602. In some embodiments, the digital twin includes trigger and/or actions as discussed with reference to FIGS. 5-23. In this regard, the agents can trigger based on information of the knowledge graph 2602 (e.g., building ingested data and/or manual commands provide via the model 2804) and generate inferences and/or predictions with data of the knowledge graph 2602 responsive to being triggered. The resulting inferences and/or predictions can be ingested into the knowledge graph 2602. The inferences and/or predictions can be displayed within the model 2804.

In some embodiments, the animations of the model 2804 can be based on the inferences and/or predictions of the agents 2524-2526. In some embodiments, charts or graphs can be included within the model 2804, e.g., charting or graphing timeseries values of the inferences and/or predictions. For example, if an inference is an inference of a flow rate of a fluid (e.g., water, air, refrigerant, etc.) through a conduit, the speed at which arrows moving through the virtual conduit can be controlled based on the inferred flow rate inferred by an agent. Similarly, if the model 2804 provides a heat map indicating occupancy, e.g., red indicating high occupancy, blue indicating medium occupancy, and green indicating low occupancy, an agent could infer an occupancy level for each space of the building and the color coding for the heat map of the model 2804 could be based on the inference made by the agent.

In some embodiments, the graphical building model 2804 can be a three-dimensional or two-dimensional graphical representation of the building. The graphical building model 2804 can be a building information model (BIM), in some embodiments. The BIM can be generated and viewed based on the knowledge graph 2602. An example of rendering graph data and/or BIM data in a user interface is described in greater detail in U.S. patent application Ser. No. 17/136, 752 filed Dec. 29, 2020, U.S. patent application Ser. No. 17/136,768 filed Dec. 29, 2020, and U.S. patent application Ser. No. 17/136,785 filed Dec. 29, 2020, the entirety of which is incorporated by reference herein.

In some embodiments, the graphical building model 2804 includes one or multiple three-dimensional building elements 2806. The three-dimensional building elements 2806 can form a building when combined, e.g., can form a building model of a building or a campus model of a campus. The building elements 2806 can include floors of a building, spaces of a building, equipment of a building, etc. Furthermore, each three-dimensional building element 2806 can be linked to certain data inferences 2808, predictions 2810, and/or operational data 2812. The data 2808-2812 can be retrieved from the knowledge graph 2602 for display in an interface via the user device 176.

Figure 29:
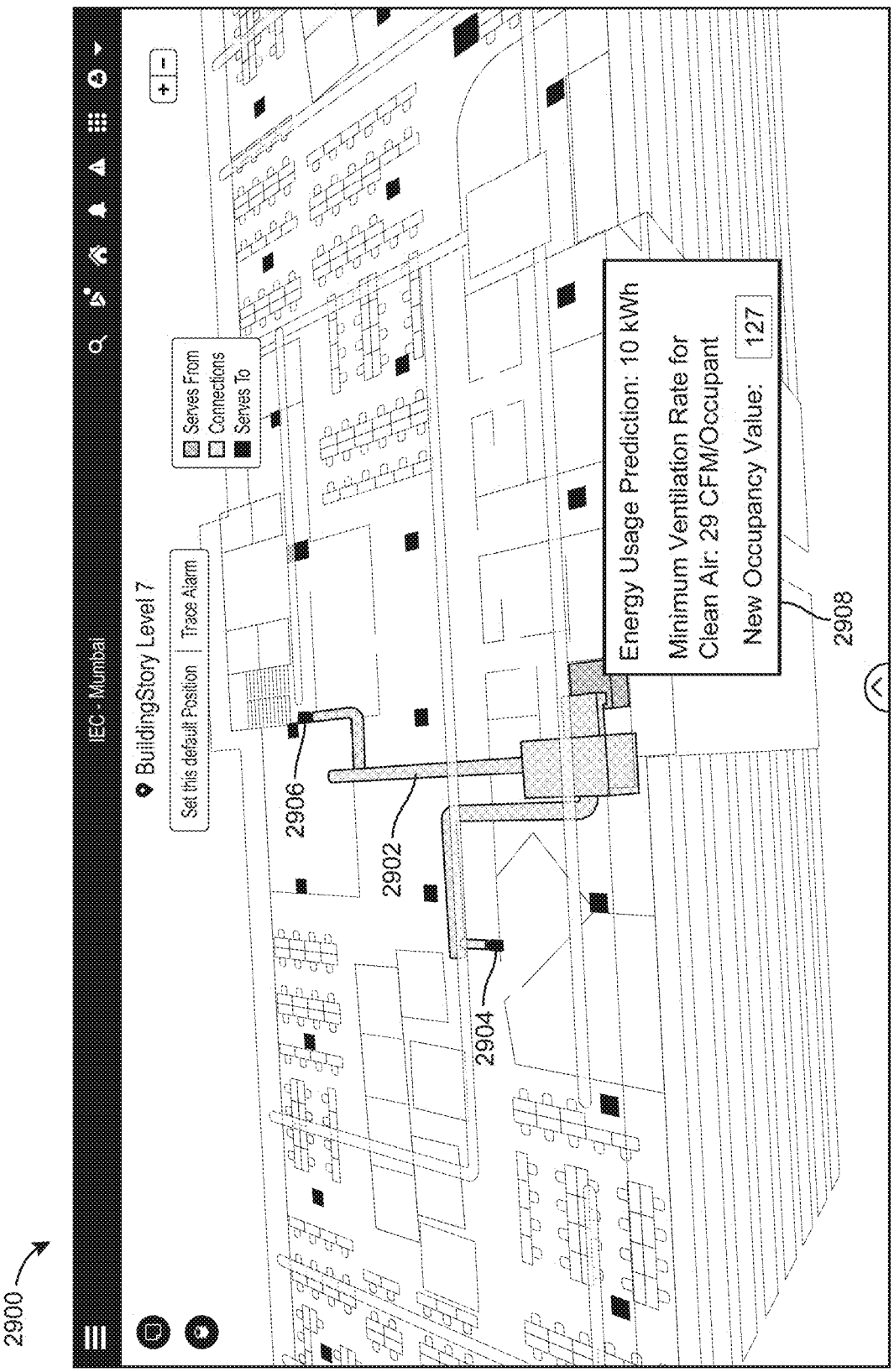
FIG. 29 is an example interface that shows inferences and predictions within a graphical model, according to some embodiments.

Referring now to FIG. 29, an interface 2900 that shows inferences and predictions within a three-dimensional model is shown, according to some embodiments. The interface 2900 provides a view of the graphical building model 2804. The graphical building model 2804 provides graphical representations of a building, floors of a building, rooms and zones of a building, equipment of the building, etc. The interface 2900 provides a three-dimensional graphical representation of the graphical building model 2804, e.g., the graphical building model 2804 may be a three-dimensional model in the example of FIG. 29.

In FIG. 29, a user interacts with a graphical element in the interface 2900, e.g., by clicking on, touching, or otherwise interacting with the AHU graphical element 2902. The AHU graphical element 2902 includes ducts and is connected to VAV elements, VAV element 2904 and 2906. Responsive to receiving an interaction with the AHU graphical element, the interface 2900 can display an element 2908 which can include operational data and/or inferenced and/or predicted data generated by a digital twin of the AHU and/or the building.

For example, the digital twin could be the knowledge graph 2602 combined with one or more agents, e.g., the CAO AI agent 2524 and/or the EPM AI agent 2526. The agents can generated inferred and/or predicted information for the AHU based at least in part on operational data stored in the knowledge graph 2602 (e.g., operational data of the AHU).

For example, the CAO AI agent 2524 could be configured to generate a minimum ventilation rate of the AHU, e.g., 29 CFM/occupant. The CAO AI agent 2524 can ingest the minimum ventilation rate into the knowledge graph 2602, e.g., into a node of the knowledge graph 2602 related by a relationship to a node for the AHU. The client 2802 can provide the minimum ventilation rate to the graphical building model 2804 which can be displayed in the element 2908 of the interface 2900. Similarly, EPM AI agent 2526 could generate the energy usage prediction for the AHU, e.g., 10 kWh. The energy prediction can be ingested into the knowledge graph 2602 and then provided to a user via the user interface 2900 in the element 2908.

In some embodiments, a user may provide an input to the interface 2900, e.g., a command, a manual action, a new data value, etc. The input can cause the digital twin to generate new inferences and/or predictions which can be ingested into the knowledge graph 2602 and then displayed in the interface 2900. In some embodiments, the input is a new occupancy value input via the element 2908. The new occupancy value can be ingested into the knowledge graph 2602 into a node related to a node for the AHU. The CAO AI agent 2524 can trigger (e.g., if it includes a trigger rule to execute based on a change in occupancy).

The CAO AI agent 2524 can re-compute the minimum ventilation rate based on the new occupancy value for clean air and can store the updated value in the knowledge graph 2602, thus updating the value displayed in the element 2908. Similarly, the energy usage displayed in the element 2908 could be reproduce by the EPM AI agent 2526.

Figure 30:
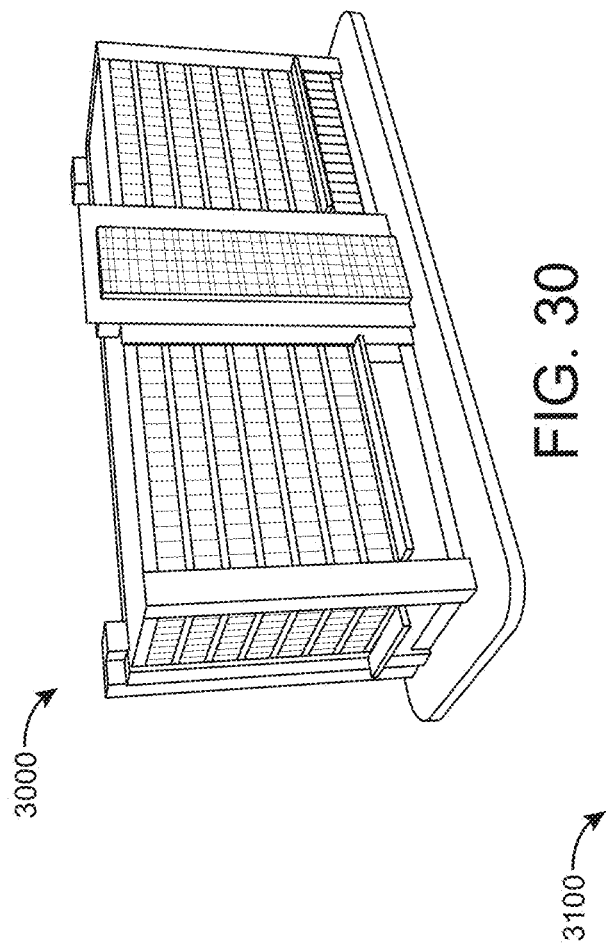
FIG. 30 is a schematic drawing of a three-dimensional graphical building, according to an exemplary embodiment.
Figure 31:
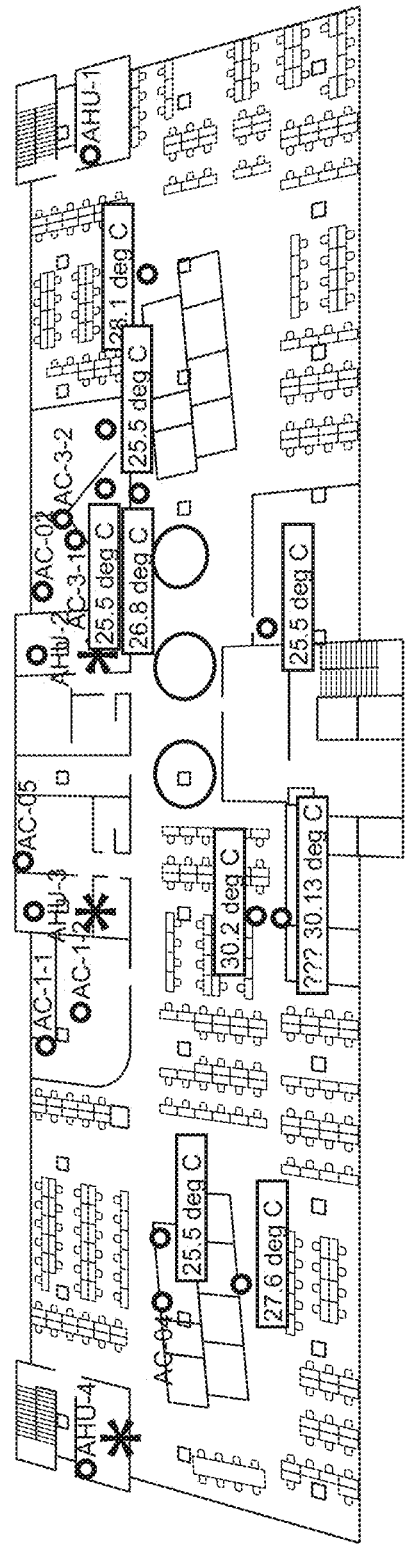
FIG. 31 is a schematic drawing of a floor of the three-dimensional graphical building of FIG. 30, according to an exemplary embodiment.

Referring generally to the FIGS. 30-31, systems and methods for displaying information derived by an AI agent in building models is shown, according to various exemplary embodiments. In some embodiments, the building models may be a two-dimensional or three-dimensional graphical representation of the building. In some embodiments, the building model can be a graphic representation of the building 3000 and/or a particular floor of the building 3000, e.g., floor 3100. In some embodiments, the building 3000, the floor 3100, and/or any of the other building or floor shown in FIGS. 32-33 can be rendered within a user interface and displayed on a display device of the user device 176. The various three-dimensional buildings and/or floors shown in FIGS. 31-44 can be the same as or similar to the graphical building model 2804 and/or any of the other graphic building models shown and described herein. The various graphical building models can all be displayed in a display device of the user device 176 and a user can interact with the building model viewing information of the graphical building models and/or navigating through various spaces and/or views of the graphical building model.

In some embodiments, past information and/or future predictions can be ingested into the knowledge graph 2602 (e.g., into a digital twin or twins). In this regard, past, present, and/or future information can be displayed and/or visualized within a graphical building model. Furthermore, the client 2802 can, in some embodiments, provide a recorder and/or playback element (e.g., a widget) that allows a user to view past, present, and/or future states and values of the building within the graphical representation of the building.

In some embodiments, actionable insights can be included within the graphical representation of the building. These actionable insights can aid a user in reviewing and understanding what issues may be affecting the building and what actions could be taken to resolve the issues. In some embodiments, the actionable insights can be acted on (e.g., approved and/or disapproved). The graphical representation of the building can further display the status of the actionable insights and/or results of implementing the actionable insights, e.g., if the actions resolved in the issues.

In some embodiments, the graphical representation of the building can include indications of alerts. Furthermore, the graphical representation of the building can indicate virtual zones for occupancy and/or monitoring of a group of individuals for a particular metric. In some embodiments, an integration can exist (e.g., the client 2802) that can integrate any AI service output into the graphic representation of the building. The client 2802 may abstract the integration and store a template/configuration for integrating information of the knowledge graph 2602 into the graphic representation of the building.

In some embodiments, the user interface can display entity data for various spaces, assets, solutions, people, etc. The entity data can be data collected and ingested into a digital twin and/or inferred, derived, and/or predicted information generated by an agent running against the digital twin. The data could be live telemetry flowing from various entities and attributes of the entities stored in the digital twin. In some embodiments, the entity data can be a predicted telemetry stored as an event stream with future timestamps for a space, asset, person, etc. in the digital twin. In some embodiments, the entity data can be actionable insight and/or recommendations with future timestamps for spaces, assets, people, etc. In some embodiments, the entity data can include actionable insights for present and/or future times for spaces, assets, and/or people of a digital twin. The actionable insights can have present timestamps and/or future timestamps. The entity data can further indicate an actionable insight status view indicating status of a space, asset, and/or solution after a particular recommendation is accepted. The status could indicate submitted, confirmed, applied, etc.

In some embodiments, information for addressing an infectious disease (e.g., COVID-19, influenza, smallpox, etc.) can be displayed within the graphic representation of the building. The information could be performance information, actionable information, indoor air quality, reproductive number, energy consumption, etc. The information can further indicate diagnosis information and/or actionable insights derived by an AI service for resolving an issue (fault, poor performance, etc.) for a space, piece of equipment, or user.

The graphic representation of the building 3000 can represent a building with settings, rooms, cabins rooms, AHUs, VAVs, ACs, etc. The graphical representation of the building 3000 can include the floor 3100. The building 3000 and/or the floor 3100 can be updated with information based on time-series data (e.g., zone temperatures, supply fan outputs, maximum supply air flows, etc.) received from a building management system managing and/or operating the rooms, AHUs, VAVs, ACs, etc. The timeseries data can be ingested into a digital twin of the building. An agent can operate against the digital twin to derive predictions or inferences, and display information within the graphical representation of the building 3000 based on the derived predictions or inferences.

Figure 32:
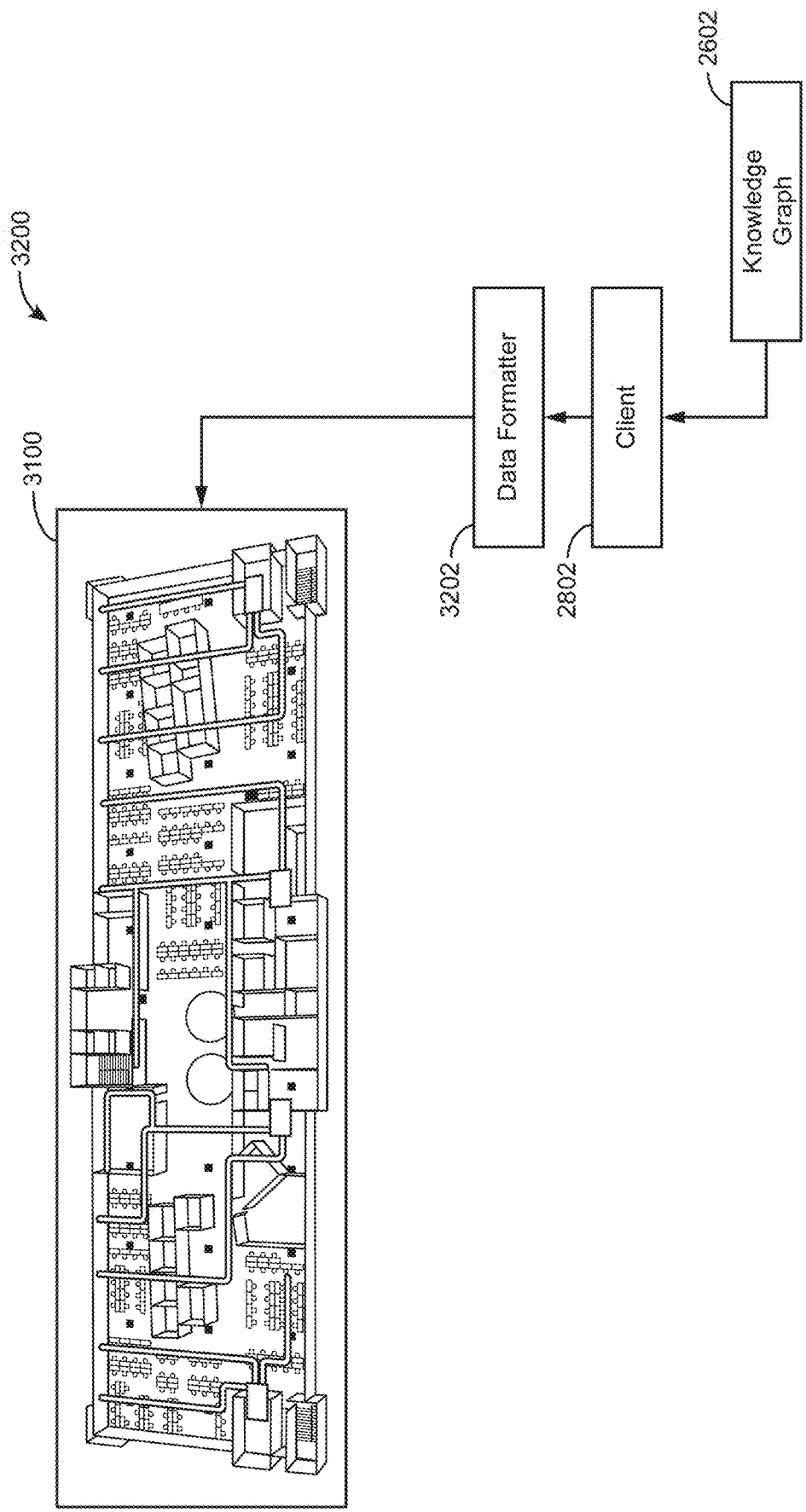
FIG. 32 is a block diagram of a system ingesting data of a knowledge graph into the floor of FIG. 31, according to an exemplary embodiment.

Referring now to FIG. 32, a system 3200 ingesting data of the knowledge graph 2602 into the floor 3100 is shown, according to an exemplary embodiment. The client 2802 can be configured to query the knowledge graph 2602 for inferences, predictions, current data values, historical values, etc. The queries can be made for the various entities (e.g., equipment, spaces, people, points, etc.) being viewed on the floor 3100 by a user via the user device 176. The data formatter 3202 can format the data queried from the knowledge graph 2602 into a format that can be displayed in the graphical floor 3100. In some embodiments, the data needs to be translated from a JSON format to a BIM format. The data formatter 3202 can further generate graphics and configure the display of the graphics on the floor 3100 based on the values queried from the knowledge graph 2602. The formatter 3202 can set color, flow animations, historical trends, shapes, sizes, etc. of various data elements. In some embodiments, a digital twin provided by the knowledge graph 2602 and/or agents that run against the knowledge graph 2602 can drive the three-dimensional visualization of the floor 3100. The digital twin can provide inferences recommendations and/or predictions for visual representation within the floor 3100.

Figures 33, 34:
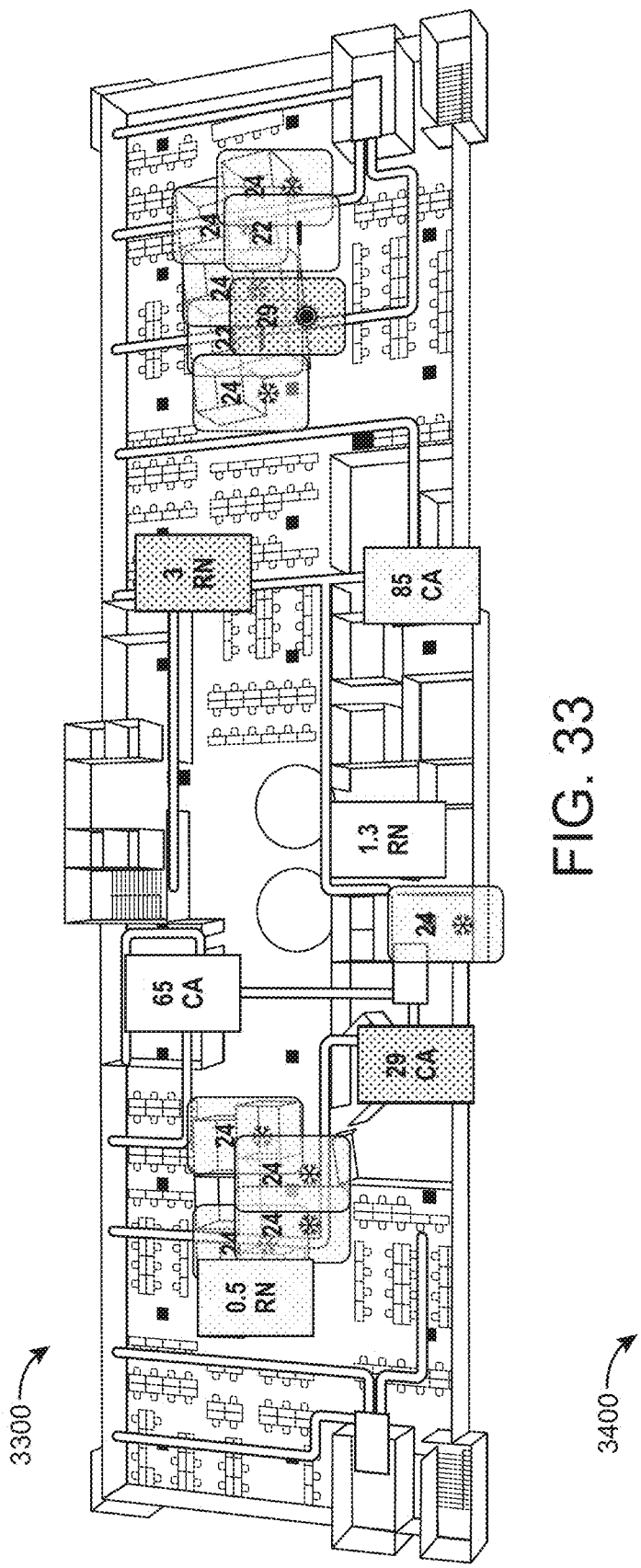
FIG. 33 is a schematic drawing of a floor of a building including indicators for a clean air score and a reproductive number, according to an exemplary embodiment.
FIG. 34 is a table of information for ingesting the clean air score and the reproductive number into the floor of FIG. 33, according to an exemplary embodiment.

Referring now to FIG. 33, a floor 3300 of a building including indicators for a clean air score and a reproductive number is shown, according to an exemplary embodiment. In some embodiments, the clean air score can be a score generated by an AI agent for various spaces of a building based on air quality measurements made for the various spaces of the building and/or operating settings of equipment of the various areas of the building. The clean air score can be generated by the AI agent based on telemetry stored in the knowledge graph 2602 for the various spaces of the building. In other embodiments, the clean air score may be generated using artificial intelligence executed by algorithms and/or software within the building data platform 100 (e.g., executed by an AI layer of the building data platform 100). The clean air scores generated by the AI agent can be ingested by the AI agent into the knowledge graph 2602. In some embodiments, the floor 330 displays a disease risk score that indicates a risk level of a disease spreading through a population. In some embodiments, a disease risk score can be determined with a Wells-Riley equation. Examples of the Wells-Riley equation and determining the disease risk score can be found in U.S. patent application Ser. No. 17/476,351 filed Sep. 15, 2021. The disease risk score can, in some embodiments, be the reproductive number. The various determinations or display of a reproductive number can, in some embodiments, be replaced with a disease risk score.

Similarly, in some embodiments, the reproductive number can be a value generated by an AI agent for various spaces of a building based on measurements made for the various spaces of the building and/or operating settings of equipment of the various areas of the building. In other embodiments, the reproductive number may be generated using artificial intelligence executed by algorithms and/or software within the building data platform 100 (e.g., executed by an AI layer of the building data platform 100). The reproductive number may be the expected number of cases directly generated by one case in a population where all individuals are susceptible to infection. The reproductive number can be generated by the AI agent based on telemetry stored in the knowledge graph 2602 for the various spaces of the building. The clean air scores generated by the AI agent can be ingested by the AI agent into the knowledge graph 2602. The client 2802 and/or data formatter 3202 can read out the clean air score and/or reproductive number for the various spaces of the building and display indications of the clean air scores and/or reproductive numbers in the various spaces of the building within the floor 3300.

Referring now to FIG. 34, a table 3400 of information for ingesting the clean air score and the reproductive number into the floor 3300 of FIG. 33 is shown, according to an exemplary embodiment. The table can be stored by the client 2802 and/or the data formatter 3202, in some embodiments. The table 3400 can provide a display name for displaying information within the floor 3300. The table 3400 can further indicate a variable name stored within a digital twin, e.g., within the knowledge graph 2602. Furthermore, the table 3400 can include a color coding rule that compares the clean air score and/or the reproductive number to various ranges to determine whether a certain color indicator should be displayed within the floor 3300 along with the particular value of the clean air score and/or reproductive number. In some embodiments, each clean air score and/or reproductive number is displayed in the floor 3300 for a particular AHU zone. In some embodiments, tags such as minimum energy, equal priority, and maximum disinfection can be displayed in the floor 3300.

Figures 35, 36:
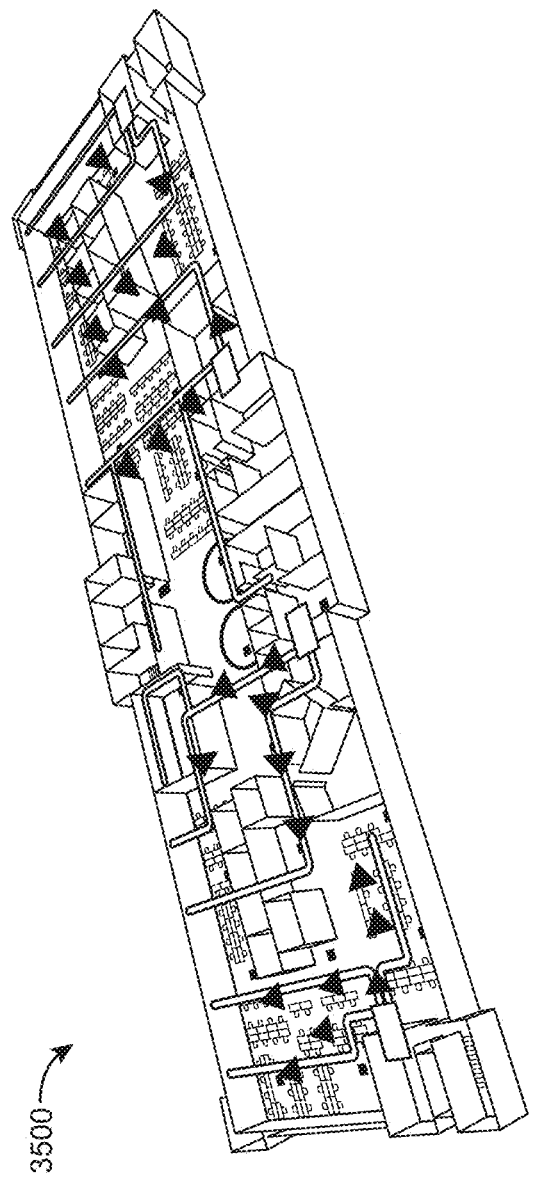
FIG. 35 is a schematic drawing of a floor of a building including animated arrows indicating air flow, according to an exemplary embodiment.
FIG. 36 is a table of information for ingesting a clean air delivery rate into the floor of FIG. 35, according to an exemplary embodiment.

Referring now to FIG. 35, a floor 3500 of a building including animated arrows indicating air flow is shown, according to an exemplary embodiment. In the floor 3500, arrows representing airflow through a building can be animated moving in a particular path. This can represent the airflow through the building. In some embodiments, the speed and/or color of the arrows can be based on an air delivery rate in the building. The arrows can animate on pipes or ducts of the building, in some embodiments.

Referring now to FIG. 36, a table 3600 of information for ingesting a clean air delivery rate into the floor 3500 is shown, according to an exemplary embodiment. The clean air delivery rate for every AHU zone of the building 3600 (e.g., each area served by a particular AHU) can be stored within a digital twin, e.g., the knowledge graph 2602. The client 2802 and/or 3202 can store the table 3600, in some embodiments, and use the table 3600 to retrieve the clean air delivery rate from the knowledge graph 2602 and/or animate the arrows within the floor 3500 based on the retrieved clean air delivery rates. The table indicates a name of the parameter, a variable name stored in a twin, and an arrow animation rule. The speed at which the arrows move in the floor 3500 can be based on the rate value. Furthermore, the color of the arrows can be set to a particular color, e.g., blue.

Figures 37, 38:
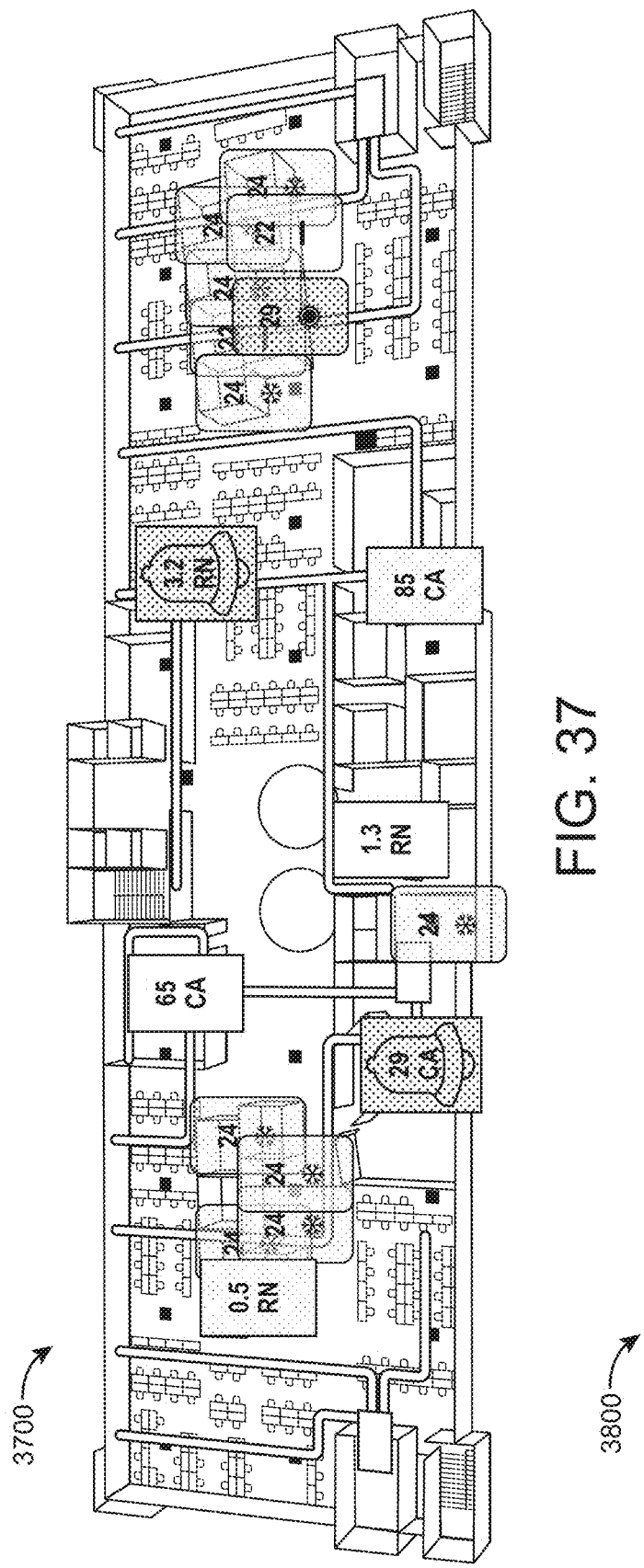
FIG. 37 is a schematic drawing of a floor of a building including indications of clean air score alarms and reproductive number alarms, according to an exemplary embodiment.
FIG. 38 is a table of information for ingesting the clean air score and the reproductive number into the floor of the building of FIG. 37 and generating alarms based on the clean air score and the reproductive number for display within the floor of the building of FIG. 37, according to an exemplary embodiment.

Referring now to FIG. 37, a floor 3700 of a building including indications of clean air score alarms and reproductive number alarms is shown, according to an exemplary embodiment. In some cases, if the clean air score goes too low for a space (e.g., the clean air score goes below a threshold), or the reproduction number goes too high for a space (e.g., the reproduction number goes above a threshold), an alarm can be generated and/or displayed within the floor 3700. The alarm can be generated based on an agent reviewing clean air scores and/or reproduction numbers of spaces stored in the knowledge graph 2602. In some embodiments, the alarms can be generated by the client 2802 and/or the data formatter 3202 reviewing clean air scores and/or reproduction numbers received from the knowledge graph 2602.

Referring now to FIG. 38, a table 3800 of information for ingesting the clean air score and the reproductive number into the floor 3700 and generating alarms based on the clean air score and the reproductive number for display within the floor of the building 3700 is shown, according to an exemplary embodiment. The table 3800 can be stored by the client 2802 and/or the data formatter 3202 and used to read information from the graph 2602 and/or render alarms within the floor 3700, in some embodiments. The table 3800 can indicate display name, variable name inside the digital twin, and a condition for whether an alarm should be triggered. A clean air alarm can be triggered if the clean air score is less than thirty. A reproductive number alarm can be raised if the reproductive number is greater than three.

Figure 39:
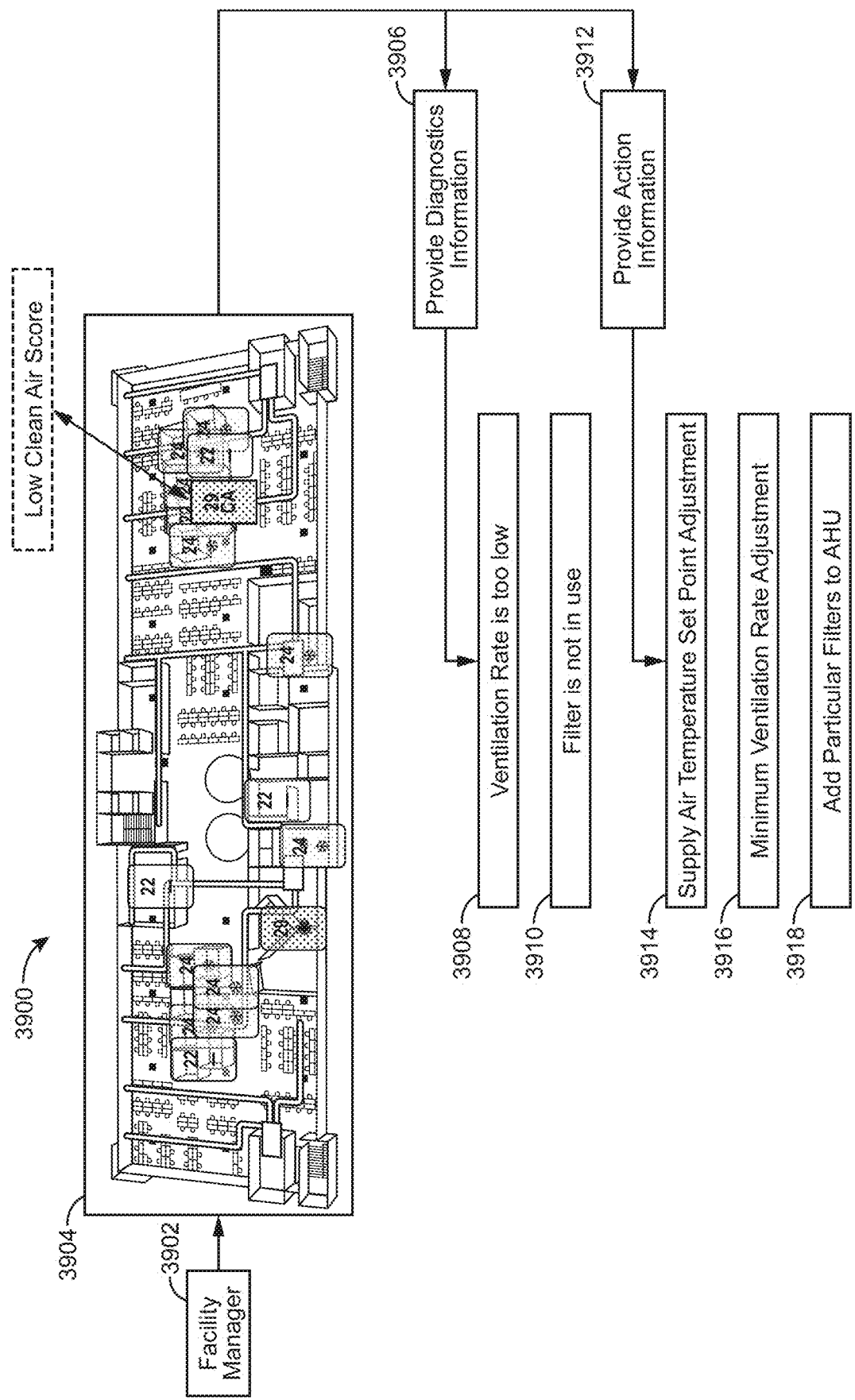
FIG. 39 is a block diagram of a facility manager interacting with a low clean air score displayed in a floor of a building and viewing diagnostic and action information, according to an exemplary embodiment.

Referring now to FIG. 39, is a block diagram 3900 of a facility manager 3902 interacting with a low clean air score displayed in a floor 3904 of a building and viewing diagnostic and action information is shown, according to an exemplary embodiment. The facility manager 3902 may be an individual that manages a building and/or floor. The facility manager 3902 can view the floor 3904 on a display device of the user device 176. In some embodiments, the facility manager 3902 can interact with an element displayed in the floor 3904, a low clean air score, via the user device 176.

Responsive to interacting with the low clean air score, the client 2802 can provide diagnostic information at 3906 and/or provide action information at 3912. The diagnostic information and/or the action information can be information identified by an agent and ingested into the knowledge graph 2602. The client 2802 can read the diagnostic information and/or action information out of the knowledge graph 2602 and display the information in the floor 3904 or in a user interface element on the above, below, or on the side of the floor 3904 within a user interface. The diagnostic information can provide a reason for the clean air score, e.g., an indication 3908 that the ventilation rate is too low or an indication 3910 that a filter is not in use. The action information can include an indication 3914 that a supply air temperature setpoint point could be adjusted (e.g., to a particular value), an indication 3916 that a minimum ventilation rate could be adjusted (e.g., to a particular value), and/or an indication 3918 that a particular filter could be added to an AHU to improve the clean air score. A user can interact with the provided action information to cause the settings to automatically update and/or a work order to be generated to replace the filter.

Figure 40:
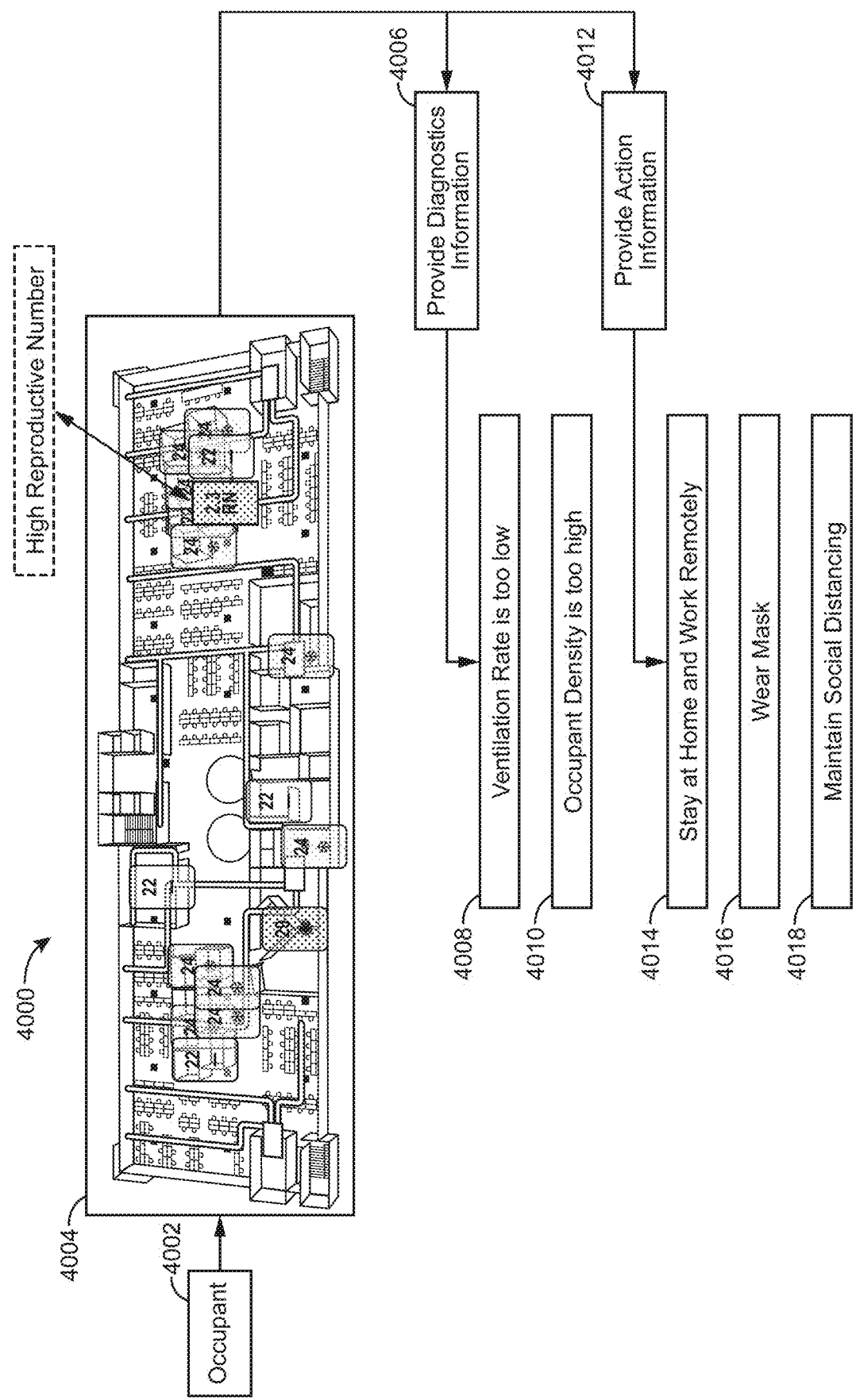
FIG. 40 is a schematic drawing of a block diagram of an occupant interacting with a high reproductive number displayed in a floor of a building and viewing diagnostic and action information, according to an exemplary embodiment.

Referring now to FIG. 40, a block diagram 4000 of an occupant 4002 interacting with a high reproductive number displayed in a floor 4004 of a building and viewing diagnostic and action information is shown, according to an exemplary embodiment. The occupant 4002 may be an individual that occupies a building and/or floor of the building. The occupant 4002 can view the floor 4004 on a display device of the user device 176. In some embodiments, the occupant 4002 can interact with an element displayed in the floor 4004, a high reproductive number, via the user device 176.

Responsive to interacting with the high reproductive number, the client 2802 can provide diagnostic information at 4006 and/or provide action information at 4012. The diagnostic information and/or the action information can be information identified by an agent and ingested into the knowledge graph 2602. The client 2802 can read the diagnostic information and/or action information out of the knowledge graph 2602 and display the information in the floor 4004 or in a user interface element on the above, below, or on the side of the floor 4004 within a user interface. The diagnostic information can provide a reason or the high reproductive number, e.g., an indication 4008 that the ventilation rate is too low or an indication 4010 that an occupant density level is too high. The action information can include an indication 4014 to stay at home and work remotely, an indication 4016 to wear a mask, and/or an indication 4018 to maintain social distancing.

Referring now to FIG. 41, a table 4100 indicating information that could be displayed within a graphical representation of the building is shown, according to an exemplary embodiment. For example, if a user interacts with the high reproductive number of the floor 4004, the table 4100 could be displayed to illustrate the occupant density by AHU zone. In some cases, the table 4100 could further display minimum ventilation rate for each AHU, supply air temperature setpoint for each AHU, a duct filter recommendation (e.g., MERV13) for each AHU, etc.

Figure 42:
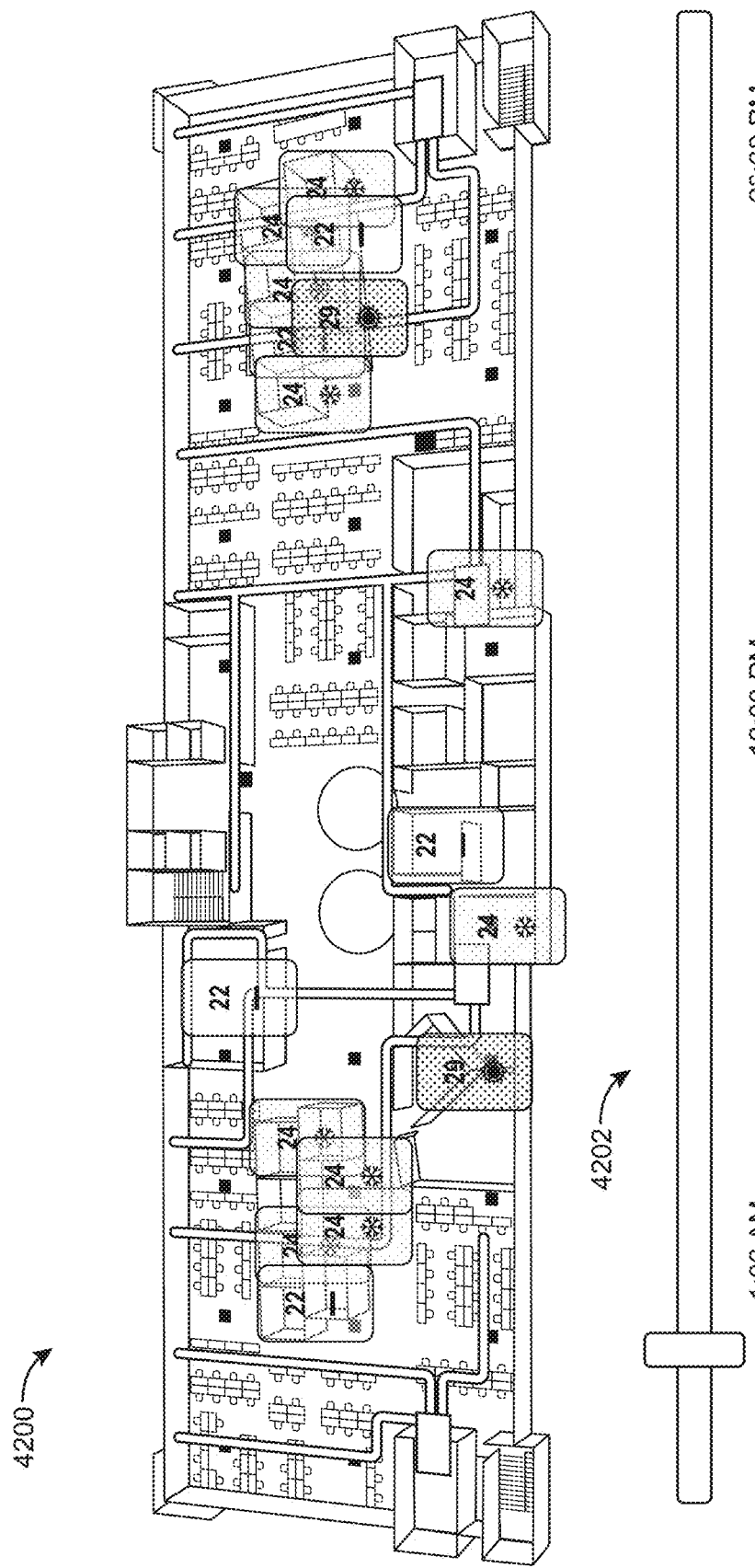
FIG. 42 is a schematic drawing of an element for viewing future predictions of information in a floor of a building, according to an exemplary embodiment.

Referring now to FIG. 42, an element 4202 for viewing future predictions of information in a floor 4200 of a building is shown, according to an exemplary embodiment. The elements 4200 and 4202 can be combined within a single user interface and/or displayed on a display device of the user device 176, in some embodiments. The element 4202 can be a slider that allows a user to select past, present, and/or future times. In some embodiments, the element 4202 could be a drop down that provides past, present, or future times that can be selected directly, e.g., 8:00 AM, 9:00 AM, 10:00 AM, etc. The client 2802 can query the knowledge graph 2602 for information (e.g., data with a timestamp as selected in the element 4202) and display the information within the element 4200. The information displayed in the element 4200 can be alerts, data values, animations, trends, etc. In some embodiments a user can select times in a one hour interval.

In some embodiments, the element 4202 allows a user to view "what if" scenarios by moving back and forth in time and testing various settings and configurations for equipment of the building and/or the building. In some embodiments, for various settings and/or configurations provided by a user, an agent can infer future states for various future times. The user can provide various settings and view the varying results for each set of settings or configuration.

In some embodiments, via the element 4200 various recommended action can be displayed to resolve a future predicted issue (e.g., fault, poor air quality, high reproduction rate, etc.). A user can set, via the element 4200, approval to automatically generate a ticket for maintenance, update operating settings of equipment, etc. The element 4200 can allow a user to approve a trigger to automatically perform an action if a scenario simulated and displayed in the element 4200 does in fact occur.

Figure 43:
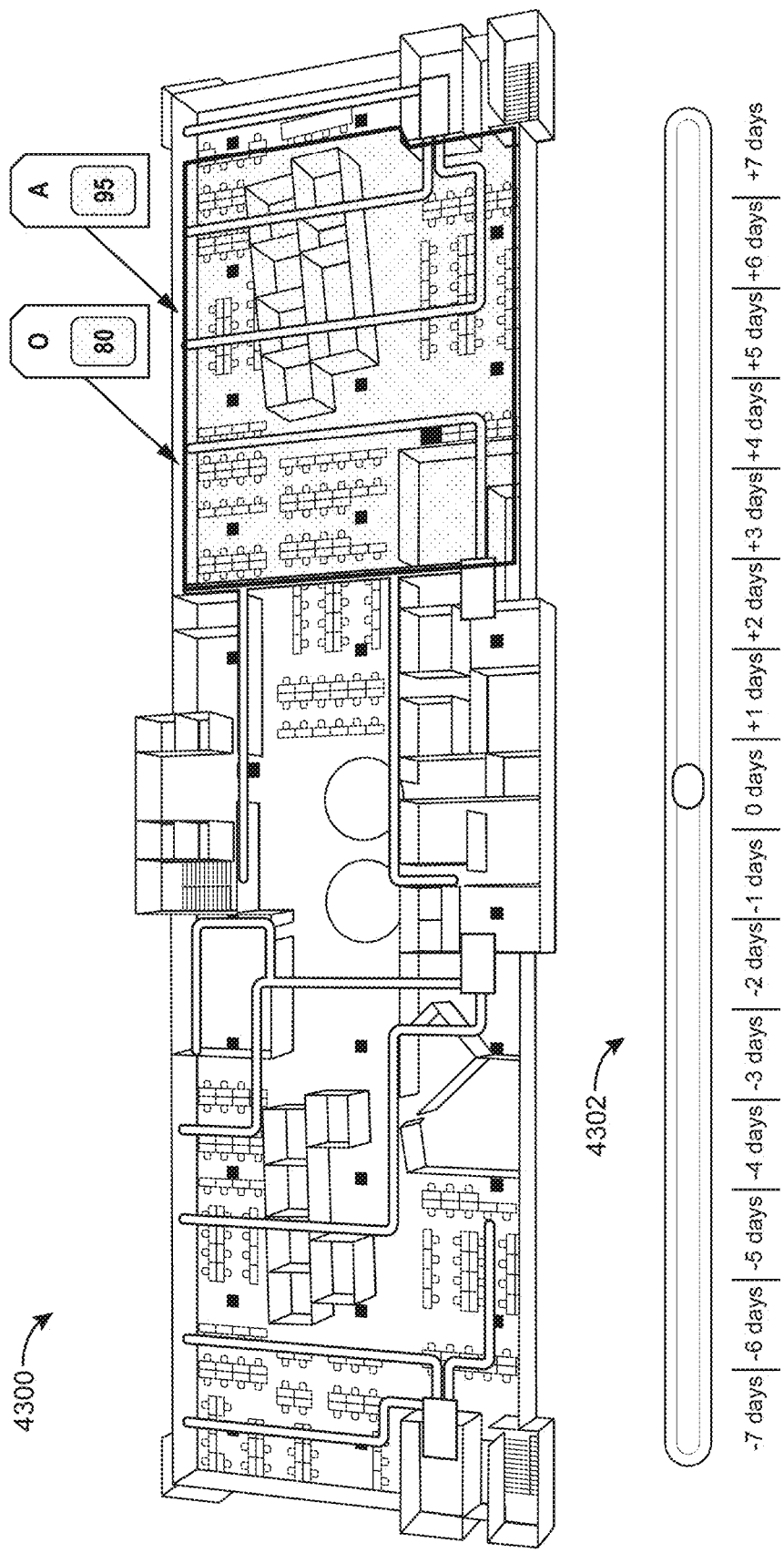
FIG. 43 is a schematic drawing of an element for viewing an occupancy level and a clean air score in a floor of a building, according to an exemplary embodiment.

Referring now to FIG. 43, an element 4300 and an element 4302 for viewing an occupancy score and a clean air score in a floor of a building are shown, according to an exemplary embodiment. The elements 4300 and 4302 can be combined within a single user interface and/or displayed on a display device of the user device 176, in some embodiments. The element 4300 can be a graphical representation of a floor of a building that displays an occupancy level and a clean air score for a space of the building. The space can be highlighted by a particular color, e.g., green, blue, or red, based on the occupancy level and/or clean air score.

The element 4300 can allow a user to view states of the building at a current time, one or more days into the future, and/or one or more days into the past. The element 4303 can be a slider allowing a user to flip through the states of the building at historical, current, or future times. The elements 4300 and 4302 can provide a "Building Player" allowing a user to "play" the building view the past statuses of the building (e.g., stored in a timeseries database and/or a digital twin), present statuses of the building, and/or future statuses of the building (e.g., simulated and/or inference/predictions generated by a digital twin). The predicted future statuses can be generated by an agent based on past and/or current data for the building, in some embodiments.

Figure 44:
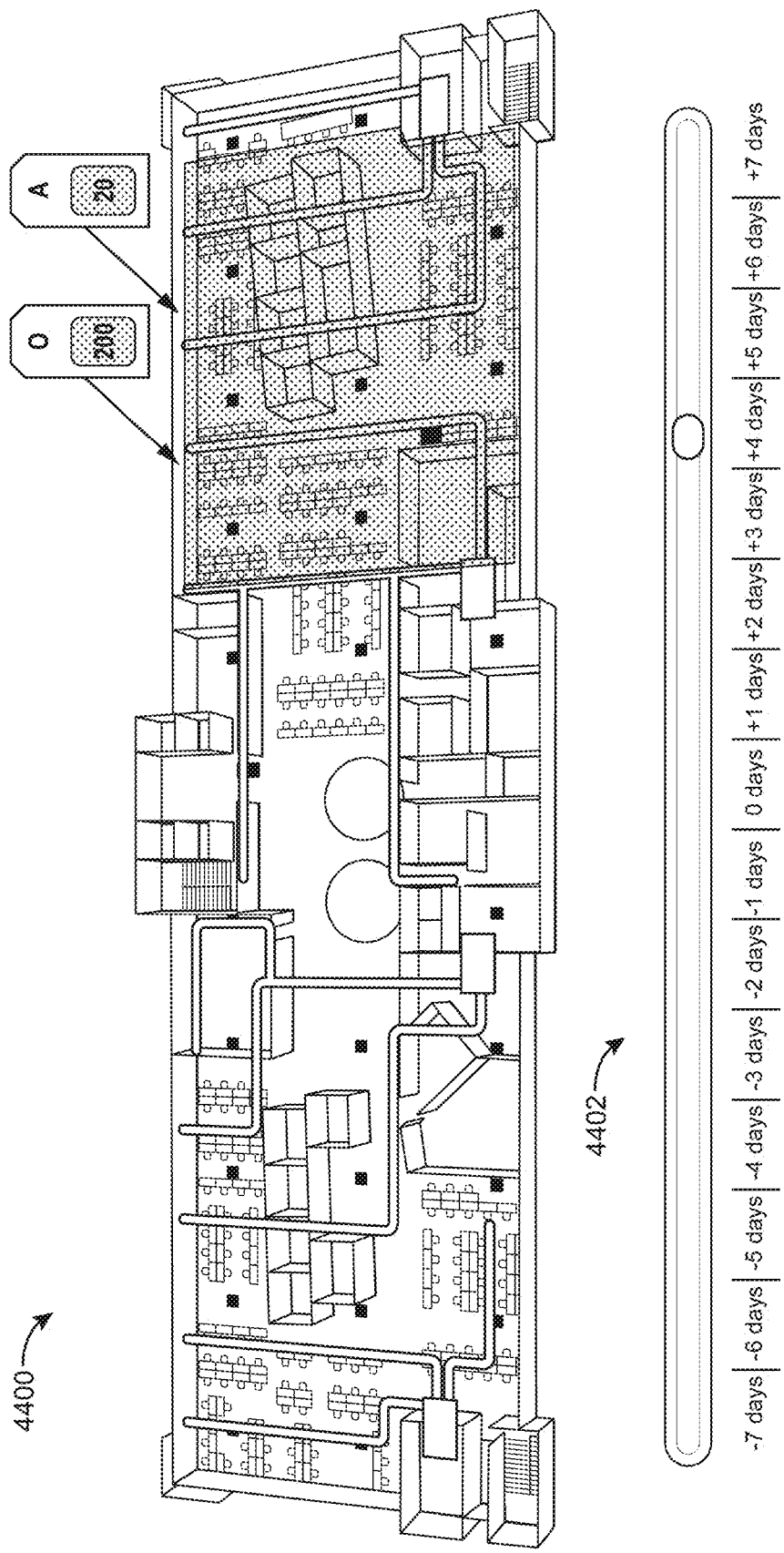
FIG. 44 is a schematic drawing of an element for viewing a predicted occupancy score and a predicted clean air score for a future time in a floor of a building, according to an exemplary embodiment.

Referring now to FIG. 44, an element 4400 and an element 4402 for viewing a predicted occupancy score and a predicted clean air score for a future time in a graphical representation of a floor of a building is shown, according to an exemplary embodiment. The elements 4400 and 4402 may be the same as or similar to the elements 4300 and 4302 shown in FIG. 43. However, the elements 4400 and 4402 can display a status of the building four days into the future as compared to the building illustrated in FIG. 43. Various AHU digital twins can run to make predictions for occupancy and/or air quality four days into the future and cause the predictions to be displayed in the element 4400.

In some embodiments, the occupancy is predicted from schedules and/or calendars and/or predicted from historical occupancy trends. In some embodiments, the predicted occupancy could be fed into a clean air optimization model to predict the air quality. In some embodiments, the element 4400 can display actions for avoiding the future poor air quality scenario. The user can provide approval to perform the action and/or allow an agent to automatically operate to avoid the poor air scenario. In some cases, the poor air quality scenario may be unavoidable. In such a case, the element 4400 can include an indication that the scenario is unavoidable.

Figure 45:
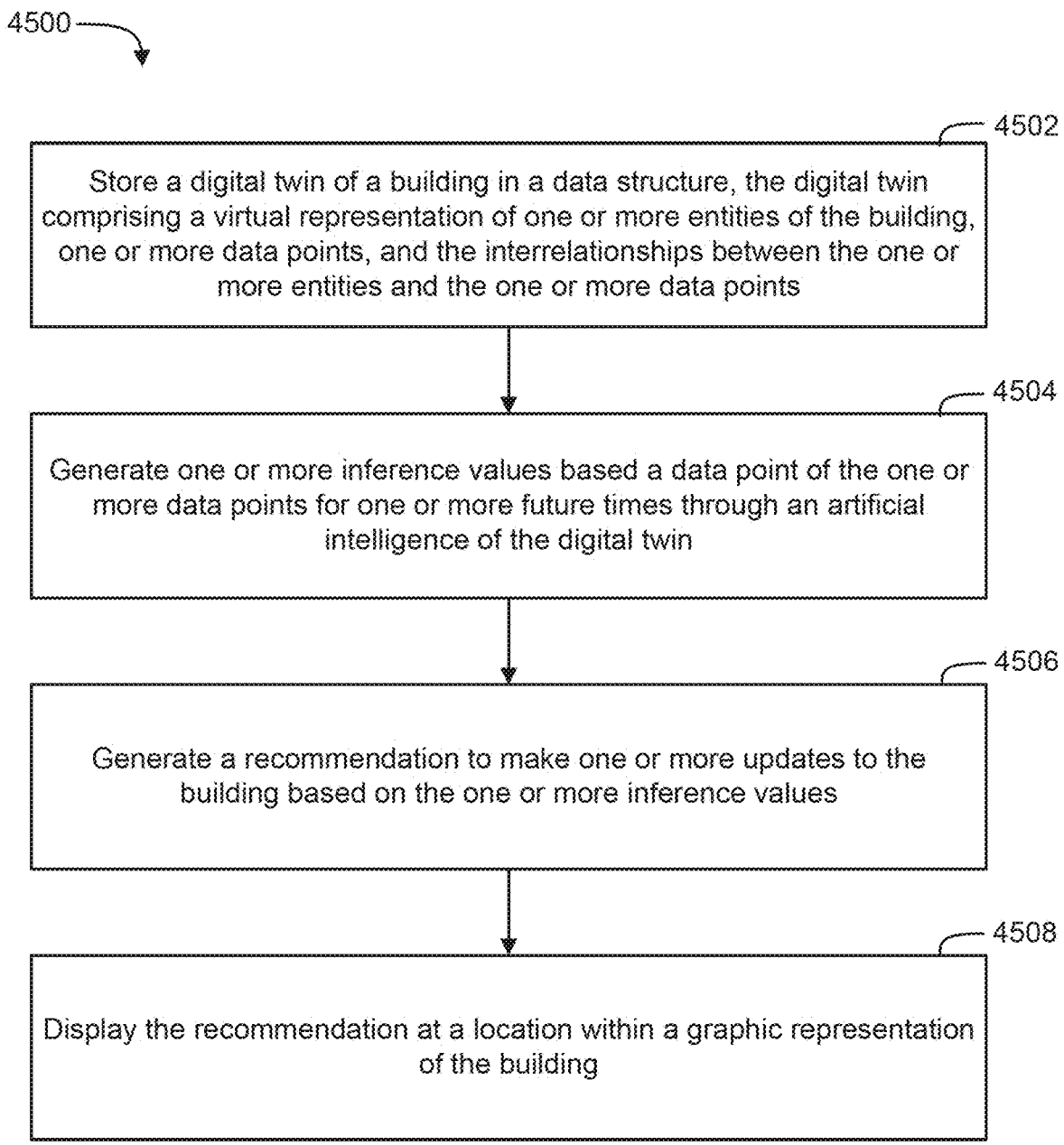
FIG. 45 is a flow diagram of a process for generating and displaying, via a digital twin, a recommendation for updating a building, according to an exemplary embodiment.

Referring now to FIG. 45, a flow diagram of a process 4500 for generating and displaying a recommendation for updating a building is shown, according to an exemplary embodiment. In some embodiments, the building data platform 100 can be configured to perform the process 4500. In some embodiments, the learning service 2206 can be configured to perform the process 4500. Any computing device or system described herein can be configured to perform the process 4500.

In step 4502, the building data platform 100 stores a digital twin of a building in a data structure. The digital twin can include a virtual representation of one or more entities of the building, one or more data points, and the interrelationships between the one or more entities and one or more data points. The data structure can be a building graph (e.g., the graph 529) as described in FIGS. 2-5. For example, as shown in FIG. 5, the one or more building entities may include a building zone, a building floor, an AHU of the building, and a VAV of the building. The one or more data points may include the data stored timeseries node 564 and timeseries node 566. The building data platform 100 may store the building entities, the data points, and their interrelationship connections in twin manager 108. The entities can be represented as nodes of a building graph. The interrelationships between the entities can be edges between the nodes. In some embodiments, the building data platform 100 may ingest outdoor air quality forecast data into the digital twin. Based on the outdoor air quality forecast data, the building data platform 100 may be able to predict air quality and advise building occupants on their outdoor activities. Additionally, the building data platform 100 may control one or more building operations based on the air quality forecast data. For example, the building data platform 100 may pre-purge the building with fresh air when poor air quality is forecasted.

In step 4504, the building data platform 100 generates one or more inference values based on a data point of the one or more data points for one or more future times through an artificial intelligence of the digital twin. More specifically, the building data platform 100 may generate the one or more inference values by retrieving the inferred or predicted information stored in the graph 529 and generating one or more inference values based on the inferred or predicted information. As described above, the inferred or predicted information can be made based on the model 576. In some embodiments, the model 576 may be stored in the digital twin as an attribute of the digital twin. For example, the model 576 can be a clean air model for predicting the air quality of a space, zone, and/or building or an occupancy model for predicting occupancy of a space, zone, and/or building. In some embodiments, and inference value may be in the form a score or number that describes a quality of a building entity. For example, an inference value may be an inferred or predicted air quality score ranging from 0-100 where a score between 0-60 may be a "poor" score, a score between 61-80 may be and "average" score, and a score between 81-100 may be a "good" score. As another example, an inference value may be an inferred and predicted reproductive number which describes the expected number of infection cases directly generated by one infection case in a population where all individuals are susceptible to infection. In some embodiments, a reproductive number of less than one may be considered "good", a reproductive number between 1-2 may be considered "average", and a reproductive number greater than 2 may be considered "poor." The inference values can be inferred data values for a present time, e.g., a current clean air score or a current reproductive number. In some embodiments, the inference values are predicted values, e.g., a clean air score an hour into the future, a reproductive number an hour into the future, etc. The predicted values can be predicted by the model 576 based on current operating data of building equipment of the building, an operating schedule of the building equipment, current measured environmental conditions of the building measured by the building equipment, weather forecasts, current outdoor air conditions, etc.

In step 4506, the building data platform 100 generates a recommendation to make one or more updates to the building based on the one or more inference values as determined in step 4504. For example, if the building data platform 100 determines an inference value that is "poor" (e.g., a building performance is less than a threshold, an energy consumption is greater than a threshold, a probability of infection for occupants of a building of an infectious disease is greater than a threshold, etc.), the building data platform 100 may determine one or more actions to improve this inference value and/or improve the functioning of the building. For example, if the building platform 100 determines a predicted clean air score of 50, the building platform 100 may determine certain actions (e.g., increase the ventilation rate, adjust the temperature setpoint, increase filtration, generate a maintenance request to replace an old filter and/or install a new filter, etc.) that can increase the predicted clean air score. Once the building data platform 100 has determined the action that may be implemented, the building data platform 100 may generate a recommendation to make one or more updates to the building based on the determined actions. some implementations, the recommendation includes a recommendation to update operating settings of building equipment of the building, the operating settings updating operation of the building equipment by interacting with the digital twin of that building equipment or through an API or other integration with the building equipment or the building management system through which instructions can be sent to said equipment. In some embodiments, the recommendation may be implemented automatically by the building data platform 100. In other embodiments, the recommendation may be implemented manually by a building technician.

In step 4508, the building data platform 100 displays the recommendation determined in step 4506 at a location within a graphical representation of the building. For example, the recommendation may be displayed at a location within the graphical representation of the building 3000 or within the floor 3100 of the graphical representation of the building 3000. The recommendation may be displayed on a display device of the user device 176. In some embodiments, a user may be able to interact with the user device 176 to implement the recommendations displayed on the user device. For example, if one of the recommendations is to increase the ventilation rate within a building, the user may be able to implement that action directly on the user device. In some embodiments, the building data platform 100 stores the recommendation, or a link to the recommendation, in a node of a building graph. The node storing or linking the recommendation can be linked to a node representing a space (e.g., a floor, a room, a zone, etc.) of the building via an edge. Responsive to receiving a request to display the space in a user interface (e.g., a user navigating to the space), the building data platform 100 can query the graph for data of the space and identify the recommendation stored in the node based on the edge between the node storing or linking the recommendation and the node representing the space. The building data platform 100 can cause the recommendation to be displayed responsive to identifying the recommendation stored in the node.

Figure 46:
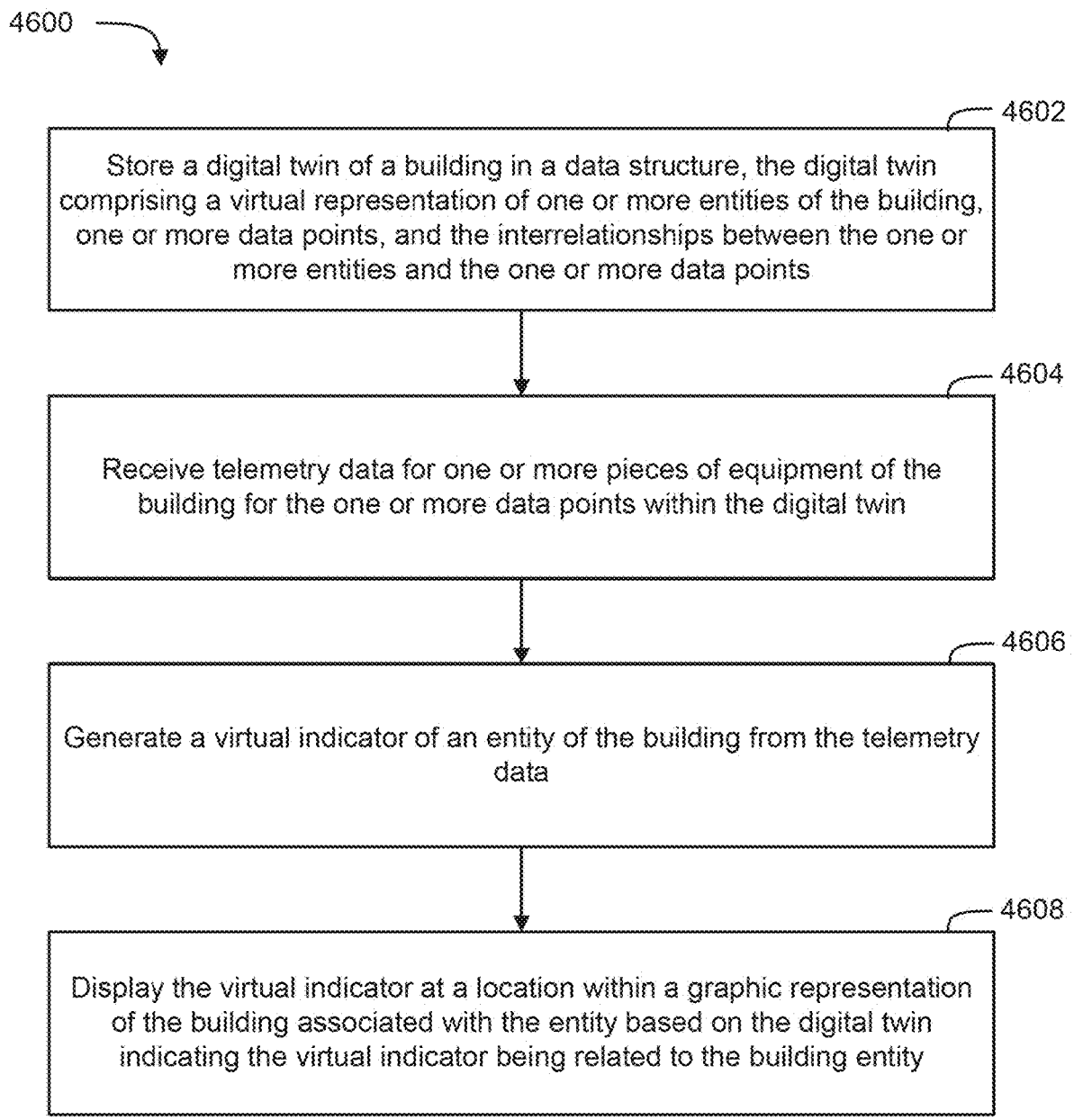
FIG. 46 is a flow diagram of a process for generating and displaying, via a digital twin, a virtual indicator of an entity of a building based on telemetry data, according to an exemplary embodiment.

Referring now to FIG. 46, a flow diagram of a process 4600 for generating and displaying a virtual indicator of an entity of a building based on telemetry data is shown, according to an exemplary embodiment. In some embodiments, the building data platform 100 can be configured to perform the process 4600. In some embodiments, the learning service 2206 can be configured to perform the process 4600. Any computing device or system described herein can be configured to perform the process 4600.

In step 4602, the building data platform 100 stores a digital twin of a building in a data structure. The digital twin can include a virtual representation of one or more entities of the building, one or more data points, and the interrelationships between the one or more entities and one or more data points. The data structure can be a building graph (e.g., the graph 529) as described in FIGS. 2-5. For example, as shown in FIG. 5, the one or more building entities may include a building zone, a building floor, an AHU of the building, and a VAV of the building. The one or more data points may include the data stored timeseries node 564 and timeseries node 566. The building data platform 100 may store the building entities, the data points, and their interrelationship connections in twin manager 108.

In step 4604, the building data platform 100 receives telemetry data for one or more pieces of equipment of the building for the one or more data points within the digital twin. More specifically, the telemetry component 560 can receive telemetry data from physical devices such as the building subsystems 122. The telemetry can be measured data values, a log of historical equipment commands, etc. The telemetry component 560 can store the received information, or a link to the received information, in the graph 529 by relating a node storing or linking to the information to a node representing the physical device. In some embodiments, the telemetry component 560 can store timeseries data as the timeseries 566.

In step 4606, the building data platform 100 generates a virtual indicator of an entity of the building from the telemetry data. The virtual indicator may be related by the digital twin to an entity of the one or more entities of the building. For example, a virtual indicator may be a temperature virtual indicator for a room or zone of the building by a thermostat digital twin or a temperature sensor digital twin. A virtual indicator may be described as virtual value that describes one or more states of a building entity. In some implementations, the virtual may be a non-measured characteristic of the building. As another example, the virtual indicator can be a reproductive number that describes the expected number of cases caused by a case in a population where all individuals are susceptible to infection. As another example, the virtual indicator can be an energy consumption associated with a building. As another example, the virtual indicator can be an air quality description associated with a building, building room, building space, or building zone. The virtual indicator is "virtual" because it can be derived from telemetry data or because the indicator may be created and stored remotely from the building associated with the building data platform 100. For example, the building data platform 100 can store the virtual indicator in a building graph (e.g., graph 529). For example, an agent or AI service (e.g., the AI agent 570, the agent 2524 or the CAO AI service 2604) in a virtual indicator node related to a space node via an edge of the building graph. The edge can connect the node to the space node. This relationship formed by the edge can indicate that the virtual indicator node stores or links to a virtual indicator for the space.

In step 4608, the building data platform 100 displays the virtual indicator determined in step 4606 at a location within a graphic representation of the building (e.g., the graphical building model 2804, the floor 3300, the floor 3700, etc.) based on a request received from a user via the user device 176 that they would like to view the virtual indicator. For example, the user may interact with a user device to click, select, pan, highlight, etc. a portion of a building on a user interface to indicate that they would like to view a virtual indicator. Once the building data platform 100 receives the user indication as a request to display a virtual indicator, the building data platform 100 can display the virtual indicator at a location within a graphic representation of the building. More specifically, the building data platform 100 queries the digital twin to find an entity (e.g., a building floor, room, space, person, piece of equipment, etc.). The entity may be may be related to a data object that stores a list of attributes related to the data entity (e.g., name, location, description, etc.). More specifically, a building model may include a set of names for entities and spaces associated with the building. The building data platform 100 queries and finds the entity node for the entity, and determines the location edge from the entity node to another node representing space within the building. Finally, the building data platform 100 compares the queried location name to the set of names to identify the specific building model object that represents that space and where to display the virtual indicator. If the virtual indicator is related to a particular room, zone, or part of a building, the virtual indicator may be displayed at or near that particular location. For example, the temperature virtual indicator 3102 related to conference room 3104 may be displayed in the graphical representation of the building. The virtual indicator may be displayed on a display device of the user device 176.

Figure 47:
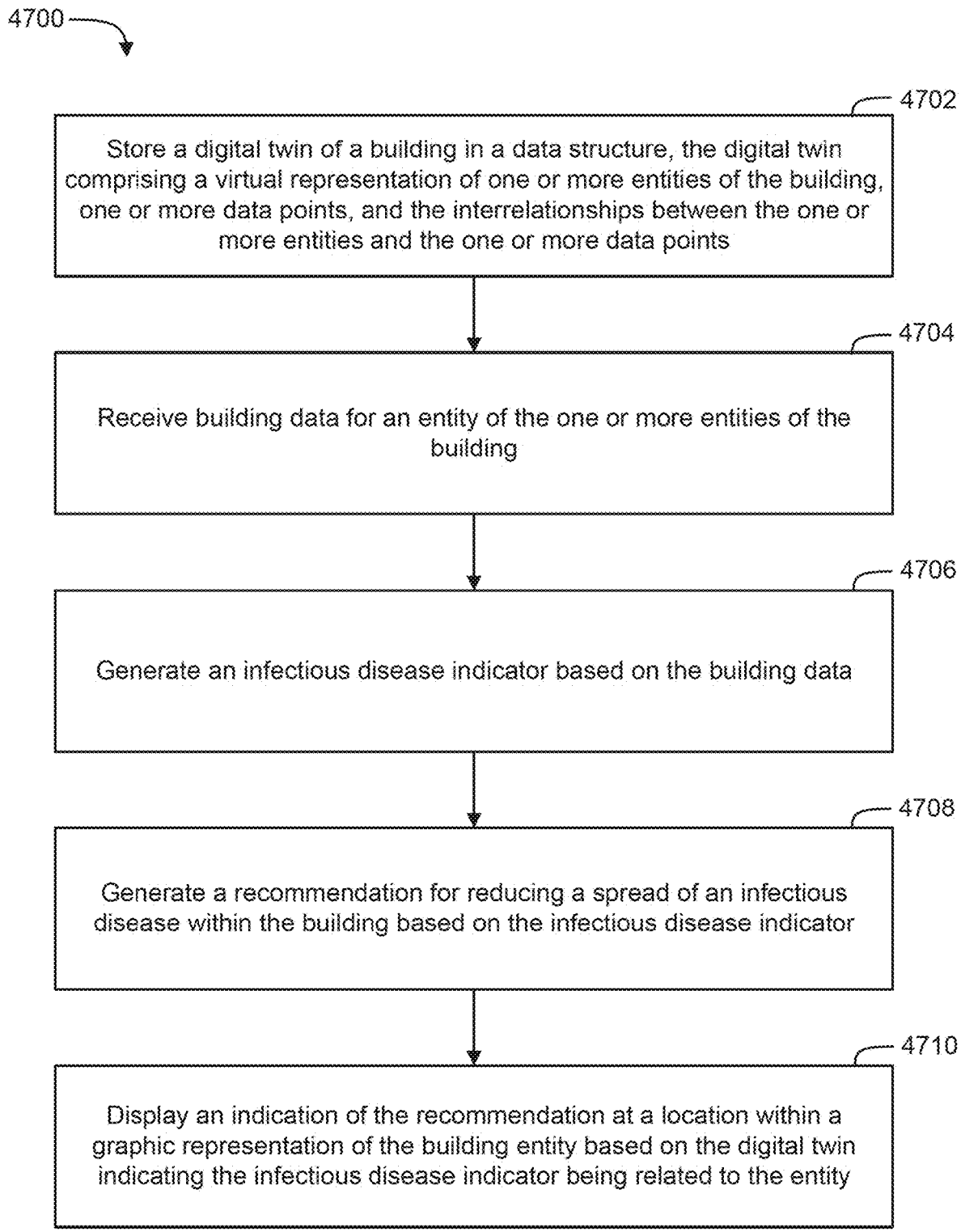
FIG. 47 is a flow diagram of a process for generating and displaying, via a digital twin, a recommendation for reducing the spread of an infection disease within a building, according to an exemplary embodiment.

Referring now to FIG. 47, a flow diagram of a process 4700 for generating and displaying a recommendation for reducing the spread of an infection disease within a building is shown, according to an exemplary embodiment. In some embodiments, the building data platform 100 can be configured to perform the process 4700 c. In some embodiments, the learning service 2206 can be configured to perform the process 4700. Any computing device or system described herein can be configured to perform the process 4700.

In step 4702, the building data platform 100 stores a digital twin of a building in a data structure. The digital twin can include a virtual representation of one or more entities of the building, one or more data points, and the interrelationships between the one or more entities and one or more data points. The data structure can be a building graph (e.g., the graph 529) as described in FIGS. 2-5. For example, as shown in FIG. 5, the one or more building entities may include a building zone, a building floor, an AHU of the building, and a VAV of the building. The one or more data points may include the data stored timeseries node 564 and timeseries node 566. The building data platform 100 may store the building entities, the data points, and their interrelationship connections in twin manager 108. The entities can be represented as nodes of a building graph. The interrelationships between the entities can be edges between the nodes.

In step 4704, the building data platform 100 receives building data for an entity of the one or more entities of the building. In some embodiments, the entity may be a component associated with the building such as a piece of building equipment, a building device, a user, and/or a building space (e.g., a zone, a conference room, an office). In some embodiments, the building data platform 100 can receive this data from one or more building devices relating to the entities of the building. For example, the building data platform 100 can receive the number of occupants in a building and/or building space, the airflow of the building, the air changes for a building, the amount of infected individuals in a building, and the air quality of a building (e.g., temperature of the air, humidity of the air). This data may be used to determine a reproductive number for the building. In other embodiments, the building data platform may retrieve this data from the graph 529 or the knowledge graph 2602.

In step 4706, the building data platform 100 generates an infectious disease indicator based on the building data. For example, the building data may include telemetry data and/or operating settings of equipment of the various areas of the building. In some embodiments, the infectious disease indicator may be generated by an AI agent for various spaces of a building based on the data received in step 4704. More specifically, the building data platform 100 may use the model 576 to generate an infectious disease indicator. The model 576 is described in more detail above with respect to FIG. 5. In some embodiments, the infectious disease indicator may be a reproductive number.

In step 4708, the building data platform 100 generates a recommendation for reducing a spread of an infectious disease within the building based on the infectious disease indicator determined at step 4706. In some embodiments, the infectious disease indicator is a reproductive number, the building data platform 100 may determine that the reproductive number is "poor" (e.g., higher than 2) and may determine one or more actions for reducing the spread of an infectious disease and decreasing the reproductive number. For example, if the building data platform 100 determines a reproductive number of 4, the building data platform 100 may determine certain actions (e.g., implementing mask wearing policies, implementing social distance policies, implementing remote work policies, etc.) that may be implemented within the building to decrease the reproductive number. Once the building data platform 100 has determined the action that may be implemented, the building data platform 100 may generate a recommendation to make one or more updates to the building based on the determined actions. The determined actions included in the recommendation may be changed based on the reproductive number. For example, if the reproductive number is lower (e.g., 1-2), then the recommendation may only include implementing a mask policy throughout the building. On the other hand, if the reproductive number is higher (e.g., 3-4), the recommendation may include implementing a mask policy, implementing a social distancing policy, and/or implementing a remote work policy.

As another example, if the building data platform 100 determines a reproductive number of that is poor (e.g., higher than a certain threshold such as 2), the building data platform 100 can operate one or more building devices to change the indoor environmental quality to reduce the reproductive number and control the spread of a disease within a building. For example, the building data platform 100 may control the building subsystems 122 to increase air filtration within the building, activate or increase air treatment operations within the building, increase indoor air ventilation within the building, activate or increase the indoor water treatment within the building, change the temperature in the building, change the humidity in the building, and/or activate disinfectant lighting within the building. The building subsystem 122 can operate to improve the indoor air quality, reduce the reproductive number, and prevent the spread of an infectious disease by performing one or more of the techniques discussed in U.S. application Ser. No. 17/013,273 filed on Sep. 4, 2020 (published as U.S. Publication No. 2021/0356153 on Nov. 18, 2021), the entirety of which is incorporated by reference herein.

In step 4710, the building data platform 100 displays the recommendation determined in step 4708 at a location within a graphic representation of the building based on a request received from a user that they would like to view the recommendation. In some embodiments, a user via the user device 176 may interact with a user device to click, select, pan, highlight, etc. a portion of a building on a user interface to indicate which they would like to view a recommendation for. For example, if a certain space of the building has a high reproductive number (e.g., above 2, 3, or 4), the user, via the user device 176, can select that portion or space of the building to receive a recommendation to lower the reproductive number. Once the building data platform 100 receives the user indication as a request to display a virtual indicator, the building data platform 100 displays the recommendation at a location within a graphic representation of the building. If the infectious disease indicator is related to a particular room, zone, or part of a building, the virtual indicator may be displayed at or near that particular location.

Figure 48:
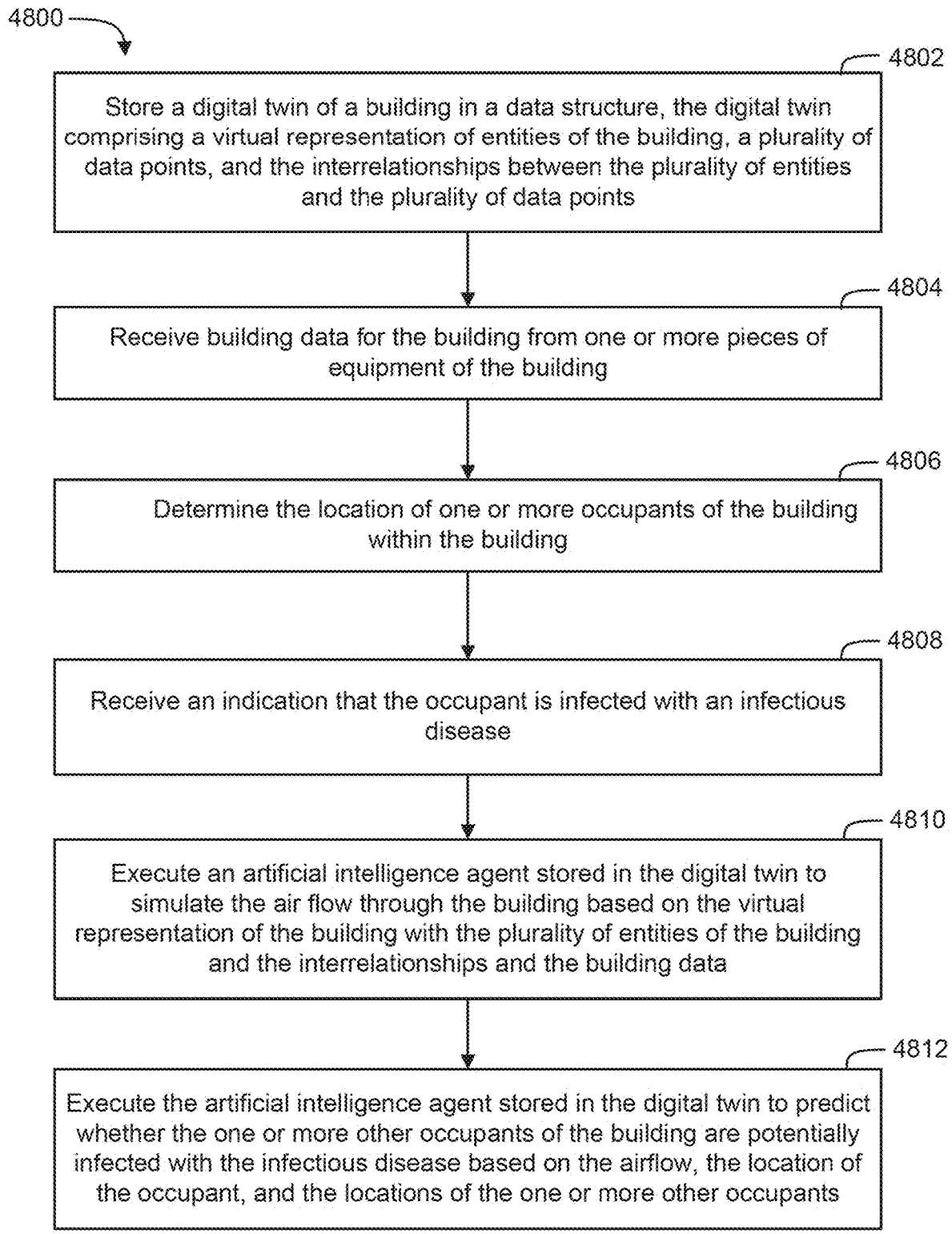
FIG. 48 is a flow diagram of a process for using the artificial intelligence stored in the digital twin of FIG. 5 to simulate the air flow through the building and predict infectious disease values, according to an exemplary embodiment.

Referring now to FIG. 48, a flow diagram of a process 4800 for predicting whether a building occupant has been infected with an infectious disease is shown, according to an exemplary embodiment. In some embodiments, the building data platform 100 can be configured to perform the process 4800. In some embodiments, the learning service 2206 can be configured to perform the process 4800. Any computing device or system described herein can be configured to perform the process 4800.

In step 4802, the building data platform 100 stores a digital twin of a building in a data structure. The digital twin can include a virtual representation of one or more entities of the building, one or more data points, and the interrelationships between the one or more entities and one or more data points. The data structure can be a building graph (e.g., the graph 529) as described in FIGS. 2-5. For example, as shown in FIG. 5, the one or more building entities may include a building zone, a building floor, an AHU of the building, and a VAV of the building. The one or more data points may include the data stored timeseries node 564 and timeseries node 566. The building data platform 100 may store the building entities, the data points, and their interrelationship connections in twin manager 108. In some embodiments, the digital twin may include an analytical and/or artificial intelligence model/algorithm that simulates an airflow through the building and predicts whether one or more occupants are potentially infected with an infectious disease based on the artificial intelligence. The artificial intelligence can be the AI agent 570. The AI agent 570 can execute against the graph 529 to simulate airflow. The AI agent 570 can analyze the edges between nodes representing AHUs, VAVs, zones, floors, etc. and the operating data (e.g., fan speeds of the AHUs, damper positions of the AHUs, etc.) to predict how air is flowing through the building. Furthermore, based on locations of occupants (which may be represented in the graph 529) the AI agent 570 can be configured to determine whether the airflow is carrying particles (potentially disease particles) from a location where an infected occupant is to a location where another occupant is located. The entities can be represented as nodes of a building graph. The interrelationships between the entities can be edges between the nodes.

In step 4804, the building data platform 100 receives building data for the building from one or more pieces of equipment of the building. The building data received in step 4804 may include air flow and air quality metrics, occupancy rates within one or more zones or areas of the building, identification of occupants within the building, and the temperature of one or more occupants within the building. This data may be collected by one or more pieces of equipment of the building including thermal imaging systems, one or more sensors structured to determine the air flow and air quality metrics (e.g., air temperature sensors, humidity sensor, indoor air quality sensors, etc.), and occupancy sensors. Additionally, the building data may also be collected through one or more sensors configured to determine the environmental quality of the building. The environmental quality of the building may describe conditions that may or may not facilitate the growth of infectious diseases and viruses. For example, these conditions may include the temperature of the building, air flow of the building, air quality of the building, and/or water temperature within the building. The building data received in step 4804 may be used as an input to the artificial intelligence (e.g., the AI agent 570) within the digital twin to predict whether one or more occupants are potentially infected with an infectious disease.

In some embodiments, the building data may be collected through one or more biological sensors. A biological sensor may be configured to monitor air quality or water quality to determine the presence of an infectious disease within a building. In some embodiments, the biological sensors may include pathogen detectors. In some embodiments, the pathogen detectors may be airborne and/or sewage-based pathogen detectors. More specifically, in some embodiments, one or more biological sensors can be placed in or near an air handling unit (AHU). The biological sensors may evaluate the air in or near the air handling unit to determine if the air contains any infectious diseases. The building data platform 100 can receive an input from the biological sensor indicating the presence of a particular biological agent such as an infectious disease. Biological sensors are described in more detail in U.S. Patent Application No. 63/252,050 filed Oct. 4, 2021, the entirety of which is incorporated by reference herein.

In some embodiments, one or more airborne pathogen detectors may be used to sense the presence of one or more types of pathogens in the air, and/or one or more sewage pathogen detectors may be used to sense the presence of one or more pathogens in sewage. It should be understood that these are merely two examples of different types of pathogen detectors, and the present disclosure contemplates the use of any of a variety of different types of pathogen detectors in combination (e.g., airborne detectors, sewage detectors, water detectors configured to sense the presence of pathogens in water, surface detectors configured to sense the presence of pathogens on surfaces, patient sampling detectors configured to sense the presence of pathogens from samples taken from occupants/patients, etc.). For example, in some implementations, an airborne pathogen detector may be used to detect the presence of a pathogen in sewage (e.g., by placing the detector in or near the sewage, i.e., sensing the pathogen in the sewage or in the air proximate to the sewage). In some implementations, a sewage pathogen detector could be used to sense the presence of a pathogen in the sewage, and in response to detecting the presence of the pathogen, data from one or more airborne pathogen detectors could be obtained and/or analyzed to determine locations and/or severity of spread of the pathogen in a building. In some implementations, the airborne pathogen detectors could be activated responsive to detection of the presence of the pathogen by the sewage pathogen detectors. In some implementations, the sewage pathogen detectors and/or airborne pathogen detectors could obtain samples to be processed off-premises, and in some implementations, the sewage pathogen detectors and/or airborne pathogen detectors could process samples on-premises (e.g., at the location of the detectors or at a separate location within the building). Pathogen detectors are described in more detail in U.S. Patent Application No. 63/330,732 filed Apr. 13, 2022, the entirety of which is incorporated by reference herein.

In step 4806, the building data platform 100 determines the location of one or more occupants of the building within the building. The building data platform 100 may determine the location of one or more occupants of the building from the building data received by the building data platform 100 in step 4804. As mentioned above, the building data may include occupancy data received from one or more occupancy sensors of the building. The occupancy sensors may include passive infrared sensors, ultrasonic sensors, infrared time-of-flight (ToF) sensors, infrared array sensors, ultrasonic sensors, microwave sensors, and occupant recognition cameras. One or more of the occupancy sensors may be able to determine the location of one or more occupants within the building.

In step 4808, the building data platform 100 receives an indication that the occupant is infected with an infectious disease. The indication that the occupant is infected with an infectious disease may be based on the building data received in step 4804. In some embodiments, the indication that the occupant is infected with an infectious disease may be based on a temperature measurement of the occupant. The temperature of the occupant may be determined by a thermal imaging system within the building or a temperature sensor within the building. In some embodiments, the indication that the occupant is infected with an infectious disease may be based on testing done either remotely or onsite within the building. For example, if a building implements periodic onsite testing for an infectious disease of each of the occupants, the results of the onsite testing may be used as an indication on whether the occupant is or is not infected with an infection disease. In some embodiments, the onsite testing can be automatically performed in a building, building space, and/or building zone by one or more biological sensors within the building. The biological sensor may evaluate the air in the building to determine a presence of an infectious disease with one or more occupants of the building. The data received from the biological sensor may also be used to determine the reproductive number. In some embodiments, the indication that the occupant is infected with an infectious disease may be based on other data received by the building data platform 100.

In step 4810, the building data platform 100 executes an artificial intelligence (e.g., the AI agent 570) stored in the digital twin to simulate the air flow through the building based on the virtual representation of the building with the one or more entities of the building. For example, as shown in FIG. 35, the building data platform 100 uses the artificial intelligence stored in the digital twin to simulate the air flow through the building as shown by the arrow 3502 in floor 3500. The building data platform 100 executes the artificial intelligence by causing the client instance 592 to run the model 576 based on the virtual representation of the building with the one or more entities of the building and the interrelationships and the building data to simulate the air flow through the building.

In step 4812, the building data platform 100 executes the artificial intelligence stored in the digital twin to predict whether the one or more other occupants of the building are potentially infected with the infectious disease based on the airflow, the location of the occupant, and the locations of the one or more other occupants. The building data platform 100 can executes the artificial intelligence by causing the client instance 592 to run model 576 based on the building data received in step 4804, the location of one or more occupants as determined in step 4806, and/or an indication that the occupant has been infected with an infectious disease as received in step 4808. For example, the building data platform 100 may receive building data for floor 3500 and the indication that an occupant on floor 3500 has been infected with an infectious disease, the building data platform 100 may simulate airflow through the building to create a prediction that one or more other occupants in the building who may have come in contact with the occupant infected with an infectious disease may also be potentially infected with an infectious disease. In some embodiments, the prediction can be ingested back into a graph (e.g., knowledge graph 2602) by an artificial intelligence agent (e.g., AI agent 2524, AI agent 2526), etc.). For example, the building data platform 100 may identify a node tied to user (e.g., node 320) via an edge and store the prediction that the user may be infected in the node tied to the user. In some embodiments, based on the location of the biological sensor detecting the infectious disease, the digital twin could be used to determine the building occupants most at risk and recommend supplemental testing. In some embodiments, if an infectious disease is detected in real-time, the building could operate building components (e.g., dampers, fire doors, etc.) to isolate parts of the building to prevent further infectious disease transmission.

In some embodiments, the prediction determined at step 4812 may be used to control operation of the building and/or building equipment. For example, if an occupant is predicted to be infected with a disease, the building data platform 100 may control one or more building subsystems 122 to increase the ventilation in the portion of the building the user is predicted to occupy. As another example, if an occupant is predicted to be infected with a disease, the building data platform 100 may control one or more building subsystems 122 to increase the disinfectant light in a portion of the building the occupant is occupying. A disinfectant light may be a type of light that when exposed to a surface disinfects the surface. In some embodiments, a disinfectant light may be a classic UVC light (e.g., 254 nanometers) and a far UVC light (e.g., 205 nanometer-230 nanometers). As another example, if an occupant is predicted to be infected with a disease, the building data platform 100 may set a policy for one or more occupants in the building (e.g., requesting the occupant quarantine for a specified period of time, implementing a remote work policy, prompting the occupant to seek medical attention, etc.). In some embodiments, the method 4800 may be implemented within a plurality of buildings which may be part of a campus or community. For example, if a building is in an area where the general prevalence of infectious disease in the area is known (e.g., through waste water or air quality monitoring), the building data platform 100 may determine and display the risk of a first building relative to other buildings within a campus or the community. Furthermore, the building data platform 100 may be controlled to automatically switch into infection control mode when community transmission levels exceed predefined thresholds.

Figure 49:
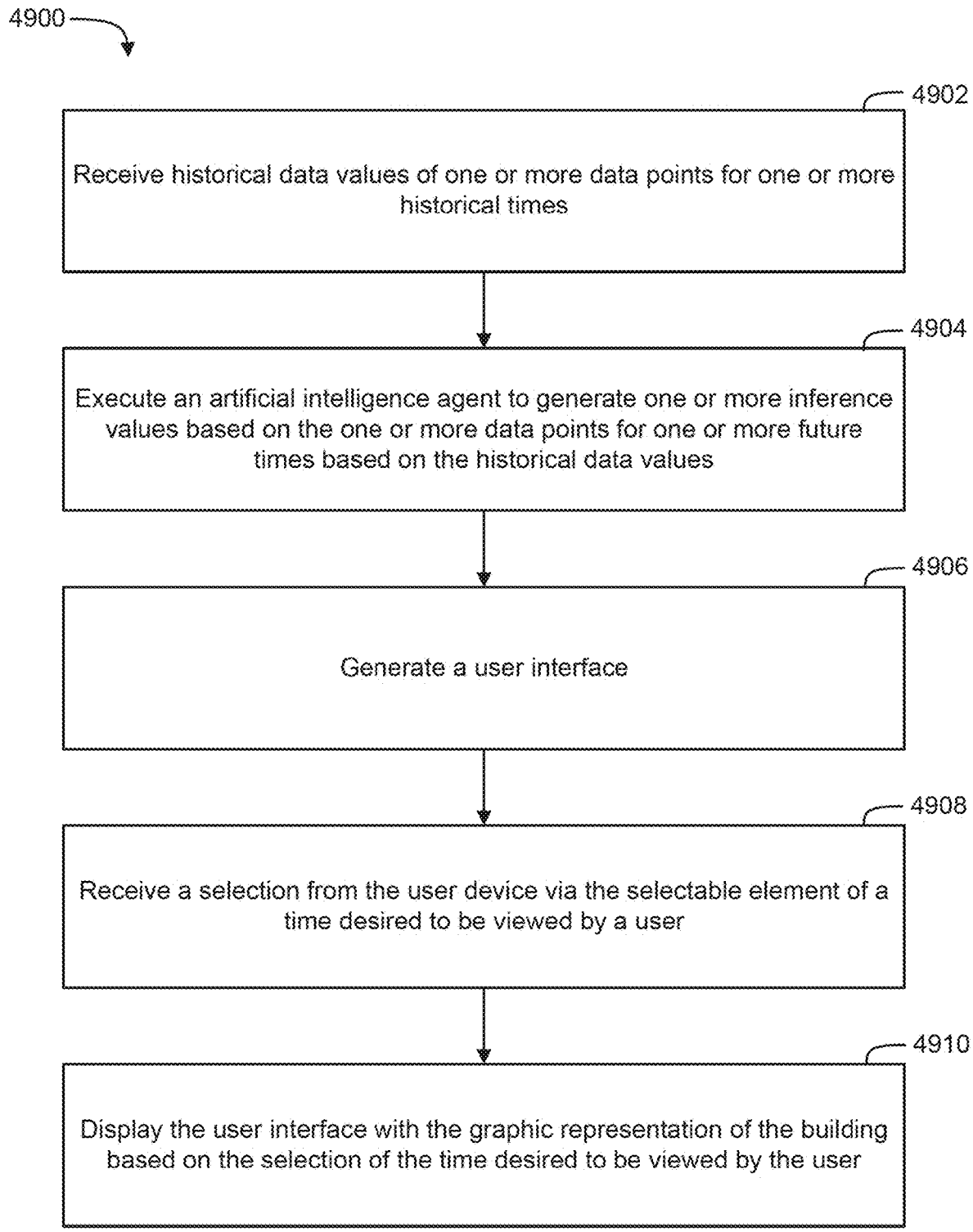
FIG. 49 is a flow diagram of a process for generating and displaying, via a digital twin, a graphic representation of a building with multiple states at one or more future times or one or more historical times, according to an exemplary embodiment.

Referring now to FIG. 49, a flow diagram of a process 4900 for generating and displaying a graphic representation of the building with one or more states based on future data values is shown, according to an exemplary embodiment. In some embodiments, the building data platform 100 may be configured to perform the process 4900. In some embodiments, the learning service 2206 may be configured to perform the process 4900. Any computing device or system described herein can be configured to perform the process 4900.

In step 4902, the building data platform 100 receives historical data values of one or more data points for one or more historical times. In some embodiments, the historical data values of the one or more data points may be associated with one or more devices, spaces, or systems within a building. For example, the historical data values may be associated with a heating, ventilation, and air conditioning system within a building. As another example, the historical data values may be associated with an occupancy sensor within a building. As a final example, the historical data values may be associated with a building floor or a building room within a building. The building data platform 100 may receive the historical data values from one or more devices or components configured to collect data. For example, the building data platform 100 may receive historical telemetry data values from the building subsystems 122. The historical data values may include measured data values, a log of historical equipment commands, a log of historical building personnel commands, etc.

In some embodiments, the building data platform 100 may store the historical data received in step 4902 in the twin manager 108. More specifically, the historical data may be stored in graph 529. In other embodiments, the historical data may be stored in one or more other memories within the building data platform 100 (e.g., memories 166, memories 126, memories 120, and/or memories 150).

In step 4904, the building data platform 100 executes an artificial intelligence agent to generate one or more inference values based on the one or more data points for one or more future times based on the historical data values. In some embodiments, the artificial agent is an agent for a specific entity represented in the graph 529. For example, the agent could be a building history agent configured to evaluate the historical data of the building 526 and simulate a future data of the building 526 based on the historical data. Another agent could be a floor occupant prediction agent that is configured to predict the occupancy of a particular floor of a building, e.g., the floor represented by the floor node 522.

In some embodiments, the artificial intelligence agent may be coupled to (or included by) a digital twin associated with a specific entity. Furthermore, the building data platform 100 may determine the inference and/or prediction values based on the digital twin associated with the specific entity. For example, the building history agent may be associated with a building digital twin 526, and the building history agent may determine one or more inference and/or prediction values for the building based on the building digital twin 526.

The building data platform 100 executes the artificial intelligence agent by causing the client instance 592 to run the model 576 based on the historical data values received at step 4902. Based on the historical data values, the model 576 generates one or more inference and/or predicted values of the building. In some embodiments, the inference and/or predicted values may be combined to create a predicted future state of the building. For example, the inference and/or predicted values may be a predicted occupancy of a building or a floor, a predicted air quality of a building or floor, and/or a predicted reproductive number. These inferred or predicted values may be used to predict a future state of the building. For example, the building data platform 100 may be able to predict a future state of the building one or more days in the future (e.g., one day, two days, three days, four days, etc.) based on the predicted occupancy, air quality, and/or reproductive number. In some embodiments, the inference and/or predicted values are stored in the digital twin as attributes of the digital twin. In some embodiments, the building data platform 100 is also able to determine a past state of the building based on the historical values received at step 4902. For example, the building data platform 100 may be able to determine a past state of the building one or more days in the past (e.g., one day, two days, three days, four days, etc.) based on the historical occupancy, air quality, and/or reproductive number values as determined based on the historical values.

In step 4906, the building data platform 100 generates a user interface to display a graphic representation of the building based on the inference and/or prediction values determined at step 4904 on a user device. For example, the building data platform 100 may generate user interfaces including element 4300 and element 4400 at step 4906. In some embodiments, the user interface may be displayed on a user device (e.g., a mobile device, a laptop, a computing device, etc.). The user interface may include one or more selectable elements which provide a selection of one or more historical times and/or future times. The user may be able to interact with the user device to manipulate the selected element to view one or more historical times and/or future times of the building. In some embodiments, the selectable element may be in the form of a sliding bar which the user may manipulate to view future or past states of the building. For example, the element 4300 may include selectable element 4302 which may be moved to the right to view future times of the building. Conversely, the selectable element 4302 may be moved to the left to view historical times of the building. In some embodiments, the selectable element may be a drop-down menu where the user may select which future or historical time of the building they wish to see. In some embodiments, the selectable element may be a text entry box where the user may enter which future or historical time of the building they wish to see. In some embodiments, the selectable element may be included in the user interface in a way not described herein. The building data platform 100 may generate the user interface based on the one or more predicted and/or inference values determined at step 4904. In some embodiments, the user interface may include one or more space indicator elements that describe the state of a space in a graphical representation. For example, the space indicator element 4306 may highlight the space a certain color to indicate the state of that space. For example, as shown in FIG. 43, the space indicator element 4306 may be green to indicate a positive state of the building (e.g., clean air score above a certain threshold, occupancy level below a certain threshold, etc.). As another example, as shown in FIG. 44, the space indicator element 4406 may be red to indicate a predicted negative state of the building (e.g., clean score below a certain threshold, occupancy level above a certain threshold, etc.). In some embodiments, the space indicator element's color may be based on the infectious disease detected by one or more biological sensors. For example, a green space indicator may indicate that COVID-19 has been detected by the biological sensors while an orange space indicator may indicate that influence has been detected by the biological sensors.

In step 4908, the building data platform 100 receives a selection from the user device via the selectable element of a time desired to be viewed by a user. As explained above, the user may interact with the user device (e.g., the user device 176) to manipulate a selectable element on the user interface to indicate a future or historical time which they wish to view. By manipulating the selectable element, the user sends an indication to the building data platform 100 of the selection of times they wish to view. The building data platform 100 receives this indication at step 4908. In step 4910, the building data platform 100 displays the user interface of the graphic representation of the building generated in step 4906 based on the selection from the user device received in step 4908.

Figure 50:
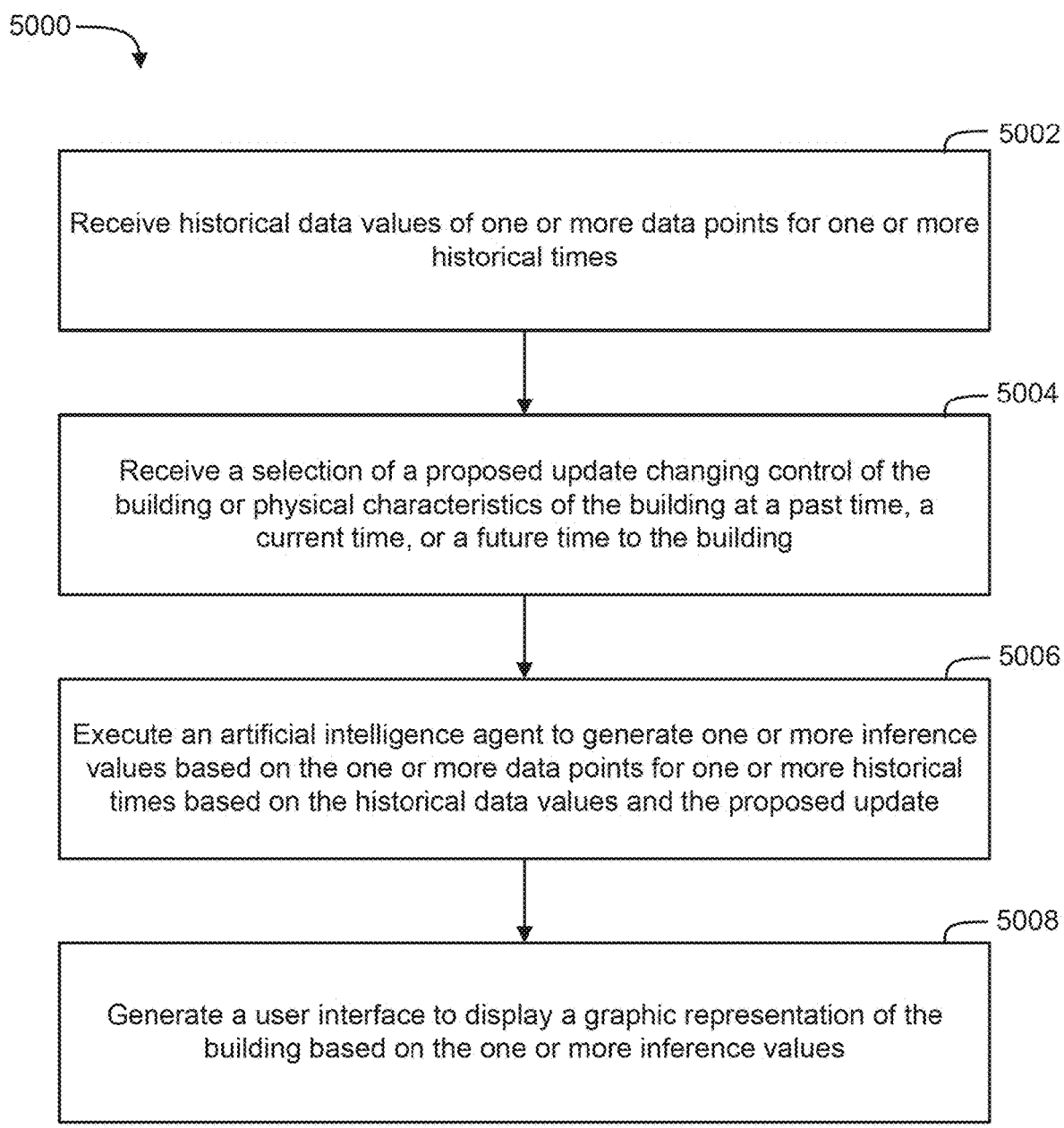
FIG. 50 is a flow diagram of a process for generating and displaying, via a digital twin, a graphic representation of one or more predicted values at one or more future times of a building, according to an exemplary embodiment.

Referring now to FIG. 50, a flow diagram of a process 5000 for generating and displaying one or more inference values of a building at one or more future times is shown, according to an exemplary embodiment. In some embodiments, the building data platform 100 may be configured to perform the process 5000. In some embodiments, the learning service 2206 may be configured to perform the process 5000. Any computing device or system described herein can be configured to perform the process 5000.

In step 5002, the building data platform 100 receives historical data values of one or more data points for one or more historical times. In some embodiments, the historical data values of the one or more data points may be associated with one or more devices, spaces, or systems within a building. For example, the historical data values may be associated with a heating, ventilation, and air conditioning system within a building. As another example, the historical data values may be associated with an occupancy sensor within a building. As a final example, the historical data values may be associated with a building floor or a building room within a building. The building data platform 100 may receive the historical data values from one or more devices or components configured to collect data. For example, the building data platform 100 may receive historical telemetry data values from the building subsystems 122. The historical data values may include measured data values, a log of historical equipment commands, a log of historical building personnel commands, etc.

In some embodiments, the building data platform 100 may store the historical data received in step 5002 in the twin manager 108. More specifically, the historical data may be stored in graph 529. In other embodiments, the historical data may be stored in one or more other memories within the building data platform 100 (e.g., memories 166, memories 126, memories 120, and/or memories 150).

In step 5004, the building data platform 100 receives a selection of a proposed update changing control of the building or physical characteristics of the building at a past time, a current time, or a future time to the building. In some embodiments, the proposed update may include changing the control of the air handling unit of the building to update the air flow and/or air quality within the building. More specifically, the control of the AHU may be updated to change the clean air score. In some embodiments, the proposed update may include changing the occupancy level of the building or different spaces of the building. The building data platform 100 may receive a selection of the proposed update through a user device which the user may interact with to input selection of the proposed update. For example, the user device may display a user interface with one or more selectable elements (e.g., text box, dialog box, drop down menu, etc.) by which the user may input their selection for a proposed update.

In step 5006, the building data platform 100 executes an artificial intelligence agent to generate one or more inference values based on the one or more data points for one or more historical times based on the historical data values and the proposed update. Based on the historical data values and the proposed update, the model 576 generates one or more inference and/or predicted values of the building. In some embodiments, the model 576 may be stored in the digital twin as an attribute of the digital twin. For example, if a user inputs a proposed update with a lower building occupancy level, the model 576 uses the proposed lower occupancy level and historical data values related to air quality as inputs to determine an inferred or predicted clean air score. In some embodiments, the inference and/or predicted values may be combined to create a predicted future state of the building. For example, the inference and/or predicted values may be a predicted occupancy of a building or a floor, a predicted air quality of a building or floor, and/or a predicted reproductive number for a building. These inferred or predicted values may be used to predict a future state of the building. For example, the building data platform 100 may be able to predict a future state of the building one or more days in the future (e.g., one day, two days, three days, four days, etc.) based on the predicted occupancy, air quality, and reproductive number. In some embodiments, the building data platform 100 is also able to determine or simulate a past state of the building that would have occurred if a change were made to the operation of the building based on the historical values received at step 5002 and the proposed update received at step 5004. For example, the building data platform 100 may be able to simulate a past state of the building one or more days in the past (e.g., one day, two days, three days, four days, etc.) based on the historical occupancy, air quality, and/or reproductive number values as determined based on the historical values and a proposed update.

Figure 52:
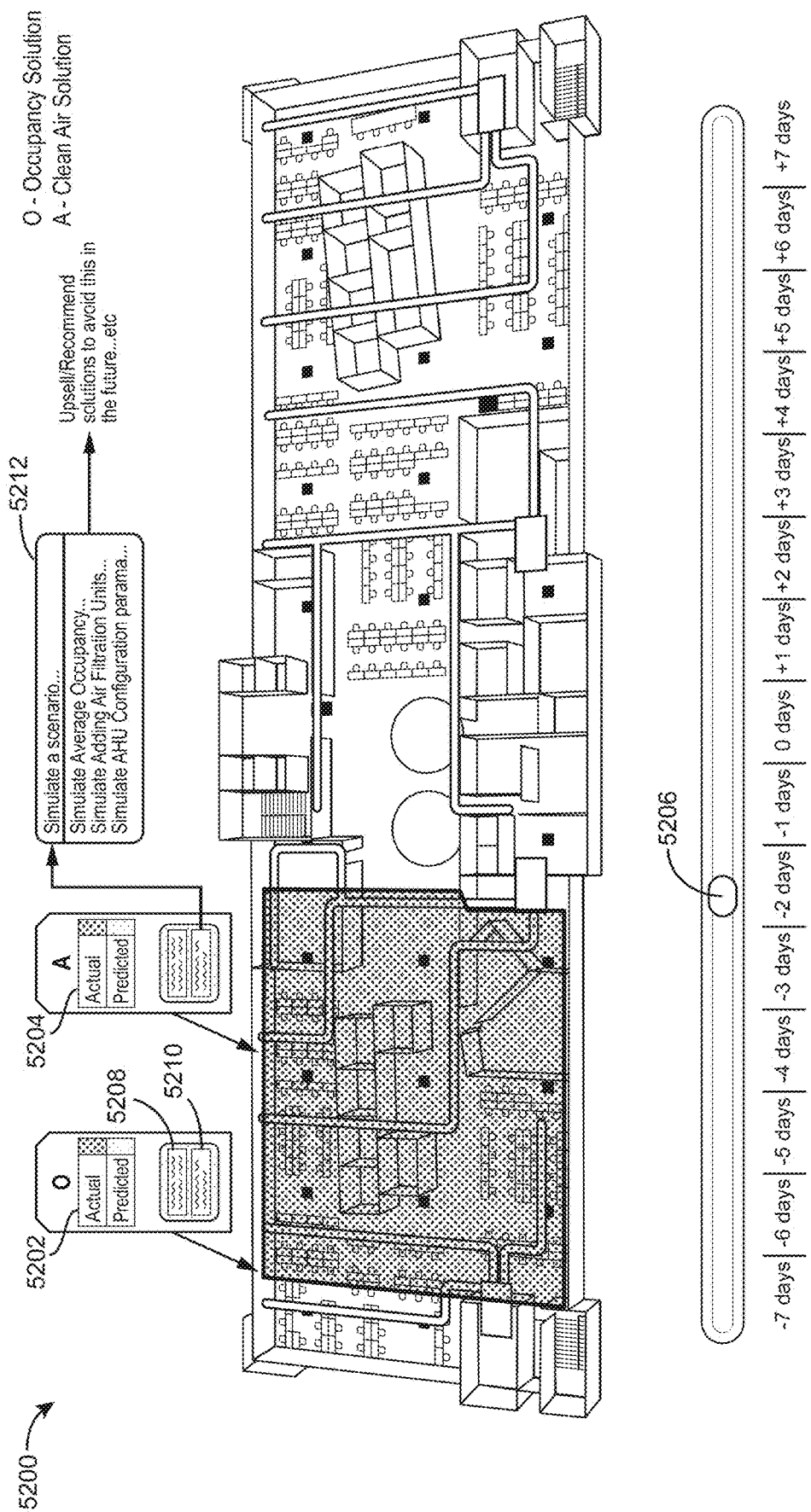
FIG. 52 is a schematic drawing of viewing user interface including a predicted and actual occupancy score and a predicted and actual clean air score for a historical time in a floor of a building and running a simulation of the building at a historical time, according to an exemplary embodiment.

In some embodiments, the building data platform 100 may generate recommendations for the building based on inference and/or predicted values determined at step 5006. For example, the recommendations may include running new control algorithms to control portions of the building in order to improve the air quality of the building, better manage occupancy levels, and/or reduce the reproductive number within buildings. As another example, the recommendations may include purchasing and/or installing new equipment in the building. For example, a predicted low clean air score and/or a predicted high reproductive number may be a result of poor air ventilation within a building. In this case, the recommendation may include purchasing and/or installing new air filters within the building to increase the clean air score and/or lower the predicted high reproductive number. In step 5008, the building data platform 100 generates a user interface to display a graphic representation of the building based on the one or more inference values generated at step 5006. For example, a user interface 5200 as shown in FIG. 52 may be generated by the building data platform 100.

Figure 51:
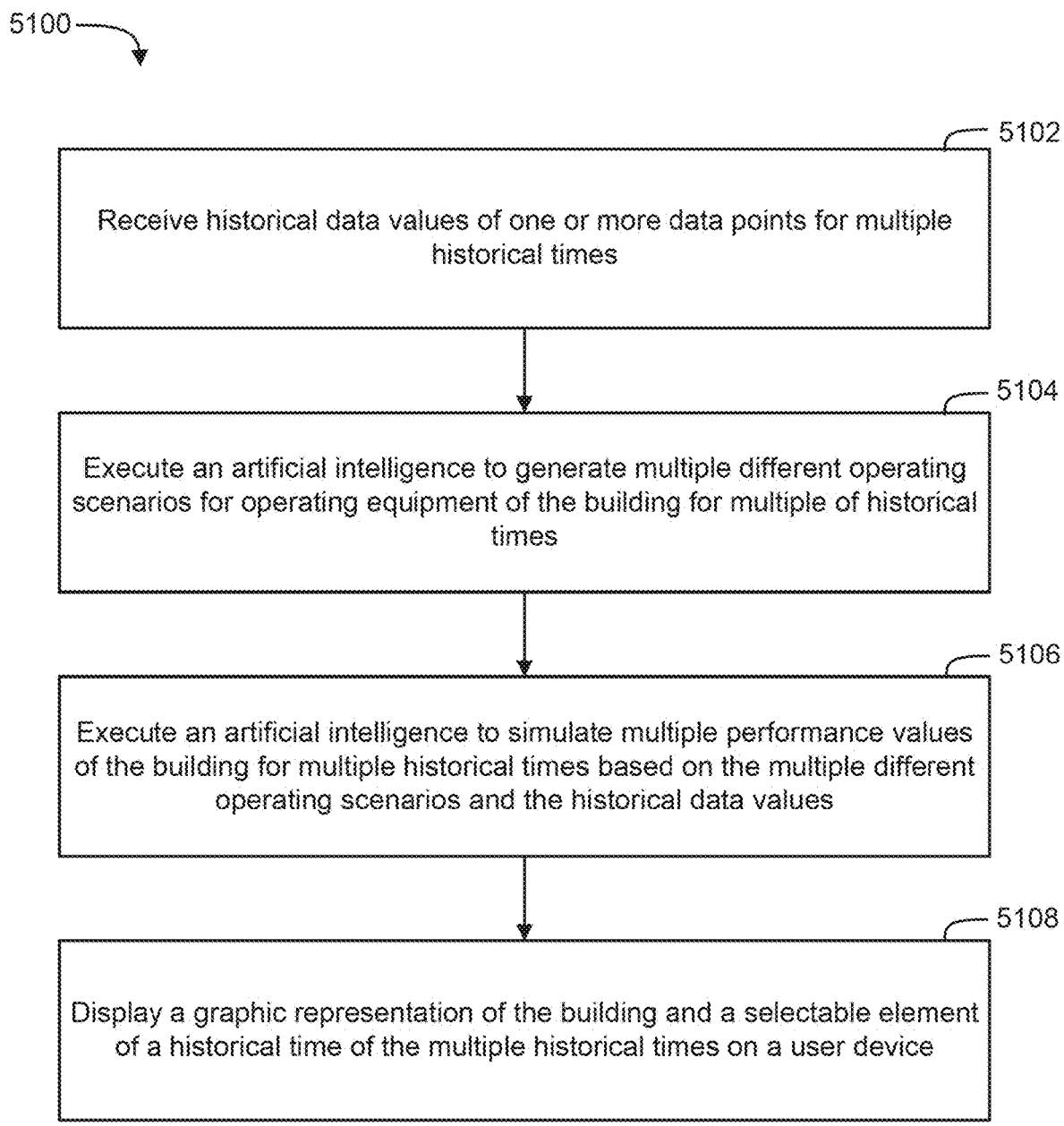
FIG. 51 is a flow diagram of a process for generating and displaying, via a digital twin, a graphic representation of a building at a historical time based on one or more historical operating scenarios, according to an exemplary embodiment.

Referring now to FIG. 51, a flow diagram of a process 5100 for generating and displaying a graphic representation of the building and a selectable element of a historical time of one or more historical times is shown, according to an exemplary embodiment. In some embodiments, the building data platform 100 can be configured to perform the process 5100. In some embodiments, the learning service 2206 may be configured to perform the process 5100. Any computing device or system described herein can be configured to perform the process 5100.

In step 5102, the building data platform 100 receives historical data values of one or more data points for one or more historical times. In some embodiments, the historical data values of the one or more data points may be associated with one or more devices, spaces, or systems within a building. For example, the historical data values may be associated with a heating, ventilation, and air conditioning system within a building. As another example, the historical data values may be associated with an occupancy sensor within a building. As another example, the historical data values may be associated with a building floor or a building room within a building. The building data platform 100 may receive the historical data values from one or more devices or components configured to collect data. For example, the building data platform 100 may receive historical telemetry data values from the building subsystems 122. The historical data values may include measured data values, a log of historical equipment commands, a log of historical building personnel commands, etc.

In step 5104, the building data platform 100 executes an artificial intelligence agent to generate multiple different operating scenarios for operating equipment of the building for multiple historical times. More specifically, based on historical data values for the building, the model 576 generates multiple operating scenarios of the building. For example, the model 576 may generate an operating scenario that simulates one or more operations of the building. For example, the model 576 may generate an operating scenario of a piece of building equipment (e.g., installation and/or maintenance of building equipment), a control algorithm or schedule for the building, a building room or zone, or the operation of the building as a whole.

In step 5106, the building data platform 100 executes an artificial intelligence to simulate multiple performance values of the building for multiple historical times based on the multiple different operating scenarios and/or the historical data values. More specifically, the model 576 uses the historical data values to simulate performance values at multiple historical times (e.g., 1 day in the past, 2 days in the past, 1 week in the past, 2 weeks in the past, etc.). The performance values may indicate a performance of one or more operating scenarios determined at step 5104. More specifically, in some embodiments, the building data platform 100 may analyze each operating scenario based on one or more performance values (e.g., clean air score, occupancy number, reproductive number, etc.). Furthermore, the building data platform 100 analyzes each operating scenario of the building to determine an operating scenario with the most favorable performance values.

Referring now to FIG. 52, a user interface 5200 for viewing one or more elements of a building in a graphic representation of a building is shown, according to an exemplary embodiment. For example, a user interface 5200 may include a selectable element 5206 which is configured to display an operating scenario of a building for multiple historical times (e.g., −1 day, −2 days, −3 days, etc.). As another example, the user interface 5200 may include inference values 5202 and 5204. The user interface 5200 may also include a selectable element 5208 (e.g., learn more button 5208), which when selected by a user, displays more information about the occupancy solution and the clean air solution. The user interface 5200 may also include a selectable element 5210 (e.g., simulate scenario button 5210), which when selected by a user, simulates one or more building scenarios as shown in selectable element 5212. More specifically, when a user selects the simulate scenario button 5210, the building data platform 100 causes a user interface portion to be displayed which gives a user the ability to select a parameter (e.g., occupancy level, AHU configuration, air filtration, etc.) for simulation. The elements 5202, 5204, 5208, 5210, and 5212 can be combined within a single user interface and/or displayed on a display device of the user device 176, in some embodiments. The user interface 5200 can be a floor of a building that displays an occupancy level and a clean air score for a space of the building. The space can be highlighted by a particular color, e.g., green, blue, or red, based on the occupancy level and/or the clean air score.

The user interface 5200 can allow a user to view states of the building at a current time, one or more days into the future, and/or one or more days into the past. The element 5206 can be a slider allowing a user to flip through the states of the building at historical, current, or future times. The user interface 5200 can provide a "Building Player" allowing a user to "play" the building view of the past statuses of the building (e.g., stored in a timeseries database and/or a digital twin), present statuses of the building, and/or future statuses of the building (e.g., simulated and/or inference/predictions generated by a digital twin). The predicted future statuses can be generated by an agent based on past and/or current data for the building, in some embodiments.

In some embodiments, the building data platform 100 displays a graphic representation of the building and/or a selectable element of a historical time of the multiple historical times on a user device at step 5108. For example, a user interface 5200 as shown in FIG. 52 may be generated by the building data platform 100. In some embodiments, the performance values may be used to indicate a simulated state of the building. The state of building may be demonstrated as color coordinated indicators. For example, the state of the building may be shown as being highlighted in red which may indicate a low simulated clean air score (e.g., 20) and/or occupancy score (e.g., 10).

Configuration of Exemplary Embodiments

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements may be reversed or otherwise varied and the nature or number of discrete elements or positions may be altered or varied. Accordingly, all such modifications are intended to be included within the scope of the present disclosure. The order or sequence of any process or method steps may be varied or re-sequenced according to alternative embodiments. Other substitutions, modifications, changes, and omissions may be made in the design, operating conditions and arrangement of the exemplary embodiments without departing from the scope of the present disclosure.

The present disclosure contemplates methods, systems and program products on any machine-readable media for accomplishing various operations. The embodiments of the present disclosure may be implemented using existing computer processors, or by a special purpose computer processor for an appropriate system, incorporated for this or another purpose, or by a hardwired system. Embodiments within the scope of the present disclosure include program products including machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions include, for example, instructions and data which cause a general purpose computer, special purpose computer, or special purpose processing machines to perform a certain function or group of functions.

Although the figures show a specific order of method steps, the order of the steps may differ from what is depicted. Also two or more steps may be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps.

In various implementations, the steps and operations described herein may be performed on one processor or in a combination of two or more processors. For example, in some implementations, the various operations could be performed in a central server or set of central servers configured to receive data from one or more devices (e.g., edge computing devices/controllers) and perform the operations. In some implementations, the operations may be performed by one or more local controllers or computing devices (e.g., edge devices), such as controllers dedicated to and/or located within a particular building or portion of a building. In some implementations, the operations may be performed by a combination of one or more central or offsite computing devices/servers and one or more local controllers/computing devices. All such implementations are contemplated within the scope of the present disclosure. Further, unless otherwise indicated, when the present disclosure refers to one or more computer-readable storage media and/or one or more controllers, such computer-readable storage media and/or one or more controllers may be implemented as one or more central servers, one or more local controllers or computing devices (e.g., edge devices), any combination thereof, or any other combination of storage media and/or controllers regardless of the location of such devices.

What is claimed:

1. A building system of a building comprising one or more non-transitory storage devices storing instructions thereon that, when executed by one or more processors, cause the one or more processors to:
    store a digital twin of the building in the one or more non-transitory storage devices, the digital twin comprising a virtual representation of the building with an entity of the building, a data point, and an interrelationship between the entity of the building and the data point, wherein the digital twin further includes an artificial intelligence configured to generate a plurality of inference values of the data point for a plurality of future times;
    generate a recommendation based on the plurality of inference values for the data point for the plurality of future times, the recommendation recommending making one or more updates to the building;
    store data for the recommendation in the digital twin, wherein the digital twin includes a representation of a location within the building and associates the location with the recommendation; and
    cause a graphic representation of the building to display an indication of the recommendation at the location within the graphic representation of the building associated with the entity based on the digital twin indicating the data point being related to the entity.

2. The building system of claim 1, wherein the instructions cause the one or more processors to:
    receive a plurality of data point values for the data point from building equipment, the building equipment generating the plurality of data point values by measuring an environmental condition of the building or recording operating decisions performed by the building equipment;
    identify the data point based on the digital twin by identifying the interrelationship between the entity and the data point, the entity representing the building equipment; and
    store the plurality of data point values, or a link to the plurality of data point values, in the data point of the digital twin.

3. The building of system of claim 2, wherein the plurality of inference values include predicted future values of the data point;
    wherein the plurality of inference values are stored in the digital twin; and
    wherein the instructions cause the one or more processors to generate the plurality of inference values by:
        identifying the data point of the digital twin and retrieving the plurality of data point values based on the data point of the digital twin; and
        executing the artificial intelligence to generate the plurality of inference values based on the plurality of data point values.

4. The building system of claim 2, wherein the plurality of inference values are predicted future values of a virtual indicator, wherein the virtual indicator is at least one of:
    a clean air virtual indicator indicating a level of air quality of a building space;
    an occupancy value indicating an amount of occupants in the building space; or
    an infection risk value indicating a risk of spread of an infectious disease in a population.

5. The building system of claim 1, wherein the digital twin includes a building graph data structure including a plurality of nodes representing a plurality of entities of the building and a plurality of edges between the plurality of nodes representing a plurality of relationships between the plurality of entities of the building.

6. The building system of claim 1, wherein the instructions cause the one or more processors to:
    model a predicted state of the building at the plurality of future times based on implementing the recommendation; and
    cause the graphic representation of the building to display the modeled predicted state of the building at the plurality of future times.

7. The building system of claim 1, wherein the recommendation includes a recommendation to update operating settings of building equipment of the building.

8. The building system of claim 7, wherein the instructions cause the one or more processors to cause the graphic representation of the building to display updated operation of the building equipment through the plurality of future times.

9. The building system of claim 7, wherein the recommendation to update the operating settings of the building equipment includes at least one of:
    a recommendation to command an air handling unit to change an air flow through the building;
    a recommendation to change air filtration of air within or being supplied to a space of the building;
    a recommendation to command one or more disinfectant lights to activate; or
    a recommendation to restrict access to one or more portions of the building.

10. The building system of claim 9, wherein the recommendation to change air filtration of air within or being supplied to the space of the building includes a recommendation to perform at least one of:
    changing operation of at least one of an air handing unit, a variable air volume device, or an in-zone air filtration device; or
    modifying or replacing a filter in the at least one of the air handling unit, the variable air volume device, or the in-zone air filtration device.

11. The building system of claim 10, wherein the recommendation to change the air filtration of air within or being supplied to the space of the building includes automatically implementing the recommendation within the building.

12. The building system of claim 9, wherein the recommendation includes a status of the building equipment.

13. The building system of claim 1, wherein the plurality of inference values include at least one of a predicted disease reproduction number indicating a predicted number of individuals that contract a disease from an infected individual, a predicted energy consumption value indicating a level of energy expected to be consumed by building equipment of the building, or a clean air score indicating a predicted measure of quality of air in the building.

14. The building system of claim 13, wherein the instructions further cause the one or more processors to generate diagnostics for at least one of the predicted disease reproduction number, the predicted energy consumption value, or the clean air score, wherein the diagnostics include text indicating a cause for the predicted disease reproduction number, the predicted energy consumption value, or the clean air score.

15. The building system of claim 1, wherein the instructions cause the one or more processors to:
receive outdoor air quality forecast data from one or more outdoor air quality sensors;
model a predicted state of the building at the plurality of future times based on the outdoor air quality forecast data; and
cause the graphic representation of the building to display the modeled predicted state of the building at the plurality of future times.

16. The building system of claim 15, wherein the recommendation includes a recommendation to update operating settings of building equipment of the building in response to the predicted state of the building based on the one or more outdoor air quality sensors.

17. A method comprising:
storing a digital twin of a building in one or more storage devices, the digital twin comprising a virtual representation of the building with an entity of the building, a data point, and an interrelationship between the entity of the building and the data point, wherein the digital twin further includes an artificial intelligence configured to generate a plurality of inference values of the data point for a plurality of future times;
generating a recommendation based on the plurality of inference values for the data point for the plurality of future times, the recommendation recommending making one or more updates to the building;
storing data for the recommendation in the digital twin, wherein the digital twin includes a representation of a location within the building and associated the location with the recommendation; and
causing a graphic representation of the building to display an indication of the recommendation at the location within the graphic representation of the building associated with the entity based on the digital twin indicating the data point being related to the entity.

18. The method of claim 17, further comprising:
receiving a plurality of data point values for the data point from building equipment, the building equipment generates the plurality of data point values based on operation to control an environmental condition of the building;
identifying the data point based on the digital twin by identifying the interrelationship between the entity and the data point, the entity representing the building equipment; and
storing the plurality of data point values, or a link to the plurality of data point values, in the data point of the digital twin.

19. The method of claim 18, wherein the plurality of inference values are stored in the digital twin; and
wherein the plurality of inference values include predicted future values of the data point, wherein the method generates the plurality of inference values by:
identifying the data point of the digital twin and retrieving the plurality of data point values based on the data point of the digital twin; and
executing the artificial intelligence to generate the plurality of inference values based on the plurality of data point values.

20. The method of claim 18, wherein the plurality of inference values are predicted future values of a virtual indicator, wherein the virtual indicator is at least one of:
a clean air virtual indicator indicating a level of air quality of a building space;
an occupancy number indicating a number of occupants in the building space; or
an infection risk value indicating a risk of spread of an infectious disease in a population.

21. The method of claim 17, further comprising generating diagnostics for at least one of a predicted disease reproduction number, a predicted energy consumption value, or a clean air score, wherein the diagnostics include text indicating a cause for the predicted disease reproduction number, the predicted energy consumption value, or the clean air score.

22. The method of claim 17, wherein the recommendation includes a recommendation to update operating settings of building equipment of the building, the operating settings updating operation of the building equipment.

23. The method of claim 22, wherein the recommendation to update the operating settings of the building equipment includes at least one of:
a recommendation to make a command for an air handling unit to change an air flow through the building;
a recommendation to command the air handling unit to change an air filtration setting for the building;
a recommendation to command one or more disinfectant lights to activate; or
a recommendation to command building security mechanisms to restrict access to one or more portions of the building.

24. One or more non-transitory computer readable media containing program instructions that, when executed by one or more processors, cause the one or more processors to perform operations comprising:
storing a digital twin of a building in one or more storage devices, the digital twin comprising a virtual representation of the building with an entity of the building, a data point, and an interrelationship between the entity of the building and the data point, wherein the digital twin further includes an artificial intelligence configured to generate a plurality of inference values of the data point for a plurality of future times;
generating a recommendation based on the plurality of inference values for the data point for the plurality of future times, the recommendation recommending making one or more updates to the building;
storing data for the recommendation in the digital twin, wherein the digital twin includes a representation of a location within the building and associates the location with the recommendation; and
causing a graphic representation of the building to display an indication of the recommendation at the location within the graphic representation of the building associated with the entity based on the digital twin indicating the data point being related to the entity.

* * * * *